US011404427B2

(12) United States Patent
Otsu et al.

(10) Patent No.: US 11,404,427 B2
(45) Date of Patent: Aug. 2, 2022

(54) THREE-DIMENSIONAL MEMORY DEVICE INCLUDING MULTI-TIER MOAT ISOLATION STRUCTURES AND METHODS OF MAKING THE SAME

(71) Applicant: SANDISK TECHNOLOGIES LLC, Addison, TX (US)

(72) Inventors: Yoshitaka Otsu, Yokkaichi (JP); Muneyuki Imai, Yokkaichi (JP); Junpei Kanazawa, Yokkaichi (JP)

(73) Assignee: SANDISK TECHNOLOGIES LLC, Addison, TX (US)

( * ) Notice: Subject to any disclaimer, the term of this patent is extended or adjusted under 35 U.S.C. 154(b) by 21 days.

(21) Appl. No.: 16/900,060

(22) Filed: Jun. 12, 2020

(65) Prior Publication Data

US 2021/0391345 A1 Dec. 16, 2021

(51) Int. Cl.
*H01L 27/11539* (2017.01)
*H01L 27/11524* (2017.01)
(Continued)

(52) U.S. Cl.
CPC .. *H01L 27/11539* (2013.01); *H01L 21/02617* (2013.01); *H01L 21/28238* (2013.01);
(Continued)

(58) Field of Classification Search
CPC ......... H01L 27/11539; H01L 27/11519; H01L 27/11524; H01L 27/11556;
(Continued)

(56) References Cited

U.S. PATENT DOCUMENTS 5,915,167 A 6/1999 Leedy
9,806,093 B2 10/2017 Toyama et al.
(Continued)

OTHER PUBLICATIONS

Notification of Transmittal of the International Search Report and the Written Opinion of the International Searching Authority for International Patent Application No. PCTUS2020/067383, dated Apr. 5, 2021, 13 pages.
(Continued)

*Primary Examiner* — Galina G Yushina
(74) *Attorney, Agent, or Firm* — The Marbury Law Group PLLC

(57) ABSTRACT

A method of forming a three-dimensional memory device includes forming a first-tier alternating stack of first insulating layers and first sacrificial material layers, forming first-tier memory openings, first-tier support openings, and first-tier moat trenches through the first alternating stack using a same etching step, forming a first dielectric moat structure in the first moat tier-trenches and first support pillar structures in the first-tier support openings during a same deposition step, forming memory stack structures in the first-tier memory openings, forming backside trenches through the first-tier alternating stack after forming the first dielectric moat structure, replacing portions of the first sacrificial material layers with first electrically conductive layers through the backside trenches, and forming at least one through-memory-level interconnection via structure through the first vertically alternating sequence of first insulating plates and first dielectric material plates surrounded by the first dielectric moat structure.

14 Claims, 57 Drawing Sheets

(51) Int. Cl.

| | |
|---|---|
| ***H01L 27/11519*** | (2017.01) |
| ***H01L 23/522*** | (2006.01) |
| ***H01L 27/11582*** | (2017.01) |
| ***H01L 27/11556*** | (2017.01) |
| ***H01L 27/11565*** | (2017.01) |
| ***H01L 27/1157*** | (2017.01) |
| ***H01L 23/528*** | (2006.01) |
| ***H01L 21/768*** | (2006.01) |
| ***H01L 21/28*** | (2006.01) |
| ***H01L 21/02*** | (2006.01) |

(52) U.S. Cl.
CPC ...... *H01L 21/76813* (2013.01); *H01L 23/528* (2013.01); *H01L 23/5226* (2013.01); *H01L 27/1157* (2013.01); *H01L 27/11519* (2013.01); *H01L 27/11524* (2013.01); *H01L 27/11556* (2013.01); *H01L 27/11565* (2013.01); *H01L 27/11582* (2013.01)

(58) Field of Classification Search
CPC ........... H01L 27/11565; H01L 27/1157; H01L 27/11582; H01L 21/02617; H01L 21/28238; H01L 21/76813; H01L 23/5226; H01L 23/528
See application file for complete search history.

(56) References Cited

U.S. PATENT DOCUMENTS

| | | | |
|---|---|---|---|
| 9,818,693 B2 | 11/2017 | Toyama et al. | |
| 9,818,759 B2 | 11/2017 | Kai et al. | |
| 10,038,006 B2 | 7/2018 | Furihata et al. | |
| 10,249,640 B2 | 4/2019 | Yu et al. | |
| 10,381,371 B2 | 8/2019 | Ogawa et al. | |
| 10,665,607 B1 * | 5/2020 | Sugiura | H01L 27/10844 |
| 2017/0179026 A1 * | 6/2017 | Toyama | H01L 27/11573 |
| 2017/0179151 A1 | 6/2017 | Kai et al. | |
| 2017/0179152 A1 | 6/2017 | Toyama et al. | |
| 2017/0179153 A1 | 6/2017 | Ogawa et al. | |
| 2017/0179154 A1 * | 6/2017 | Furihata | H01L 21/76802 |
| 2017/0358593 A1 | 12/2017 | Yu et al. | |

OTHER PUBLICATIONS

U.S. Appl. No. 16/249,352, filed Jan. 16, 2019, SanDisk Technologies LLC.

U.S. Appl. No. 16/251,863, filed Jan. 18, 2019, SanDisk Technologies LLC.

U.S. Appl. No. 16/368,007, filed Mar. 28, 2019, SanDisk Technologies LLC.

U.S. Appl. No. 16/444,125, filed Jun. 18, 2019, SanDisk Technologies LLC.

U.S. Appl. No. 16/444,186, filed Jun. 18, 2019, SanDisk Technologies LLC.

U.S. Appl. No. 16/671,561, filed Nov. 1, 2019, SanDisk Technologies LLC.

U.S. Appl. No. 16/735,854, filed Jan. 7, 2020, SanDisk Technologies LLC.

U.S. Appl. No. 16/809,861, filed Mar. 5, 2020, SanDisk Technologies LLC.

* cited by examiner

THREE-DIMENSIONAL MEMORY DEVICE INCLUDING MULTI-TIER MOAT ISOLATION STRUCTURES AND METHODS OF MAKING THE SAME

FIELD

The present disclosure relates generally to the field of semiconductor devices and specifically to a three-dimensional memory device including multi-tier moat isolation structures and methods of making the same.

BACKGROUND

Three-dimensional memory devices may include memory stack structures. The memory stack structures overlie a substrate and extend through an alternating stack of insulating layers and electrically conductive layers. The memory stack structures include vertical stacks of memory elements provided at levels of the electrically conductive layers. Peripheral devices may be provided on the substrate underneath the alternating stack and the memory stack structures.

SUMMARY

According to an aspect of the present disclosure, a three-dimensional memory device is provided, which comprises: a first-tier alternating stack of first insulating layers and first electrically conductive layers located over a semiconductor material layer; a second-tier alternating stack of second insulating layers and second electrically conductive layers located over the first alternating stack; memory stack structures vertically extending through the second-tier alternating stack and the first-tier alternating stack; a first dielectric moat structure vertically extending through the first-tier alternating stack and laterally surrounding a first vertically alternating sequence of first insulating plates and first dielectric material plates; a plurality of dielectric pillar structures vertically extending through the second-tier alternating stack and contacting a top surface of the first dielectric moat structure; and at least one through-memory-level interconnection via structure vertically extending at least from a horizontal plane including a top surface of the second-tier alternating stack, through the first vertically alternating sequence of first insulating plates and first dielectric material plates, and down to a respective metal interconnect structure underlying a horizontal plane including a bottom surface of the semiconductor material layer.

According to another aspect of the present disclosure, a method of forming a three-dimensional memory device includes forming a first-tier alternating stack of first insulating layers and first sacrificial material layers, forming first-tier memory openings, first-tier support openings, and first-tier moat trenches through the first alternating stack using a same etching step, forming a first dielectric moat structure in the first moat tier-trenches and first support pillar structures in the first-tier support openings during a same deposition step, forming memory stack structures in the first-tier memory openings, forming backside trenches through the first-tier alternating stack after forming the first dielectric moat structure, replacing portions of the first sacrificial material layers with first electrically conductive layers through the backside trenches, wherein remaining portions of the first insulating layers and the first sacrificial material layers within the first dielectric moat trench fill structure comprise a first vertically alternating sequence of first insulating plates and first dielectric material plates, and forming at least one through-memory-level interconnection via structure through the first vertically alternating sequence of first insulating plates and first dielectric material plates.

DETAILED DESCRIPTION

Figure 1A:
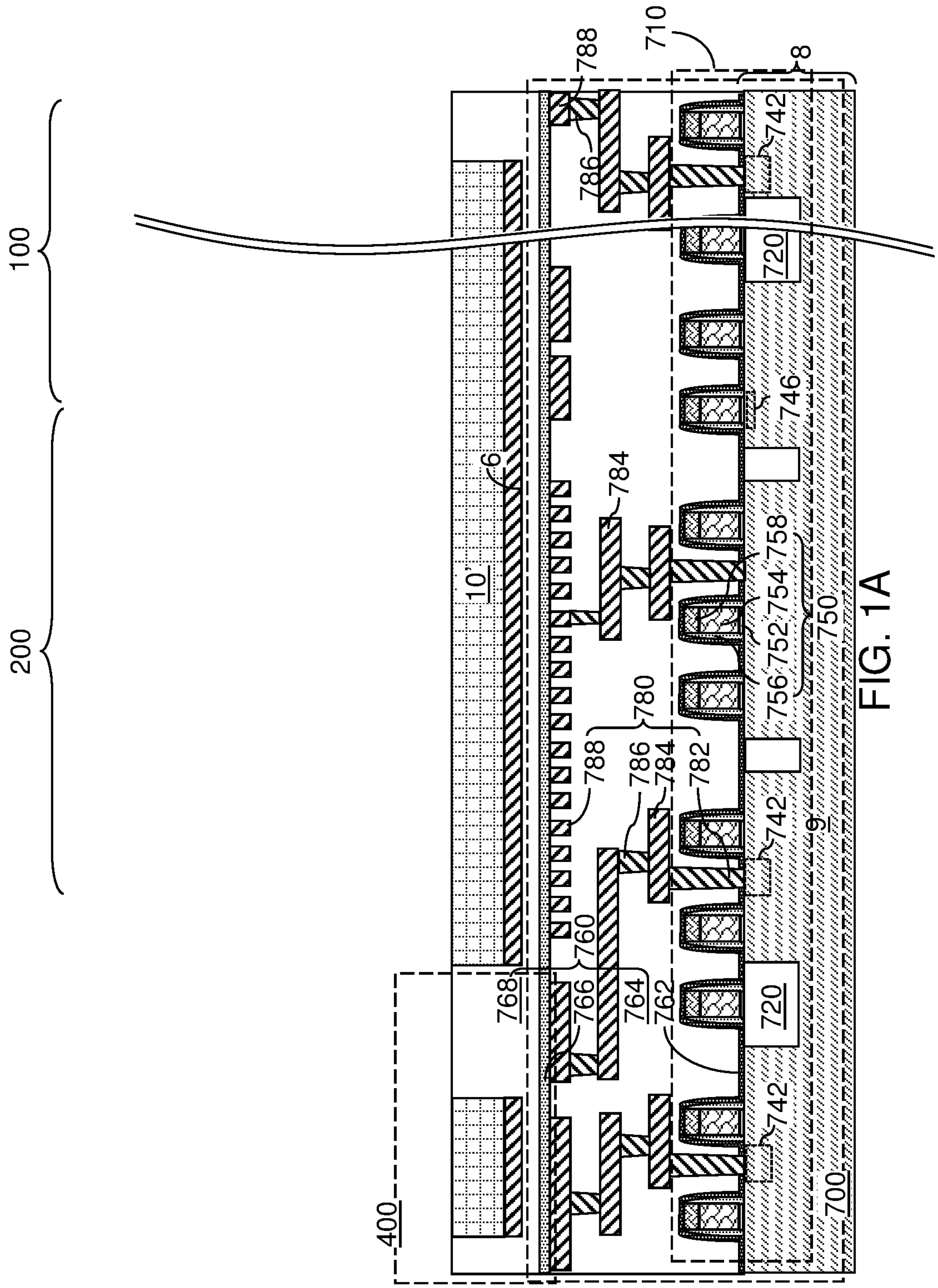
FIG. 1A is a vertical cross-sectional view of an exemplary structure after formation of semiconductor devices, lower level dielectric layers, lower metal interconnect structures, and in-process source level material layers on a semiconductor substrate according to a first embodiment of the present disclosure.

The embodiments of the present disclosure provide a three-dimensional memory device including multi-tier moat isolation structures and methods of making the same, the various embodiments of which are described herein in detail.

The drawings are not drawn to scale. Multiple instances of an element may be duplicated where a single instance of the element is illustrated, unless absence of duplication of elements is expressly described or clearly indicated otherwise. Ordinals such as "first," "second," and "third" are employed merely to identify similar elements, and different ordinals may be employed across the specification and the claims of the instant disclosure. The term "at least one" element refers to all possibilities including the possibility of a single element and the possibility of multiple elements.

The same reference numerals refer to the same element or similar element. Unless otherwise indicated, elements having the same reference numerals are presumed to have the same composition and the same function. Unless otherwise indicated, a "contact" between elements refers to a direct contact between elements that provides an edge or a surface shared by the elements. If two or more elements are not in direct contact with each other or among one another, the two elements are "disjoined from" each other or "disjoined among" one another. As used herein, a first element located "on" a second element can be located on the exterior side of a surface of the second element or on the interior side of the second element. As used herein, a first element is located "directly on" a second element if there exist a physical contact between a surface of the first element and a surface of the second element. As used herein, a first element is "electrically connected to" a second element if there exists a conductive path consisting of at least one conductive material between the first element and the second element. As used herein, a "prototype" structure or an "in-process" structure refers to a transient structure that is subsequently modified in the shape or composition of at least one component therein.

As used herein, a "layer" refers to a material portion including a region having a thickness. A layer may extend over the entirety of an underlying or overlying structure, or may have an extent less than the extent of an underlying or overlying structure. Further, a layer may be a region of a homogeneous or inhomogeneous continuous structure that has a thickness less than the thickness of the continuous structure. For example, a layer may be located between any pair of horizontal planes between, or at, a top surface and a bottom surface of the continuous structure. A layer may extend horizontally, vertically, and/or along a tapered surface. A substrate may be a layer, may include one or more layers therein, or may have one or more layer thereupon, thereabove, and/or therebelow.

As used herein, a first surface and a second surface are "vertically coincident" with each other if the second surface overlies or underlies the first surface and there exists a vertical plane or a substantially vertical plane that includes the first surface and the second surface. A substantially vertical plane is a plane that extends straight along a direction that deviates from a vertical direction by an angle less than 5 degrees. A vertical plane or a substantially vertical plane is straight along a vertical direction or a substantially vertical direction, and may, or may not, include a curvature along a direction that is perpendicular to the vertical direction or the substantially vertical direction.

A monolithic three-dimensional memory array is a memory array in which multiple memory levels are formed above a single substrate, such as a semiconductor wafer, with no intervening substrates. The term "monolithic" means that layers of each level of the array are directly deposited on the layers of each underlying level of the array. In contrast, two dimensional arrays may be formed separately and then packaged together to form a non-monolithic memory device. For example, non-monolithic stacked memories have been constructed by forming memory levels on separate substrates and vertically stacking the memory levels, as described in U.S. Pat. No. 5,915,167 titled "Three-dimensional Structure Memory." The substrates may be thinned or removed from the memory levels before bonding, but as the memory levels are initially formed over separate substrates, such memories are not true monolithic three-dimensional memory arrays. The various three-dimensional memory devices of the present disclosure include a monolithic three-dimensional NAND string memory device, and can be fabricated employing the various embodiments described herein.

Generally, a semiconductor package (or a "package") refers to a unit semiconductor device that can be attached to a circuit board through a set of pins or solder balls. A semiconductor package may include a semiconductor chip (or a "chip") or a plurality of semiconductor chips that are bonded thereamongst, for example, by flip-chip bonding or another chip-to-chip bonding. A package or a chip may include a single semiconductor die (or a "die") or a plurality of semiconductor dies. A die is the smallest unit that can independently execute external commands or report status. Typically, a package or a chip with multiple dies is capable of simultaneously executing as many number of external commands as the total number of planes therein. Each die includes one or more planes. Identical concurrent operations can be executed in each plane within a same die, although there may be some restrictions. In case a die is a memory die, i.e., a die including memory elements, concurrent read operations, concurrent write operations, or concurrent erase operations can be performed in each plane within a same memory die. In a memory die, each plane contains a number of memory blocks (or "blocks"), which are the smallest unit that can be erased by in a single erase operation. Each memory block contains a number of pages, which are the smallest units that can be selected for programming. A page is also the smallest unit that can be selected to a read operation.

Figure 1B:
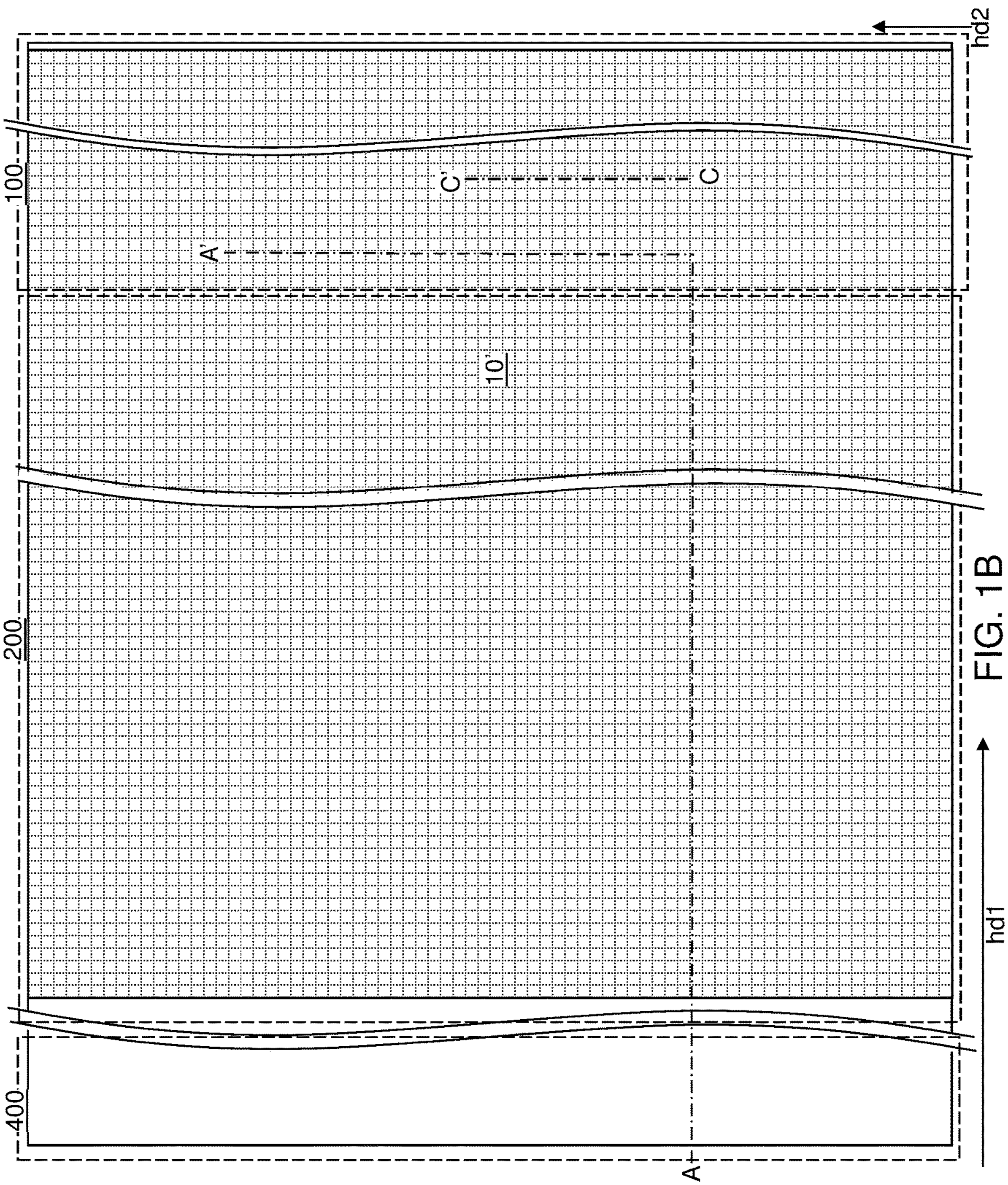
FIG. 1B is a top-down view of the exemplary structure of FIG. 1A. The hinged vertical plane A-A' is the plane of the vertical cross-sectional view of FIG. 1A.
Figure 1C:
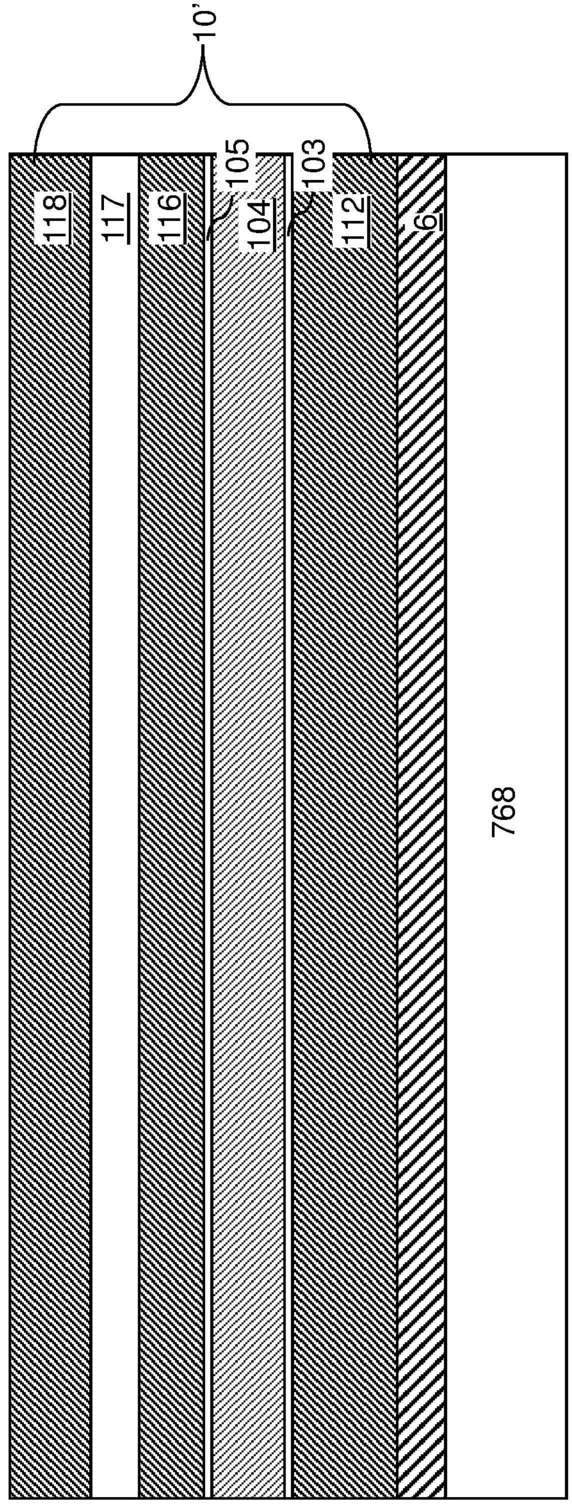
FIG. 1C is a magnified view of the in-process source level material layers along the vertical plane C-C' of FIG. 1B.

Referring to FIGS. 1A-1C, an exemplary structure according to a first embodiment of the present disclosure is illustrated. FIG. 1C is a magnified view of an in-process source-level material layers 10' illustrated in FIGS. 1A and 1B. The exemplary structure includes a semiconductor substrate 8 and semiconductor devices 710 formed thereupon. The semiconductor substrate 8 may include a substrate semiconductor layer 9 at least at an upper portion thereof. Shallow trench isolation structures 720 may be formed in an upper portion of the substrate semiconductor layer 9 to provide electrical isolation between the semiconductor devices 710. The semiconductor devices 710 may include, for example, field effect transistors including respective transistor active regions 742 (i.e., source regions and drain regions), channel regions 746, and gate structures 750. The field effect transistors may be arranged in a CMOS configuration. Each gate structure 750 may include, for example, a gate dielectric 752, a gate electrode 754, a dielectric gate spacer 756 and a gate cap dielectric 758. The semiconductor devices 710 may include any semiconductor circuitry to support operation of a memory structure to be subsequently formed, which is typically referred to as a driver circuitry, which is also known as peripheral circuitry. As used herein, a peripheral circuitry refers to any, each, or all, of word line decoder circuitry, word line switching circuitry, bit line decoder circuitry, bit line sensing and/or switching circuitry, power supply/distribution circuitry, data buffer and/or latch, or any other semiconductor circuitry that may be implemented outside a memory array structure for a memory device. For example, the semiconductor devices may include word line switching devices for electrically biasing word lines of three-dimensional memory structures to be subsequently formed.

Dielectric material layers may be formed over the semiconductor devices, which are herein referred to as lower-level dielectric material layers 760. The lower-level dielectric material layers 760 may include, for example, a dielectric liner 762 (such as a silicon nitride liner that blocks diffusion of mobile ions and/or apply appropriate stress to underlying structures), first dielectric material layers 764 that overlie the dielectric liner 762, a silicon nitride layer (e.g., hydrogen diffusion barrier) 766 that overlies the first dielectric material layers 764, and at least one second dielectric layer 768. The dielectric layer stack including the lower-level dielectric material layers 760 may function as a matrix for lower-level metal interconnect structures 780 that provide electrical wiring to and from the various nodes of the semiconductor devices and landing pads for through-memory-level interconnection via structures to be subsequently formed. The lower-level metal interconnect structures 780 may be formed within the dielectric layer stack of the lower-level dielectric material layers 760 and overlies the field effect transistors. The lower-level metal interconnect structures 780 may comprise a lower-level metal line structure located under and optionally contacting a bottom surface of the silicon nitride layer 766.

For example, the lower-level metal interconnect structures 780 may be formed within the first dielectric material layers 764. The first dielectric material layers 764 may be a plurality of dielectric material layers in which various elements of the lower-level metal interconnect structures 780 are sequentially formed. Each dielectric material layer selected from the first dielectric material layers 764 may include any of doped silicate glass, undoped silicate glass, organosilicate glass, silicon nitride, silicon oxynitride, and dielectric metal oxides (such as aluminum oxide). In one embodiment, the first dielectric material layers 764 may comprise, or consist essentially of, dielectric material layers having dielectric constants that do not exceed the dielectric constant of undoped silicate glass (silicon oxide) of 3.9. The lower-level metal interconnect structures 780 may include various device contact via structures 782 (e.g., source and drain electrodes which contact the respective source and drain nodes of the device or gate electrode contacts), intermediate lower-level metal line structures 784, lower-level metal via structures 786, and landing-pad-level metal line structures 788 that are configured to function as landing pads for through-memory-level interconnection via structures to be subsequently formed.

The landing-pad-level metal line structures 788 may be formed within a topmost dielectric material layer of the first dielectric material layers 764 (which may be a plurality of dielectric material layers). Each of the lower-level metal interconnect structures 780 may include a metallic nitride liner and a metal fill structure. Top surfaces of the landing-pad-level metal line structures 788 and the topmost surface of the first dielectric material layers 764 may be planarized by a planarization process, such as chemical mechanical planarization. The silicon nitride layer 766 may be formed directly on the top surfaces of the landing-pad-level metal line structures 788 and the topmost surface of the first dielectric material layers 764.

The at least one second dielectric material layer 768 may include a single dielectric material layer or a plurality of dielectric material layers. Each dielectric material layer selected from the at least one second dielectric material layer 768 may include any of doped silicate glass, undoped silicate glass, and organosilicate glass. In one embodiment, the at least one first second material layer 768 may comprise, or consist essentially of, dielectric material layers having dielectric constants that do not exceed the dielectric constant of undoped silicate glass (silicon oxide) of 3.9.

An optional layer of a metallic material and a layer of a semiconductor material may be deposited over, or within patterned recesses of, the at least one second dielectric material layer 768, and is lithographically patterned to provide an optional conductive plate layer 6 and in-process source-level material layers 10'. The optional conductive plate layer 6, if present, provides a high conductivity conduction path for electrical current that flows into, or out of, the in-process source-level material layers 10'. The optional conductive plate layer 6 includes a conductive material such as a metal or a heavily doped semiconductor material. The optional conductive plate layer 6, for example, may include a tungsten layer having a thickness in a range from 3 nm to 100 nm, although lesser and greater thicknesses may also be used. A metal nitride layer (not shown) may be provided as a diffusion barrier layer on top of the conductive plate layer 6. The conductive plate layer 6 may function as a special source line in the completed device. In addition, the conductive plate layer 6 may comprise an etch stop layer and may comprise any suitable conductive, semiconductor or insulating layer. The optional conductive plate layer 6 may include a metallic compound material such as a conductive metallic nitride (e.g., TiN) and/or a metal (e.g., W). The thickness of the optional conductive plate layer 6 may be in a range from 5 nm to 100 nm, although lesser and greater thicknesses may also be used.

The in-process source-level material layers 10' may include various layers that are subsequently modified to form source-level material layers. The source-level material layers, upon formation, include a source contact layer that functions as a common source region for vertical field effect transistors of a three-dimensional memory device. In one embodiment, the in-process source-level material layers 10' may include, from bottom to top, a lower source-level material layer 112, a lower sacrificial liner 103, a source-level sacrificial layer 104, an upper sacrificial liner 105, an upper source-level semiconductor layer 116, a source-level insulating layer 117, and an optional source-select-level conductive layer 118.

The lower source-level material layer 112 and the upper source-level semiconductor layer 116 may include a doped semiconductor material such as doped polysilicon or doped amorphous silicon. The conductivity type of the lower source-level material layer 112 and the upper source-level semiconductor layer 116 may be the opposite of the conductivity of vertical semiconductor channels to be subsequently formed. For example, if the vertical semiconductor channels to be subsequently formed have a doping of a first conductivity type, the lower source-level material layer 112 and the upper source-level semiconductor layer 116 have a doping of a second conductivity type that is the opposite of the first conductivity type. The thickness of each of the lower source-level material layer 112 and the upper source-level semiconductor layer 116 may be in a range from 10 nm to 300 nm, such as from 20 nm to 150 nm, although lesser and greater thicknesses may also be used.

The source-level sacrificial layer 104 includes a sacrificial material that may be removed selective to the lower sacrificial liner 103 and the upper sacrificial liner 105. In one embodiment, the source-level sacrificial layer 104 may include a semiconductor material such as undoped amorphous silicon or a silicon-germanium alloy with an atomic concentration of germanium greater than 20%. The thickness of the source-level sacrificial layer 104 may be in a range from 30 nm to 400 nm, such as from 60 nm to 200 nm, although lesser and greater thicknesses may also be used.

The lower sacrificial liner 103 and the upper sacrificial liner 105 include materials that may function as an etch stop material during removal of the source-level sacrificial layer 104. For example, the lower sacrificial liner 103 and the upper sacrificial liner 105 may include silicon oxide, silicon nitride, and/or a dielectric metal oxide. In one embodiment, each of the lower sacrificial liner 103 and the upper sacrificial liner 105 may include a silicon oxide layer having a thickness in a range from 2 nm to 30 nm, although lesser and greater thicknesses may also be used.

The source-level insulating layer 117 includes a dielectric material such as silicon oxide. The thickness of the source-level insulating layer 117 may be in a range from 20 nm to 400 nm, such as from 40 nm to 200 nm, although lesser and greater thicknesses may also be used. The optional source-select-level conductive layer 118 may include a conductive material that may be used as a source-select-level gate electrode. For example, the optional source-select-level conductive layer 118 may include a doped semiconductor material such as doped polysilicon or doped amorphous silicon that may be subsequently converted into doped polysilicon by an anneal process. The thickness of the optional source-select-level conductive layer 118 may be in a range from 30 nm to 200 nm, such as from 60 nm to 100 nm, although lesser and greater thicknesses may also be used.

The in-process source-level material layers 10' may be formed directly above a subset of the semiconductor devices on the semiconductor substrate 8 (e.g., silicon wafer). As used herein, a first element is located "directly above" a second element if the first element is located above a horizontal plane including a topmost surface of the second element and an area of the first element and an area of the second element has an areal overlap in a plan view (i.e., along a vertical plane or direction perpendicular to the top surface of the semiconductor substrate 8. In one embodiment, the in-process source-level material layer 10' may have an opening in each area in which through-memory-level interconnection via structures are to be subsequently formed. For example, the in-process source-level material layer 10' may have openings in the memory array region 100.

The optional conductive plate layer 6 and the in-process source-level material layers 10' may be patterned to provide openings in areas in which through-memory-level interconnection via structures and through-dielectric contact via structures are to be subsequently formed. Patterned portions of the stack of the conductive plate layer 6 and the in-process source-level material layers 10' are present in each memory array region 100 in which three-dimensional memory stack structures are to be subsequently formed.

The optional conductive plate layer 6 and the in-process source-level material layers 10' may be patterned such that an opening extends over a staircase region 200 in which contact via structures contacting word line electrically conductive layers are to be subsequently formed. In one embodiment, the staircase region 200 may be laterally spaced from the memory array region 100 along a first horizontal direction hd1. A horizontal direction that is perpendicular to the first horizontal direction hd1 is herein referred to as a second horizontal direction hd2. In one embodiment, additional openings in the optional conductive plate layer 6 and the in-process source-level material layers 10' may be formed within the area of a memory array region 100, in which a three-dimensional memory array including memory stack structures is to be subsequently formed. A peripheral device region 400 that may be subsequently filled with a field dielectric material portion may be provided adjacent to the staircase region 200.

The region of the semiconductor devices 710 and the combination of the lower-level dielectric material layers 760 and the lower-level metal interconnect structures 780 is herein referred to an underlying peripheral device region 700, which is located underneath a memory-level assembly to be subsequently formed and includes peripheral devices for the memory-level assembly. The lower-level metal interconnect structures 780 may be formed in the lower-level dielectric material layers 760.

The lower-level metal interconnect structures 780 may be electrically connected to active nodes (e.g., transistor active regions 742 or gate electrodes 754) of the semiconductor devices 710 (e.g., CMOS devices), and may be located at the level of the lower-level dielectric material layers 760. Through-memory-level interconnection via structures may be subsequently formed directly on the lower-level metal interconnect structures 780 to provide electrical connection to memory devices that are also to be subsequently formed. In one embodiment, the pattern of the lower-level metal interconnect structures 780 may be selected such that the landing-pad-level metal line structures 788 (which are a subset of the lower-level metal interconnect structures 780 located at the topmost portion of the lower-level metal interconnect structures 780) may provide landing pad structures for the through-memory-level interconnection via structures to be subsequently formed.

Figure 2:
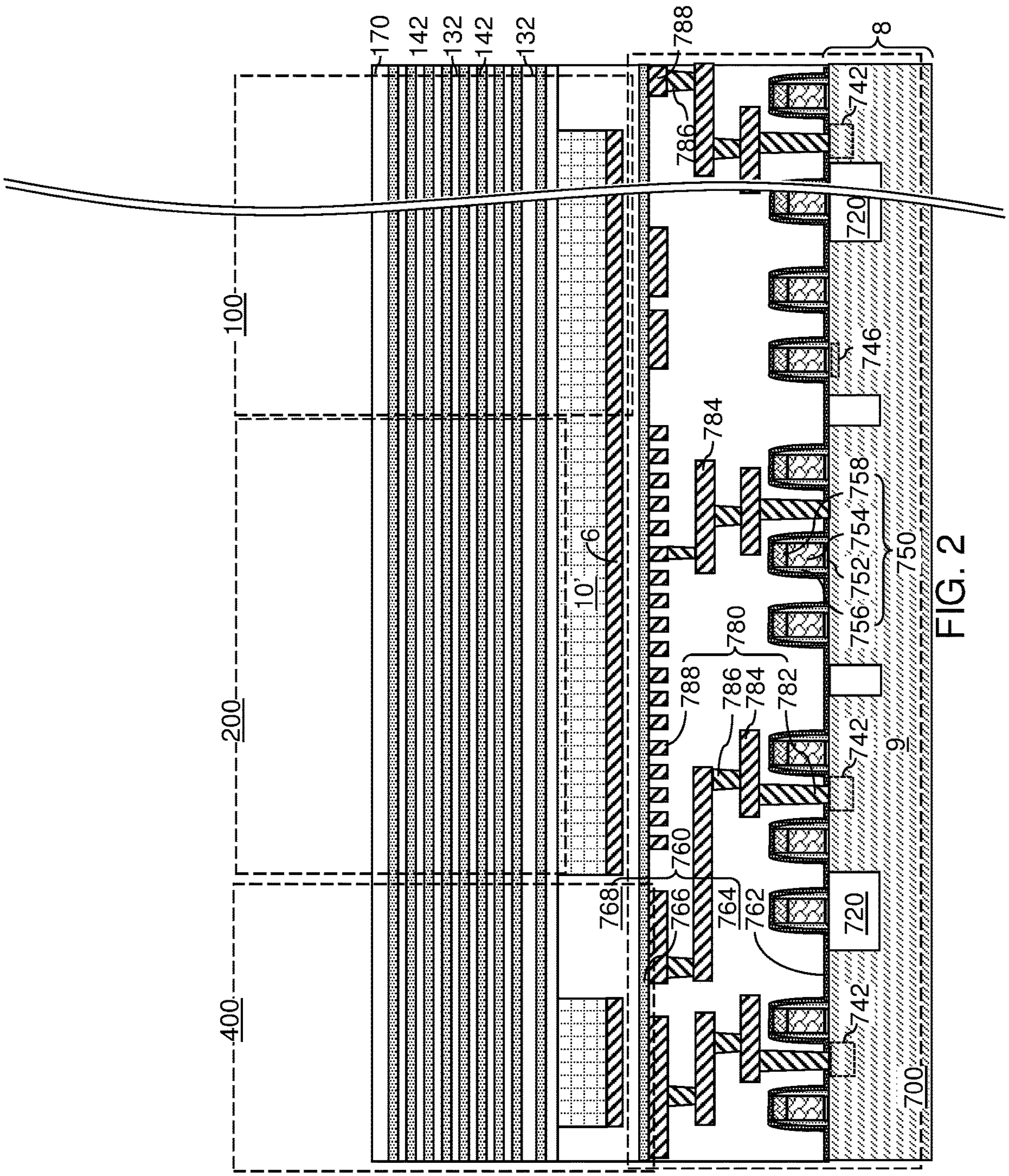
FIG. 2 is a vertical cross-sectional view of the exemplary structure after formation of a first-tier alternating stack of first insulating layers and first spacer material layers according to an embodiment of the present disclosure.

Referring to FIG. 2, an alternating stack of first material layers and second material layers may be formed. Each first material layer may include a first material, and each second material layer may include a second material that is different from the first material. In embodiments where at least another alternating stack of material layers is subsequently formed over the alternating stack of the first material layers and the second material layers, the alternating stack is herein referred to as a first-tier alternating stack. The level of the first-tier alternating stack is herein referred to as a first-tier level, and the level of the alternating stack to be subsequently formed immediately above the first-tier level is herein referred to as a second-tier level, etc.

The first-tier alternating stack may include first insulating layers 132 as the first material layers, and first spacer material layers as the second material layers. In one embodiment, the first spacer material layers may be sacrificial material layers that are subsequently replaced with electrically conductive layers. In another embodiment, the first spacer material layers may be electrically conductive layers that are not subsequently replaced with other layers. While the present disclosure is described using embodiments in which sacrificial material layers are replaced with electrically conductive layers, embodiments in which the spacer material layers are formed as electrically conductive layers (thereby obviating the need to perform replacement processes) are expressly contemplated herein.

In one embodiment, the first material layers and the second material layers may be first insulating layers 132 and first sacrificial material layers 142, respectively. In one embodiment, each first insulating layer 132 may include a first insulating material, and each first sacrificial material layer 142 may include a first sacrificial material. An alternating plurality of first insulating layers 132 and first sacrificial material layers 142 is formed over the in-process source-level material layers 10'. As used herein, a "sacrificial material" refers to a material that is removed during a subsequent processing step.

As used herein, an alternating stack of first elements and second elements refers to a structure in which instances of the first elements and instances of the second elements alternate. Each instance of the first elements that is not an end element of the alternating plurality is adjoined by two instances of the second elements on both sides, and each instance of the second elements that is not an end element of the alternating plurality is adjoined by two instances of the first elements on both ends. The first elements may have the same thickness throughout, or may have different thicknesses. The second elements may have the same thickness throughout, or may have different thicknesses.

The alternating plurality of first material layers and second material layers may begin with an instance of the first material layers or with an instance of the second material layers, and may end with an instance of the first material layers or with an instance of the second material layers. In one embodiment, an instance of the first elements and an instance of the second elements may form a unit that is repeated with periodicity within the alternating plurality.

The first-tier alternating stack (132, 142) may include first insulating layers 132 composed of the first material, and first sacrificial material layers 142 composed of the second material, which is different from the first material. The first material of the first insulating layers 132 may be at least one insulating material.

Insulating materials that may be used for the first insulating layers 132 include, but are not limited to silicon oxide (including doped or undoped silicate glass), silicon nitride, silicon oxynitride, organosilicate glass (OSG), spin-on dielectric materials, dielectric metal oxides that are commonly known as high dielectric constant (high-k) dielectric oxides (e.g., aluminum oxide, hafnium oxide, etc.) and silicates thereof, dielectric metal oxynitrides and silicates thereof, and organic insulating materials. In one embodiment, the first material of the first insulating layers 132 may be silicon oxide.

The second material of the first sacrificial material layers 142 may be a sacrificial material that may be removed selective to the first material of the first insulating layers 132. As used herein, a removal of a first material is "selective to" a second material if the removal process removes the first material at a rate that is at least twice the rate of removal of the second material. The ratio of the rate of removal of the first material to the rate of removal of the second material is herein referred to as a "selectivity" of the removal process for the first material with respect to the second material.

The second material of the first sacrificial material layers 142 may be subsequently replaced with electrically conductive electrodes which may function, for example, as control gate electrodes of a vertical NAND device. According to an aspect of the present disclosure, the first sacrificial material layers 142 include a dielectric material. In one embodiment, the first sacrificial material layers 142 may be material layers that comprise silicon nitride.

In one embodiment, the first insulating layers 132 may include silicon oxide, and sacrificial material layers may include silicon nitride sacrificial material layers. The first material of the first insulating layers 132 may be deposited, for example, by chemical vapor deposition (CVD). For example, if silicon oxide is used for the first insulating layers 132, tetraethylorthosilicate (TEOS) may be used as the precursor material for the CVD process. The second material of the first sacrificial material layers 142 may be formed, for example, CVD or atomic layer deposition (ALD).

The thicknesses of the first insulating layers 132 and the first sacrificial material layers 142 may be in a range from 20 nm to 50 nm, although lesser and greater thicknesses may be used for each first insulating layer 132 and for each first sacrificial material layer 142. The number of repetitions of the pairs of a first insulating layer 132 and a first sacrificial material layer 142 may be in a range from 2 to 1,024, and typically from 8 to 256, although a greater number of repetitions may also be used. In one embodiment, each first sacrificial material layer 142 in the first-tier alternating stack (132, 142) may have a uniform thickness that is substantially invariant within each respective first sacrificial material layer 142.

A first insulating cap layer 170 may be subsequently formed over the first-tier alternating stack (132, 142). The first insulating cap layer 170 includes a dielectric material, which may be any dielectric material that may be used for the first insulating layers 132. In one embodiment, the first insulating cap layer 170 includes the same dielectric material as the first insulating layers 132. The thickness of the first insulating cap layer 170 may be in a range from 20 nm to 300 nm, although lesser and greater thicknesses may also be used.

Figure 3:
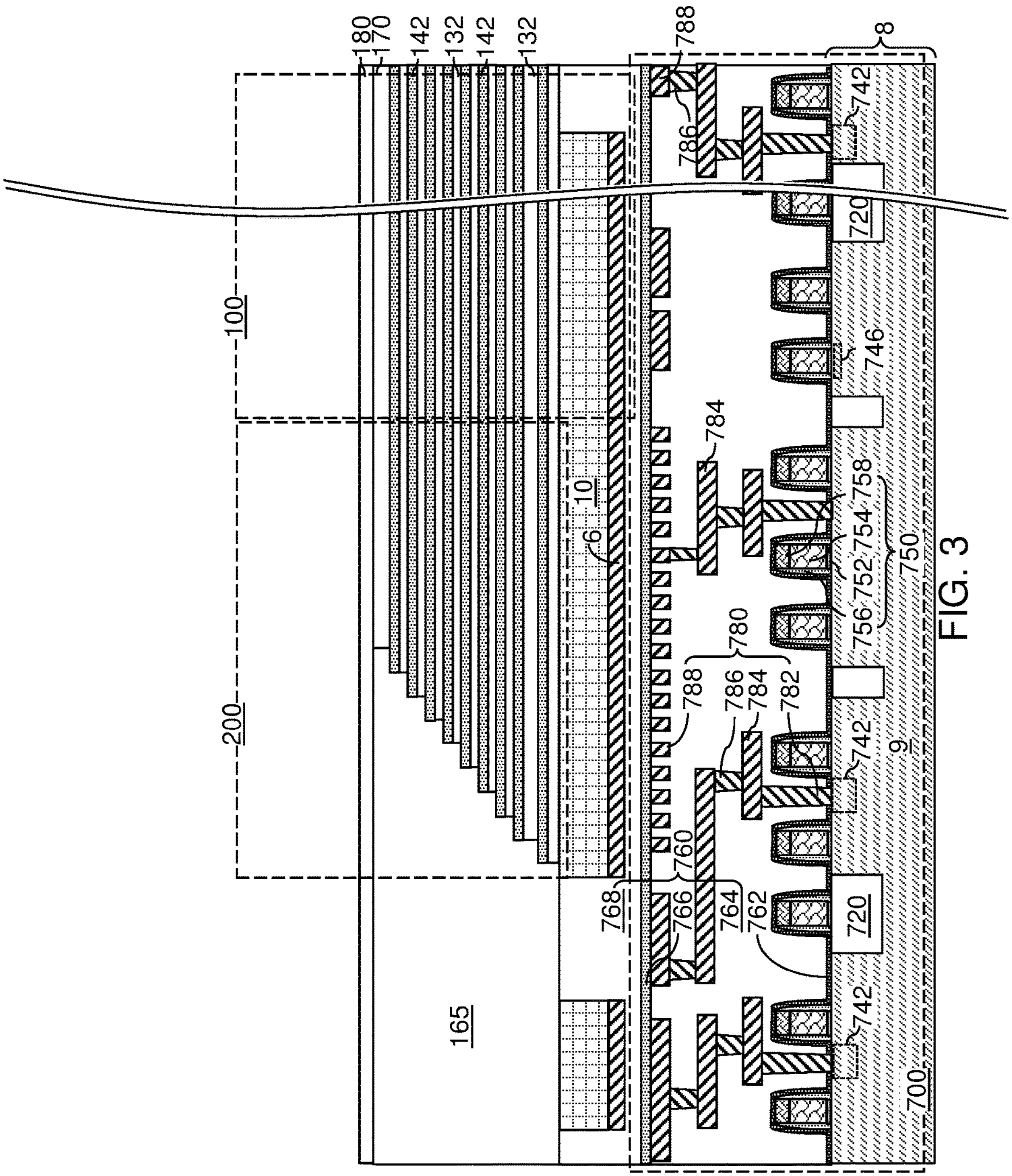
FIG. 3 is a vertical cross-sectional view of the exemplary structure after patterning a first-tier staircase region, a first retro-stepped dielectric material portion, and an inter-tier dielectric layer according to an embodiment of the present disclosure.

Referring to FIG. 3, the first insulating cap layer 170 and the first-tier alternating stack (132, 142) may be patterned to form first stepped surfaces in the staircase region 200. The staircase region 200 may include a respective first stepped area in which the first stepped surfaces are formed, and a second stepped area in which additional stepped surfaces are to be subsequently formed in a second-tier structure (to be subsequently formed over a first-tier structure) and/or additional tier structures.

The first stepped surfaces may be formed, for example, by forming a mask layer with an opening therein, etching a cavity within the levels of the first insulating cap layer 170, and iteratively expanding the etched area and vertically recessing the cavity by etching each pair of a first insulating layer 132 and a first sacrificial material layer 142 located directly underneath the bottom surface of the etched cavity within the etched area. In one embodiment, top surfaces of the first sacrificial material layers 142 may be physically exposed at the first stepped surfaces. The cavity overlying the first stepped surfaces is herein referred to as a first stepped cavity.

A dielectric fill material (such as undoped silicate glass or doped silicate glass) may be deposited to fill the first stepped cavity. Excess portions of the dielectric fill material may be removed from above the horizontal plane including the top surface of the first insulating cap layer 170. A remaining portion of the dielectric fill material that fills the region overlying the first stepped surfaces constitute a first retro-stepped dielectric material portion 165. As used herein, a "retro-stepped" element refers to an element that has stepped surfaces and a horizontal cross-sectional area that increases monotonically as a function of a vertical distance from a top surface of a substrate on which the element is present. The first-tier alternating stack (132, 142) and the first retro-stepped dielectric material portion 165 collectively constitute a first-tier structure, which is an in-process structure that is subsequently modified.

An inter-tier dielectric layer 180 may be optionally deposited over the first-tier structure (132, 142, 170, 165). The inter-tier dielectric layer 180 includes a dielectric material such as silicon oxide. In one embodiment, the inter-tier dielectric layer 180 may include a doped silicate glass having a greater etch rate than the material of the first insulating layers 132 (which may include an undoped silicate glass). For example, the inter-tier dielectric layer 180 may include phosphosilicate glass. The thickness of the inter-tier dielectric layer 180 may be in a range from 30 nm to 300 nm, although lesser and greater thicknesses may also be used.

Figure 4A:
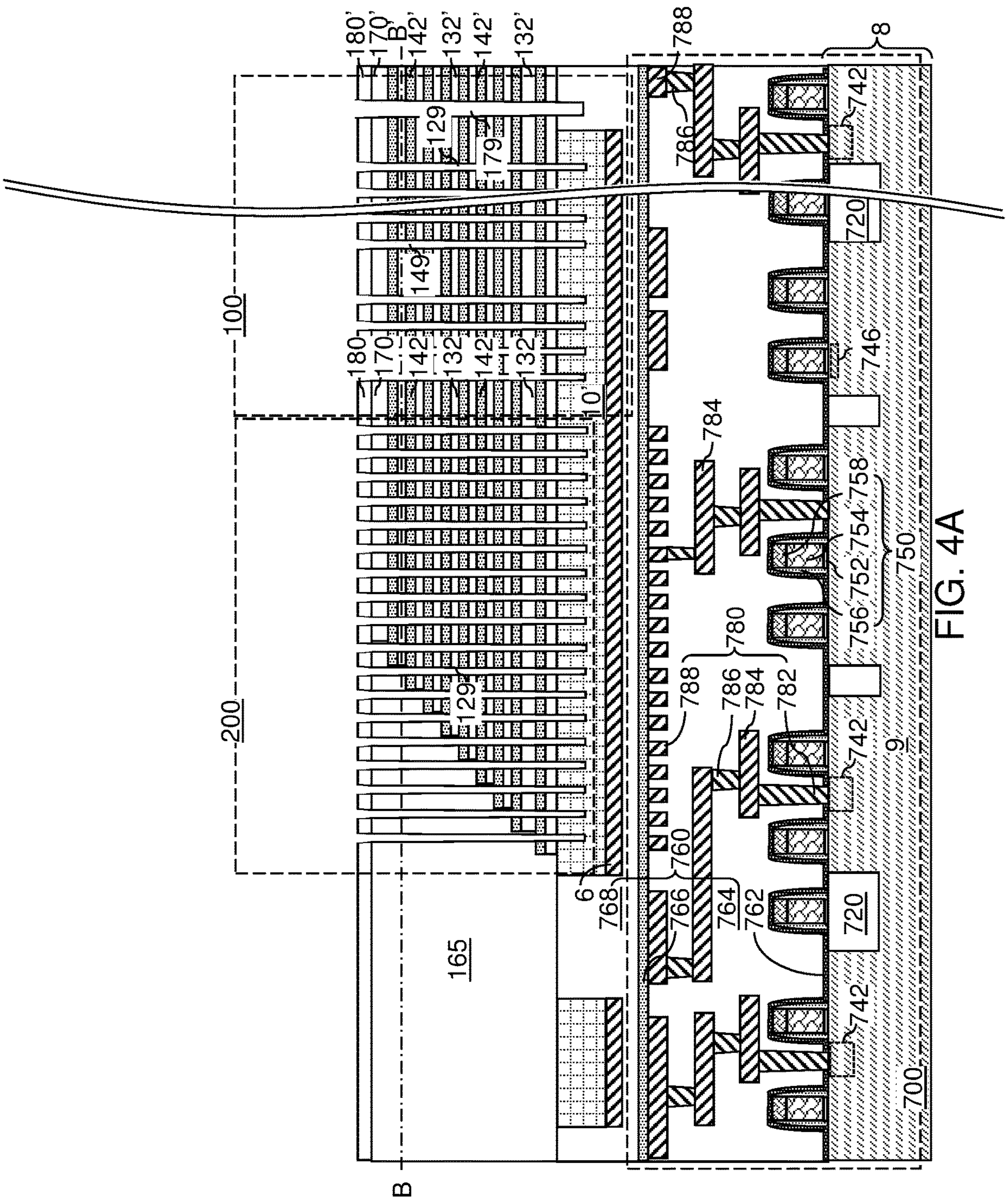
FIG. 4A is a vertical cross-sectional view of the exemplary structure after formation of first-tier memory openings, first-tier support openings, first-tier isolation openings, and a first-tier moat trench according to an embodiment of the present disclosure.
Figure 4B:
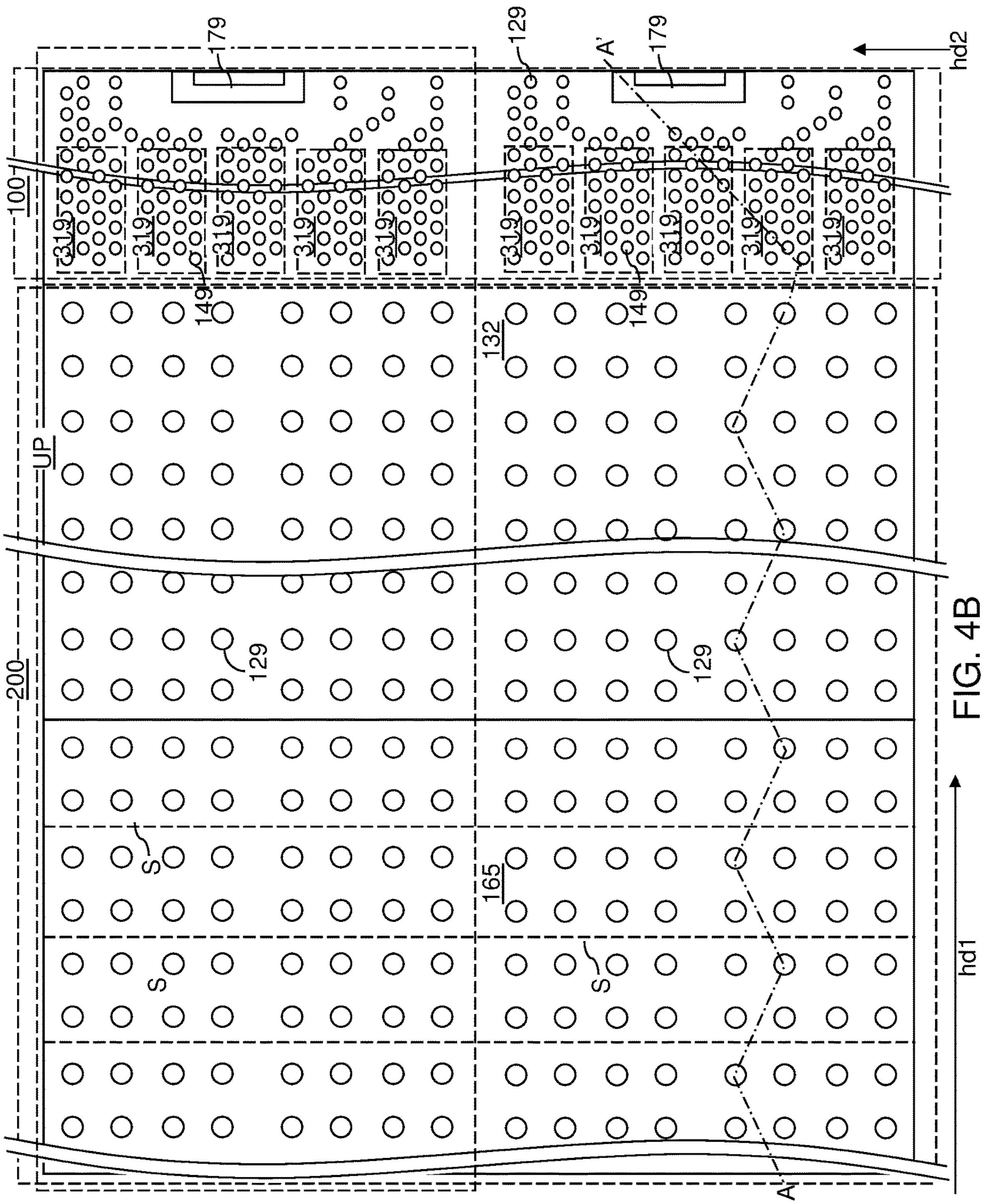
FIG. 4B is top-down view of the exemplary structure of FIG. 4A. The hinged vertical plane A-A' corresponds to the plane of the vertical cross-sectional view of FIG. 4A.
Figure 4C:
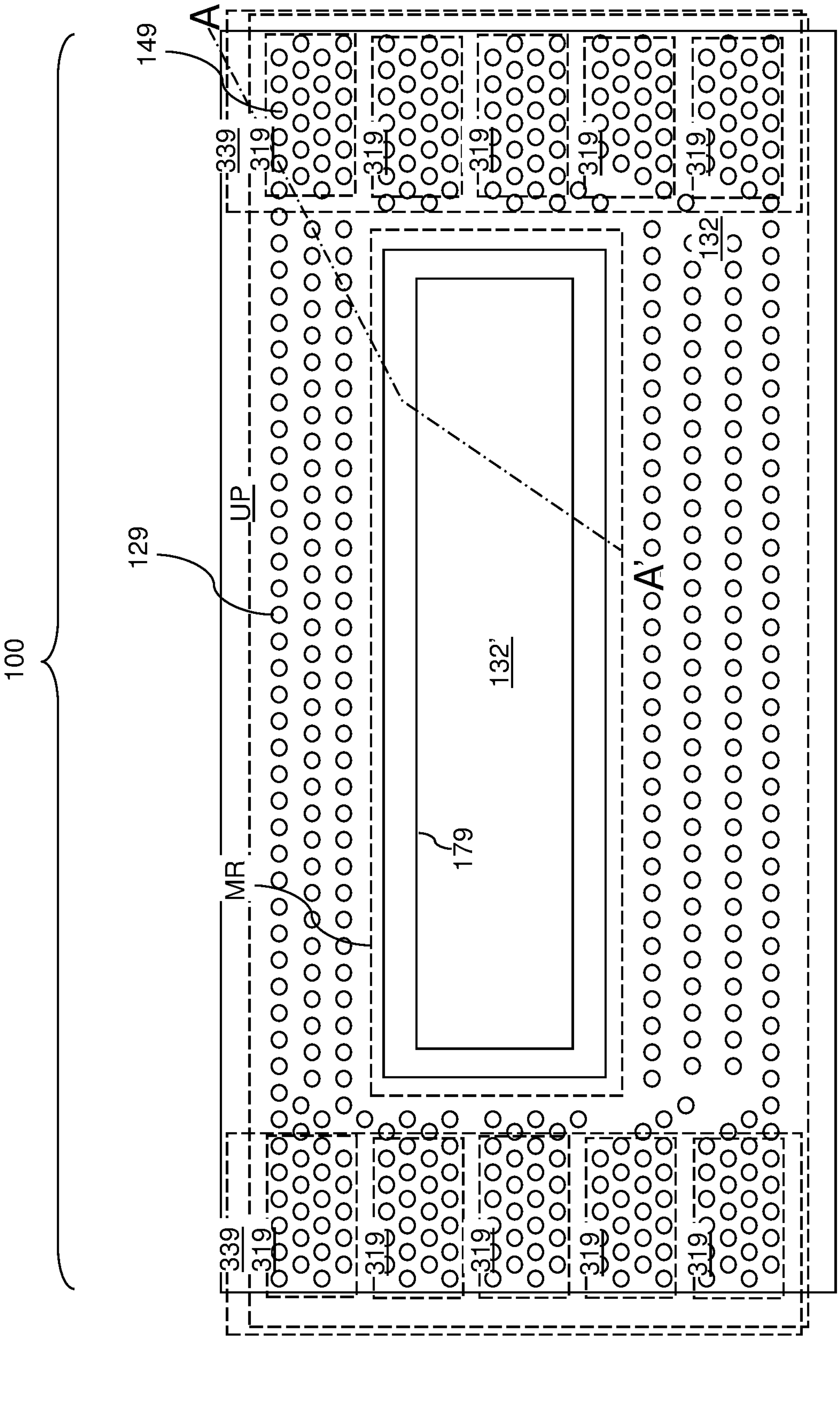
FIG. 4C is a top-down view of another area of the exemplary structure of FIG. 4A.

Referring to FIGS. 4A-4C, various first-tier openings (149, 129, 179) may be formed through the inter-tier dielectric layer 180 and the first-tier structure (132, 142, 170, 165) and into the in-process source-level material layers 10'. A photoresist layer (not shown) may be applied over the inter-tier dielectric layer 180, and may be lithographically patterned to form various openings therethrough.

The pattern of openings in the photoresist layer may be transferred through the inter-tier dielectric layer 180 and the first-tier structure (132, 142, 170, 165) and into the in-process source-level material layers 10' by a first anisotropic etch process to form the various first-tier openings (149, 129, 179) concurrently, i.e., during the first isotropic etch process. The various first-tier openings (149, 129, 179) may include first-tier memory openings 149, first-tier support openings 129, and first-tier moat trenches 179. Locations of steps S in the first-tier alternating stack (132, 142) are illustrated as dotted lines in FIG. 4B.

The first-tier memory openings 149 may be openings that are formed in the memory array region 100 through each layer within the first-tier alternating stack (132, 142) and are subsequently used to form memory stack structures therein. The first-tier memory openings 149 may be formed in clusters 319 of first-tier memory openings 149 that are laterally spaced apart along the second horizontal direction hd2. Each cluster 319 of first-tier memory openings 149 may be formed as a two-dimensional array of first-tier memory openings 149.

A subset of the first-tier support openings 129 may be formed in sections of the memory array region 100 that are not filled with the first-tier memory openings 149. The sections of the memory array region 100 that are not filled with the first-tier memory openings 149 may be distributed over multiple areas within the memory array region 100. The first-tier support openings 129 may include a first subset of first-tier support openings 129 that are formed in the staircase region 200, and a second subset of first-tier support openings 129 that are formed between groups 339 of clusters 319 of first-tier memory openings 149 which are laterally spaced apart along the first horizontal direction hd1 in the memory array region 100. The first subset of the first-tier support openings 129 that is formed through the first retro-stepped dielectric material portion 165 may be formed through a respective horizontal surface of the first stepped surfaces.

As shown in FIG. 4C, the second subset of the first-tier support openings 129 may be formed between groups 339 of clusters 319 of the first-tier memory openings 149 that are laterally spaced apart along the first horizontal direction hd1. In one embodiment, some of the first-tier support openings 129 within the second subset of the first-tier support openings 129 may be arranged in straight rows that extend along the first direction hd1. Additional first-tier support openings 129 may be provided outside the straight rows of the first-tier support openings 129.

A first subset of the first-tier memory openings 149 can be formed in a first portion of the memory array region 100, and a second subset of the first-tier memory openings 149 can be formed in a second portion of the memory region 100 that is laterally spaced apart from the first portion of the memory region 100 along the first horizontal direction hd1. First-tier moat trenches 179 can be formed between the first subset of the first-tier memory openings 149 and the second subset of the first-tier memory openings 149. Each first-tier moat trench 179 can have inner sidewalls that laterally surround a patterned portion of the first-tier alternating stack (132, 142), outer sidewalls that are laterally offset outward from the inner sidewalls, and a bottom surface connecting the inner sidewalls to the outer sidewalls. Each region in which first-tier moat trench 179 is located is herein referred to as a moat region MR.

Generally, a unit pattern UP of a combination of first-tier memory openings 149, first-tier support openings 129, and first-tier moat trenches 179 may be repeated along the second horizontal direction hd2. Each unit pattern UP includes groups 339 of clusters 319 of first-tier memory openings 149 that are laterally spaced apart along the second horizontal direction hd2 and/or laterally spaced apart along the first horizontal direction hd1.

In one embodiment, the first anisotropic etch process may include an initial step in which the materials of the first-tier alternating stack (132, 142) are etched concurrently with the material of the first retro-stepped dielectric material portion 165. The chemistry of the initial etch step may alternate to optimize etching of the first and second materials in the first-tier alternating stack (132, 142) while providing a comparable average etch rate to the material of the first retro-stepped dielectric material portion 165. The first anisotropic etch process may use, for example, a series of reactive ion etch processes or a single reaction etch process (e.g., $CF_4/O_2/Ar$ etch). The sidewalls of the various first-tier openings (149, 129, 179) may be substantially vertical, or may be tapered.

After etching through the alternating stack (132, 142) and the first retro-stepped dielectric material portion 165, the chemistry of a terminal portion of the first anisotropic etch process may be selected to etch through the dielectric material(s) of the at least one second dielectric layer 768 with a higher etch rate than an average etch rate for the in-process source-level material layers 10'. For example, the terminal portion of the anisotropic etch process may include a step that etches the dielectric material(s) of the at least one second dielectric layer 768 selective to a semiconductor material within a component layer in the in-process source-level material layers 10'. In one embodiment, the terminal portion of the first anisotropic etch process may etch through the source-select-level conductive layer 118, the source-level insulating layer 117, the upper source-level semiconductor layer 116, the upper sacrificial liner 105, the source-level sacrificial layer 104, and the lower sacrificial liner 103, and at least partly into the lower source-level semiconductor layer 112. The terminal portion of the first anisotropic etch process may include at least one etch chemistry for etching the various semiconductor materials of the in-process source-level material layers 10'. The photoresist layer may be subsequently removed, for example, by ashing.

Optionally, the portions of the first-tier memory openings 149, the first-tier support openings 129, and the first-tier moat trenches 179 at the level of the inter-tier dielectric layer 180 may be laterally expanded by an isotropic etch. In this case, the inter-tier dielectric layer 180 may comprise a dielectric material (such as borosilicate glass) having a greater etch rate than the first insulating layers 132 (that may include undoped silicate glass) in dilute hydrofluoric acid. An isotropic etch (such as a wet etch using HF) may be used to expand the lateral dimensions of the first-tier memory openings 149 at the level of the inter-tier dielectric layer 180. The portions of the first-tier memory openings 149 located at the level of the inter-tier dielectric layer 180 may be optionally widened to provide a larger landing pad for second-tier memory openings to be subsequently formed through a second-tier alternating stack (to be subsequently formed prior to formation of the second-tier memory openings).

The first sacrificial material layers 142 comprise a first dielectric material such as silicon nitride. Patterned portions of the first insulating layers 132 laterally surrounded by a first-tier moat trench 179 comprise first insulating plates 132'. Patterned portions of the first sacrificial material layers 142 laterally surrounded by a first-tier moat trench 179 comprise first dielectric material plates 142'. A patterned portion of the first insulating cap layer 170 laterally surrounded by a first-tier moat trench 179 comprises a first insulating cap plate 170'. A patterned portion of the inter-tier dielectric layer 180 laterally surrounded by a first-tier moat trench 179 comprises an inter-tier dielectric plate 180'. Patterned portions of the first insulating layers 132 and the first sacrificial material layers 142 within each first-tier moat trench 179 comprise a first vertically alternating sequence of first insulating plates 132' and first dielectric material plates 142'.

In one embodiment, each first-tier moat trench 179 can have a horizontal cross-sectional shape of a rectangular frame. In this case, the outer sidewalls of each first-tier moat trench 179 can include a pair of lengthwise sidewalls that laterally extend along the first horizontal direction hd1 and a pair of widthwise sidewalls that laterally extend along the second horizontal direction hd2. The inner sidewalls of each first-tier moat trench 179 can include a pair of lengthwise sidewalls that laterally extend along the first horizontal direction hd1 and a pair of widthwise sidewalls that laterally extend along the second horizontal direction hd2.

Each of the first insulating plates 132' can be vertically spaced from the top surface of the in-process source-level material layers 10' by a same vertical distance as a respective first insulating layer 132 in the first-tier alternating stack is from the top surface of the in-process source-level material layers 10'. Each of the first dielectric material plates 142' can be vertically spaced from the top surface of the in-process source-level material layers 10' by a same vertical distance as a respective first sacrificial material layer 142 in the first-tier alternating stack is from the top surface of the in-process source-level material layers 10'.

Figure 5:
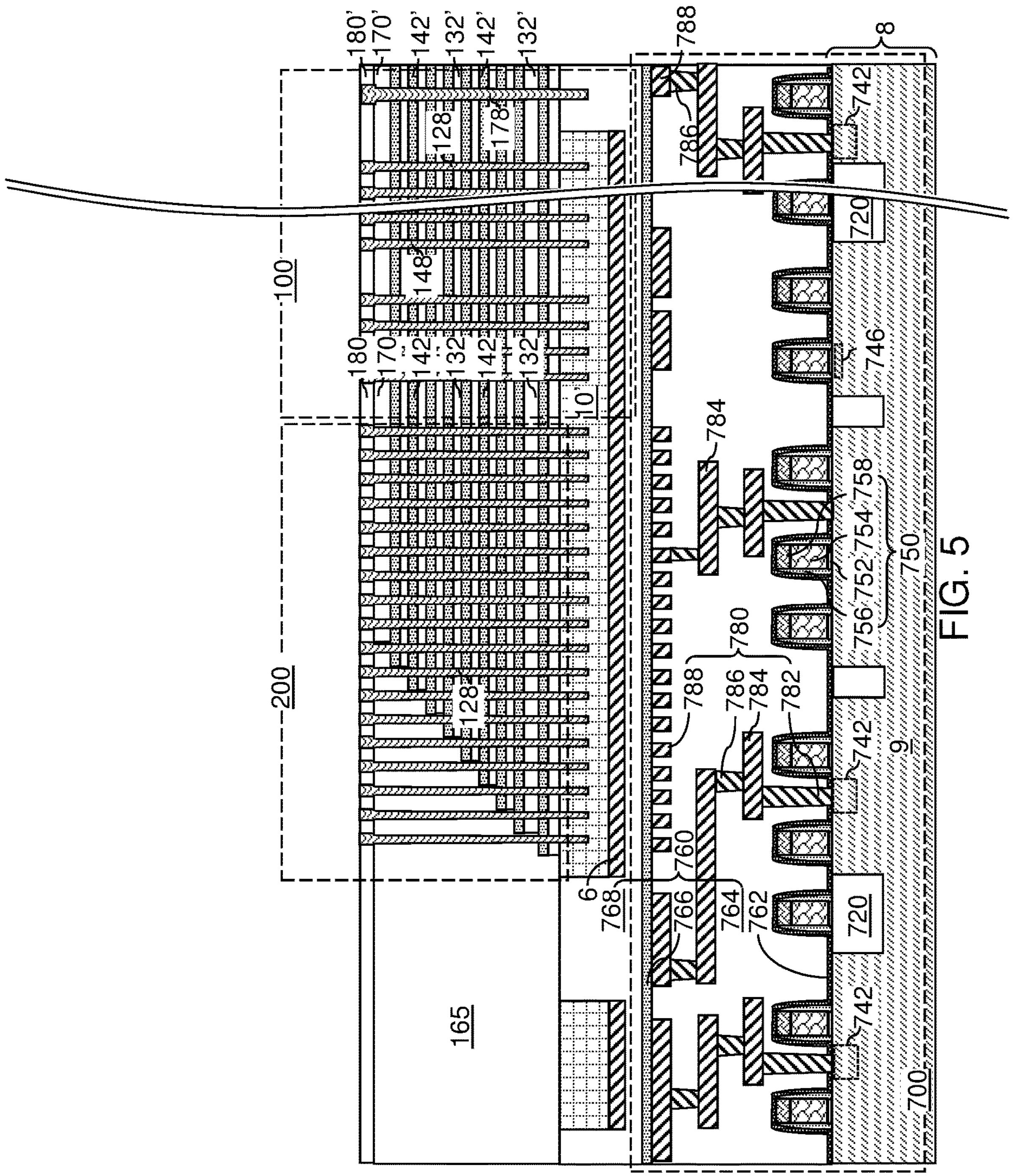
FIG. 5 is a vertical cross-sectional view of the exemplary structure after formation of various sacrificial fill structures according to an embodiment of the present disclosure.

Referring to FIG. 5, sacrificial first-tier opening fill portions (148, 128, 178) may be formed in the various first-tier openings (149, 129, 179). For example, a sacrificial first-tier fill material may be deposited concurrently deposited in each of the first-tier openings (149, 129, 179). The sacrificial first-tier fill material includes a material that may be subsequently removed selective to the materials of the first insulating layers 132 and the first sacrificial material layers 142.

In one embodiment, the sacrificial first-tier fill material may include a semiconductor material such as silicon (e.g., a-Si or polysilicon), a silicon-germanium alloy, germanium, a III-V compound semiconductor material, or a combination thereof. Optionally, a thin etch stop liner (such as a silicon oxide layer or a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In another embodiment, the sacrificial first-tier fill material may include a silicon oxide material having a higher etch rate than the materials of the first insulating layers 132, the first insulating cap layer 170, and the inter-tier dielectric layer 180. For example, the sacrificial first-tier fill material may include borosilicate glass or porous or non-porous organosilicate glass having an etch rate that is at least 100 times higher than the etch rate of densified TEOS oxide (i.e., a silicon oxide material formed by decomposition of tetraethylorthosilicate glass in a chemical vapor deposition process and subsequently densified in an anneal process) in a 100:1 dilute hydrofluoric acid. In this case, a thin etch stop liner (such as a silicon nitride layer having a thickness in a range from 1 nm to 3 nm) may be used prior to depositing the sacrificial first-tier fill material. The sacrificial first-tier fill material may be formed by a non-conformal deposition or a conformal deposition method.

In yet another embodiment, the sacrificial first-tier fill material may include amorphous silicon or a carbon-containing material (such as amorphous carbon or diamond-like carbon) that may be subsequently removed by ashing, or a silicon-based polymer that may be subsequently removed selective to the materials of the first-tier alternating stack (132, 142).

Portions of the deposited sacrificial material may be removed from above the topmost layer of the first-tier alternating stack (132, 142), such as from above the inter-tier dielectric layer 180. For example, the sacrificial first-tier fill material may be recessed to a top surface of the inter-tier dielectric layer 180 using a planarization process. The planarization process may include a recess etch, chemical mechanical planarization (CMP), or a combination thereof. The top surface of the inter-tier dielectric layer 180 may be used as an etch stop layer or a planarization stop layer.

Remaining portions of the sacrificial first-tier fill material comprise sacrificial first-tier opening fill portions (148, 128, 178). Specifically, each remaining portion of the sacrificial material in a first-tier memory opening 149 constitutes a sacrificial first-tier memory opening fill portion 148. Each remaining portion of the sacrificial material in a first-tier support opening 129 constitutes a sacrificial first-tier support opening fill portion 128. Each remaining portion of the sacrificial material in a first-tier moat trench 179 constitutes a sacrificial moat trench fill structure 178. The various sacrificial first-tier opening fill portions (148, 128, 178) are concurrently formed, i.e., during a same set of processes including the deposition process that deposits the sacrificial first-tier fill material and the planarization process that removes the first-tier deposition process from above the first-tier alternating stack (132, 142) (such as from above the top surface of the inter-tier dielectric layer 180). The top surfaces of the sacrificial first-tier opening fill portions (148, 128, 178) may be coplanar with the top surface of the inter-tier dielectric layer 180. Each of the sacrificial first-tier opening fill portions (148, 128, 178) may, or may not, include cavities therein.

Figure 6A:
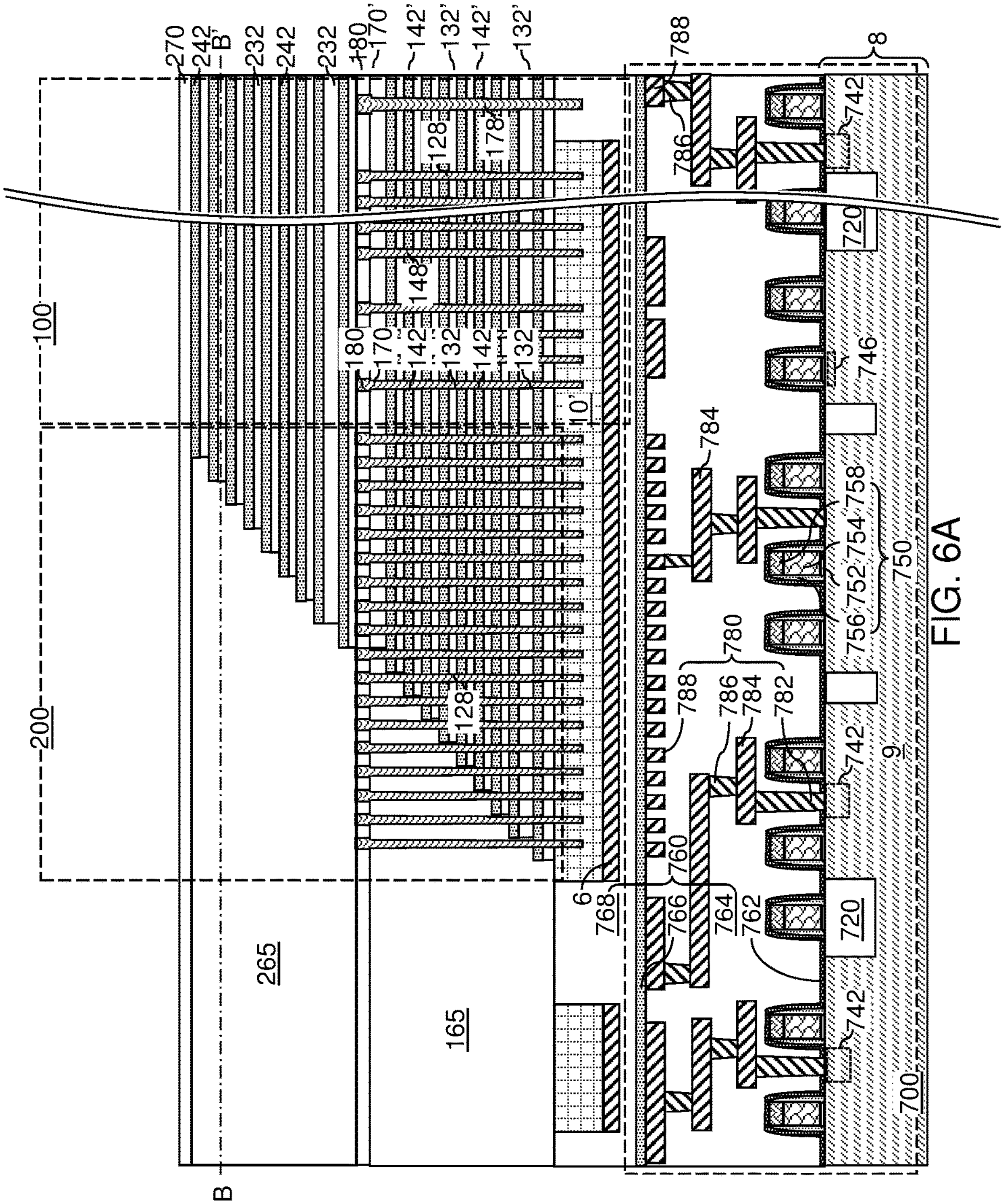
FIG. 6A is a vertical cross-sectional view of the exemplary structure after formation of a second-tier alternating stack of second insulating layers and second spacer material layers, second stepped surfaces, and a second retro-stepped dielectric material portion according to an embodiment of the present disclosure.
Figure 6B:
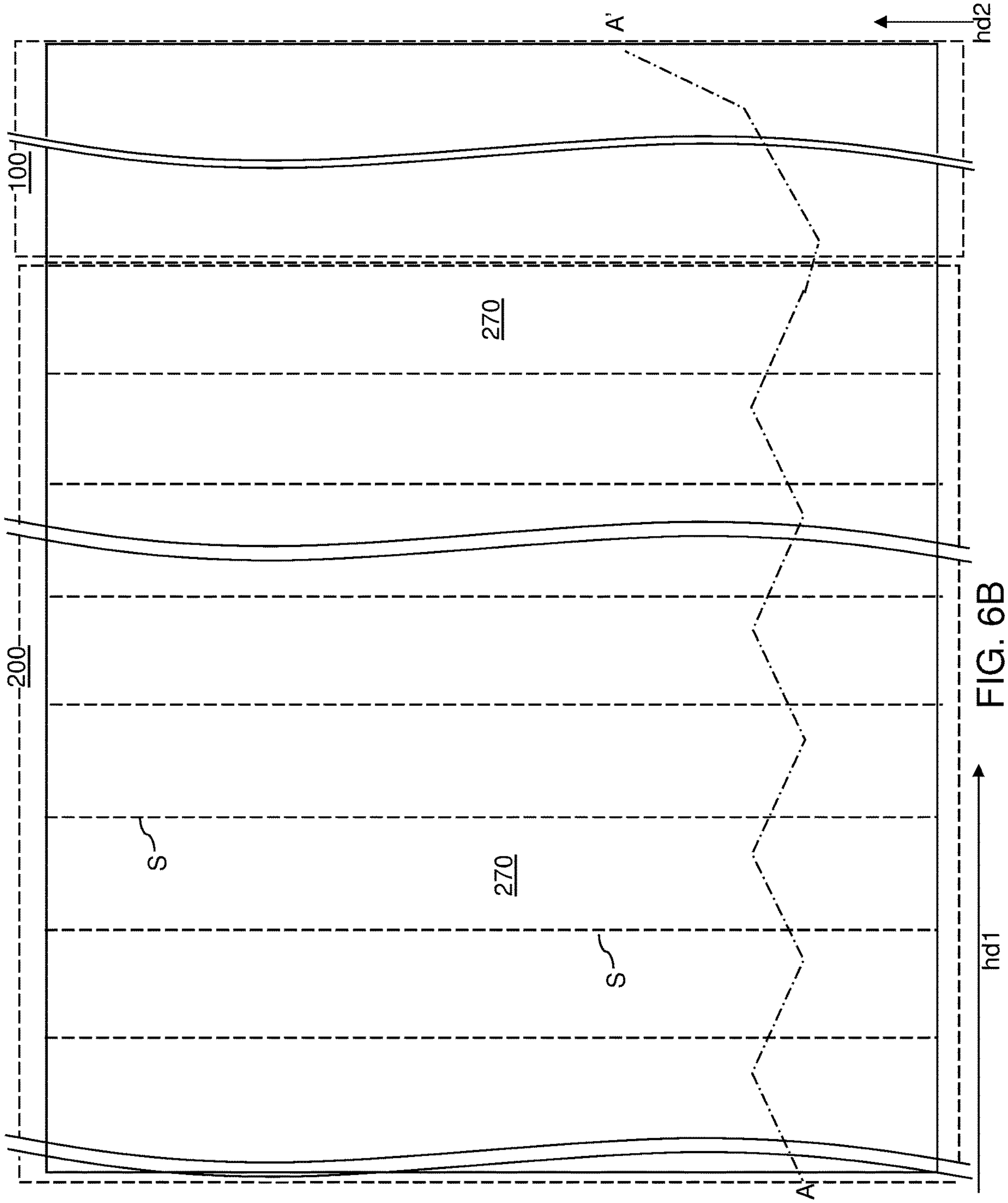
FIG. 6B is a top-down view of the exemplary structure of FIG. 6A. The hinged vertical plane A-A' corresponds to the plane of the vertical cross-sectional view of FIG. 6A.

Referring to FIGS. 6A and 6B, a second-tier structure may be formed over the first-tier structure (132, 142, 170, 148). The second-tier structure may include an additional alternating stack of insulating layers and spacer material layers, which may be sacrificial material layers. For example, a second-tier alternating stack (232, 242) of material layers may be subsequently formed on the top surface of the first-tier alternating stack (132, 142). The second-tier alternating stack (232, 242) includes an alternating plurality of third material layers and fourth material layers. Each third material layer may include a third material, and each fourth material layer may include a fourth material that is different from the third material. In one embodiment, the third material may be the same as the first material of the first insulating layer 132, and the fourth material may be the same as the second material of the first sacrificial material layers 142.

In one embodiment, the third material layers may be second insulating layers 232 and the fourth material layers may be second spacer material layers that provide vertical spacing between each vertically neighboring pair of the second insulating layers 232. In one embodiment, the third material layers and the fourth material layers may be second insulating layers 232 and second sacrificial material layers 242, respectively. The third material of the second insulating layers 232 may be at least one insulating material. The fourth material of the second sacrificial material layers 242 may be a sacrificial material that may be removed selective to the third material of the second insulating layers 232. According to an aspect of the present disclosure, the second sacrificial material layers 242 include a dielectric material, which may be the same material as the dielectric material of the first sacrificial material layers 142. The fourth material of the second sacrificial material layers 242 may be subsequently replaced with electrically conductive electrodes which may function, for example, as control gate electrodes of a vertical NAND device.

In one embodiment, each second insulating layer 232 may include a second insulating material, and each second sacrificial material layer 242 may include a second sacrificial material. In this case, the second-tier alternating stack (232, 242) may include an alternating plurality of second insulating layers 232 and second sacrificial material layers 242. The third material of the second insulating layers 232 may be deposited, for example, by chemical vapor deposition (CVD). The fourth material of the second sacrificial material layers 242 may be formed, for example, CVD or atomic layer deposition (ALD).

The third material of the second insulating layers 232 may be at least one insulating material. Insulating materials that may be used for the second insulating layers 232 may be any material that may be used for the first insulating layers 132. The fourth material of the second sacrificial material layers 242 is a sacrificial material that may be removed selective to the third material of the second insulating layers 232. Sacrificial materials that may be used for the second sacrificial material layers 242 may be any material that may be used for the first sacrificial material layers 142. In one embodiment, the second insulating material may be the same as the first insulating material, and the second sacrificial material may be the same as the first sacrificial material. In one embodiment, the first insulating layers 132 and the second insulating layers 232 can include silicon oxide, and the first sacrificial material layers 142 and the second sacrificial material layers 242 can include silicon nitride.

The thicknesses of the second insulating layers 232 and the second sacrificial material layers 242 may be in a range from 20 nm to 50 nm, although lesser and greater thicknesses may be used for each second insulating layer 232 and for each second sacrificial material layer 242. The number of repetitions of the pairs of a second insulating layer 232 and a second sacrificial material layer 242 may be in a range from 2 to 1,024, and typically from 8 to 256, although a greater number of repetitions may also be used. In one embodiment, each second sacrificial material layer 242 in the second-tier alternating stack (232, 242) may have a uniform thickness that is substantially invariant within each respective second sacrificial material layer 242.

Second stepped surfaces in the second stepped area may be formed in the staircase region 200 using a same set of processing steps as the processing steps used to form the first stepped surfaces in the first stepped area with suitable adjustment to the pattern of at least one masking layer. A second retro-stepped dielectric material portion 265 may be formed over the second stepped surfaces in the staircase region 200.

A second insulating cap layer 270 may be subsequently formed over the second-tier alternating stack (232, 242). The second insulating cap layer 270 includes a dielectric material that is different from the material of the second sacrificial material layers 242. In one embodiment, the second insulating cap layer 270 may include silicon oxide. In one embodiment, the first and second sacrificial material layers (142, 242) may comprise silicon nitride.

Generally speaking, at least one alternating stack of insulating layers (132, 232) and spacer material layers (such as sacrificial material layers (142, 242)) may be formed over the in-process source-level material layers 10', and at least one retro-stepped dielectric material portion (165, 265) may be formed over the staircase regions on the at least one alternating stack (132, 142, 232, 242).

Referring to FIGS. 7A-7D, various second-tier openings (249, 229, 269, 279) may be formed through the second-tier structure (232, 242, 265, 270). A photoresist layer (not shown) may be applied over the second insulating cap layer 270, and may be lithographically patterned to form various openings therethrough. The pattern of the openings in the photoresist layer can include the pattern of the first-tier memory openings 149 and the pattern of the first-tier support openings 129. Further, the pattern of the openings in the photoresist layer can include an array of discrete openings located within the rectangular frame area of a respective underlying sacrificial moat trench fill structure 178. In addition, the pattern of the openings in the photoresist layer can include patterns of rectangular frames that are nested within the area of a respective one of the sacrificial moat trench fill structures 178. In other word, each opening having a shape of a rectangular frame can be nested inside the area of a respective one of the sacrificial moat trench fill structures 178.

The pattern of openings in the photoresist layer may be transferred through the second-tier structure (232, 242, 265, 270) by a second anisotropic etch process to form various second-tier openings (249, 229, 269, 279) concurrently, i.e., during the second anisotropic etch process. The various second-tier openings (249, 229, 269, 279) may include second-tier memory openings 249, second-tier support openings 229, pillar cavities 269, and second-tier moat trenches 279.

The second-tier memory openings 249 may be formed directly on a top surface of a respective one of the sacrificial first-tier memory opening fill portions 148. The second-tier support openings 229 may be formed directly on a top surface of a respective one of the sacrificial first-tier support opening fill portions 128. The pillar cavities 269 may be formed directly on a top surface of a respective one of the sacrificial first-tier moat trench fill portions 178. A plurality of discrete pillar cavities 269 having a cylindrical or rectangular horizontal cross sectional shape can be formed on a top surface of each sacrificial first-tier moat trench fill portions 178. The second-tier moat trenches 279 may be formed inside the top periphery of inner sidewalls of a respective underlying sacrificial first-tier moat trench fill portion 178. A subset of the second-tier support openings 229 may be formed through a horizontal surface within the second stepped surfaces, which include the interfacial surfaces between the second-tier alternating stack (232, 242) and the second retro-stepped dielectric material portion 265. Locations of steps S in the first-tier alternating stack (132, 142) and the second-tier alternating stack (232, 242) are illustrated as dotted lines in FIG. 7B.

A subset of the second-tier support openings 229 may be formed in sections of the memory array region 100 that are not filled with the second-tier memory openings 249. The sections of the memory array region 100 that are not filled with the second-tier memory openings 249 may be distributed over multiple areas within the memory array region 100. The second-tier support openings 229 may include a first subset of second-tier support openings 229 that are formed in the staircase region 200, and a second subset of second-tier support openings 229 that may be formed between groups 439 of clusters 419 of second-tier memory openings 249 which are laterally spaced apart along the first horizontal direction hd1 in the memory array region 100. A first subset of the second-tier support openings 229 that is formed through the second retro-stepped dielectric material portion 265 may be formed through a respective horizontal surface of the second stepped surfaces.

The second subset of the second-tier support openings 229 may be formed between groups 439 of clusters 419 of second-tier memory openings 249 that are laterally spaced apart along the first horizontal direction hd1. In one embodiment, some of the second-tier support openings 229 within the second subset of the second-tier support openings 229 may be arranged in straight rows that extend along the first direction hd1. Additional second-tier support openings 229 may be provided outside the straight rows of the second-tier support openings 229.

Generally, a unit pattern UP of a combination of second-tier memory openings 249, second-tier support openings 229, pillar cavities 269, and a second-tier moat trench 279 may be repeated along the second horizontal direction hd2. Each unit pattern UP includes groups 439 of clusters 419 of first-tier memory openings 149 that are laterally spaced apart along the second horizontal direction hd2 and/or laterally spaced apart along the first horizontal direction hd1.

The second anisotropic etch process may include an etch step in which the materials of the second-tier alternating stack (232, 242) are etched concurrently with the material of the second retro-stepped dielectric material portion 265. The chemistry of the etch step may alternate to optimize etching of the materials in the second-tier alternating stack (232, 242) while providing a comparable average etch rate to the material of the second retro-stepped dielectric material portion 265. The second anisotropic etch process may use, for example, a series of reactive ion etch processes or a single reaction etch process (e.g., $CF_4/O_2/Ar$ etch). The sidewalls of the various second-tier openings (249, 229, 269, 279) may be substantially vertical, or may be tapered. A bottom periphery of each second-tier opening (249, 229, 269, 279) may be laterally offset, and/or may be located entirely within, a periphery of a top surface of an underlying sacrificial first-tier opening fill portion (148, 128, 178). The photoresist layer may be subsequently removed, for example, by ashing.

Generally, a plurality of pillar cavities 269 can be formed over, and directly on, each sacrificial moat trench fill structure 178 through the second-tier alternating stack (232, 242). Each second-tier moat cavity 279 can be formed through the second-tier alternating stack (232, 242). Each second-tier moat cavity 279 overlies, and may contact, a first vertically alternating sequence of first insulating plates 132' and first dielectric material plates 142' (which includes patterned portions of the first-tier alternating stack (132, 142) and is laterally surrounded by a sacrificial moat trench fill structure 178). A bottom periphery of outer sidewalls of each second-tier moat cavity 279 can be laterally recessed inward with respective to a top periphery of inner sidewalls of a respective underlying sacrificial moat trench fill structure 178.

The second sacrificial material layers 242 comprise a second dielectric material such as silicon nitride. In one embodiment, the second sacrificial material layers 242 include the same dielectric material as the first sacrificial material layers 142. Patterned portions of the second insulating layers 232 laterally surrounded by a second-tier moat trench 279 comprise second insulating plates 232'. Patterned portions of the second sacrificial material layers 242 laterally surrounded by a second-tier moat trench 279 comprise second dielectric material plates 242'. A patterned portion of the second insulating cap layer 270 laterally surrounded by a second-tier moat trench 279 comprises a second insulating cap plate. Patterned portions of the second insulating layers 232 and the second sacrificial material layers 242 within each second-tier moat trench 279 comprise a second vertically alternating sequence of second insulating plates 232' and second dielectric material plates 242'.

In one embodiment, each second-tier moat trench 279 can have a horizontal cross-sectional shape of a rectangular frame. In this case, the outer sidewalls of each second-tier moat trench 279 can include a pair of lengthwise sidewalls that laterally extend along the first horizontal direction hd1 and a pair of widthwise sidewalls that laterally extend along the second horizontal direction hd2. The inner sidewalls of each second-tier moat trench 279 can include a pair of lengthwise sidewalls that laterally extend along the first horizontal direction hd1 and a pair of widthwise sidewalls that laterally extend along the second horizontal direction hd2. Each second-tier moat cavity 279 laterally surrounds a second vertically alternating sequence of second insulating plates 232' and second dielectric material plates 242', and overlies a first vertically alternating sequence of first insulating plates 132' and first dielectric material plates 142'. Sidewalls of the second insulating plates 232' and the second dielectric material plates 242' within a second vertically alternating sequence (232', 242') can be laterally offset inward with respect to sidewalls of the first insulating layers 132' and the first dielectric material plates 142' within an underlying first vertically alternating sequence (132', 142'). The bottom periphery of outer sidewalls of a second-tier moat trench 279 can be laterally recessed inward relative to a top periphery of inner sidewalls of an underlying sacrificial moat trench fill structure 178.

Each of the second insulating plates 232' can be vertically spaced from the top surface of the in-process source-level material layers 10' by a same vertical distance as a respective second insulating layer 232 in the second-tier alternating stack is from the top surface of the in-process source-level material layers 10'. Each of the second dielectric material plates 242' can be vertically spaced from the top surface of the in-process source-level material layers 10' by a same vertical distance as a respective second sacrificial material layer 242 in the second-tier alternating stack is from the top surface of the in-process source-level material layers 10'.

Referring to FIGS. 8A-8D, the sacrificial first-tier fill material of the sacrificial first-tier opening fill portions (148,

128, 178) may be removed using an etch process that etches the sacrificial first-tier fill material selective to the materials of the first and second insulating layers (132, 232), the first and second sacrificial material layers (142, 242), the first and second insulating cap layers (170, 270), and the inter-tier dielectric layer 180. A memory opening 49, which is also referred to as an inter-tier memory opening 49, is formed in each combination of a second-tier memory openings 249 and a volume from which a sacrificial first-tier memory opening fill portion 148 is removed. A support opening 19, which is also referred to as an inter-tier support opening 19, may be formed in each combination of a second-tier support openings 229 and a volume from which a sacrificial first-tier support opening fill portion 128 is removed. A continuous cavity including volumes of a first-tier moat trench 179 and a plurality of pillar cavities 269 can be formed by removing a sacrificial moat trench fill structure 178 through the plurality of pillar cavities 269 within each unit pattern UP. The sacrificial moat trench fill structures 178 can be removed selective to the first-tier alternating stack (132, 142) and the first vertically alternating sequences of first insulating plates 132' and first dielectric material plates 142' by introducing an isotropic etchant through the plurality of pillar cavities 269.

Figure 9A:
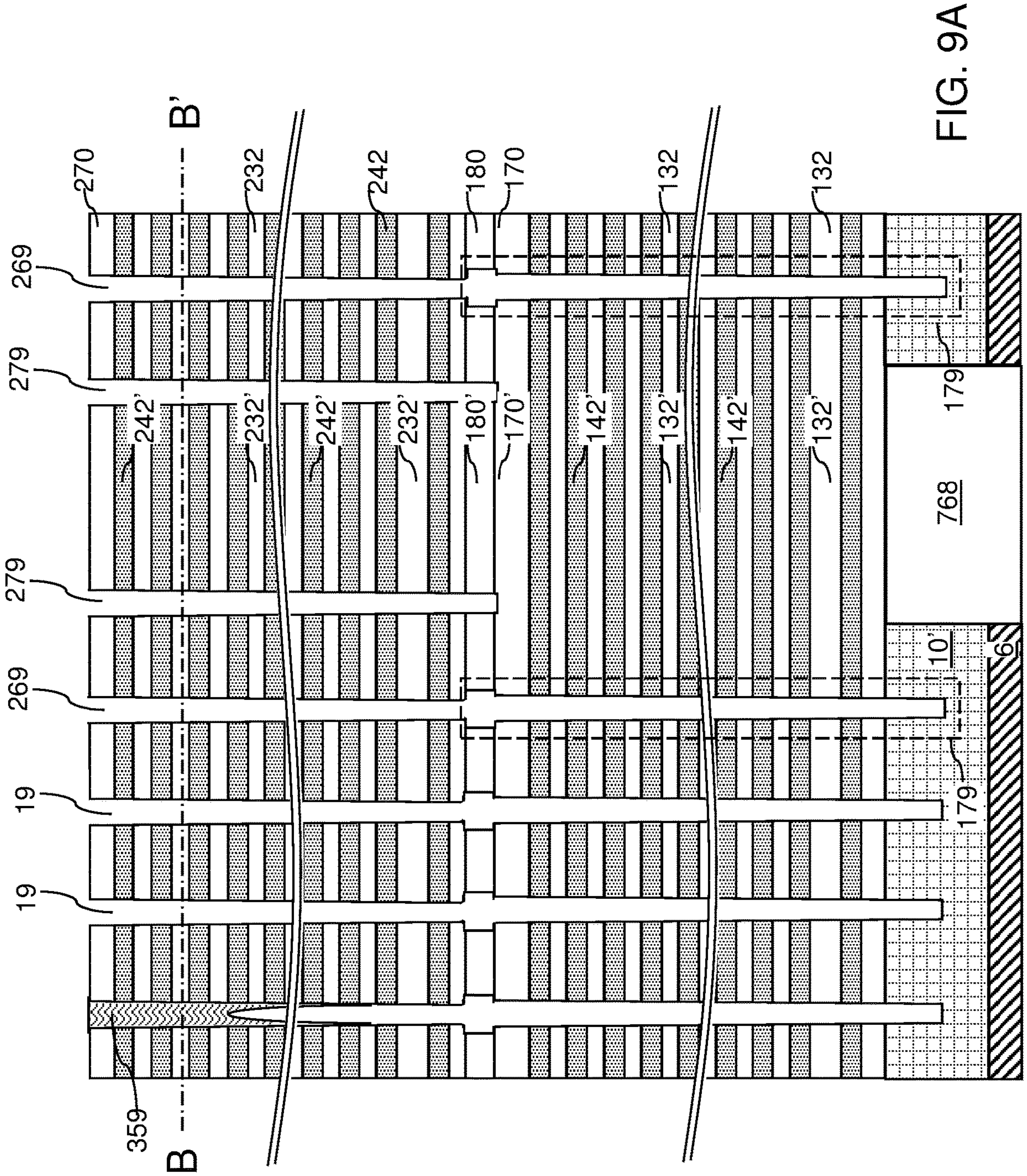
FIG. 9A is a vertical cross-sectional view of a region of the exemplary structure after formation of sacrificial memory opening fill material portions according to an embodiment of the present disclosure.
Figure 9B:
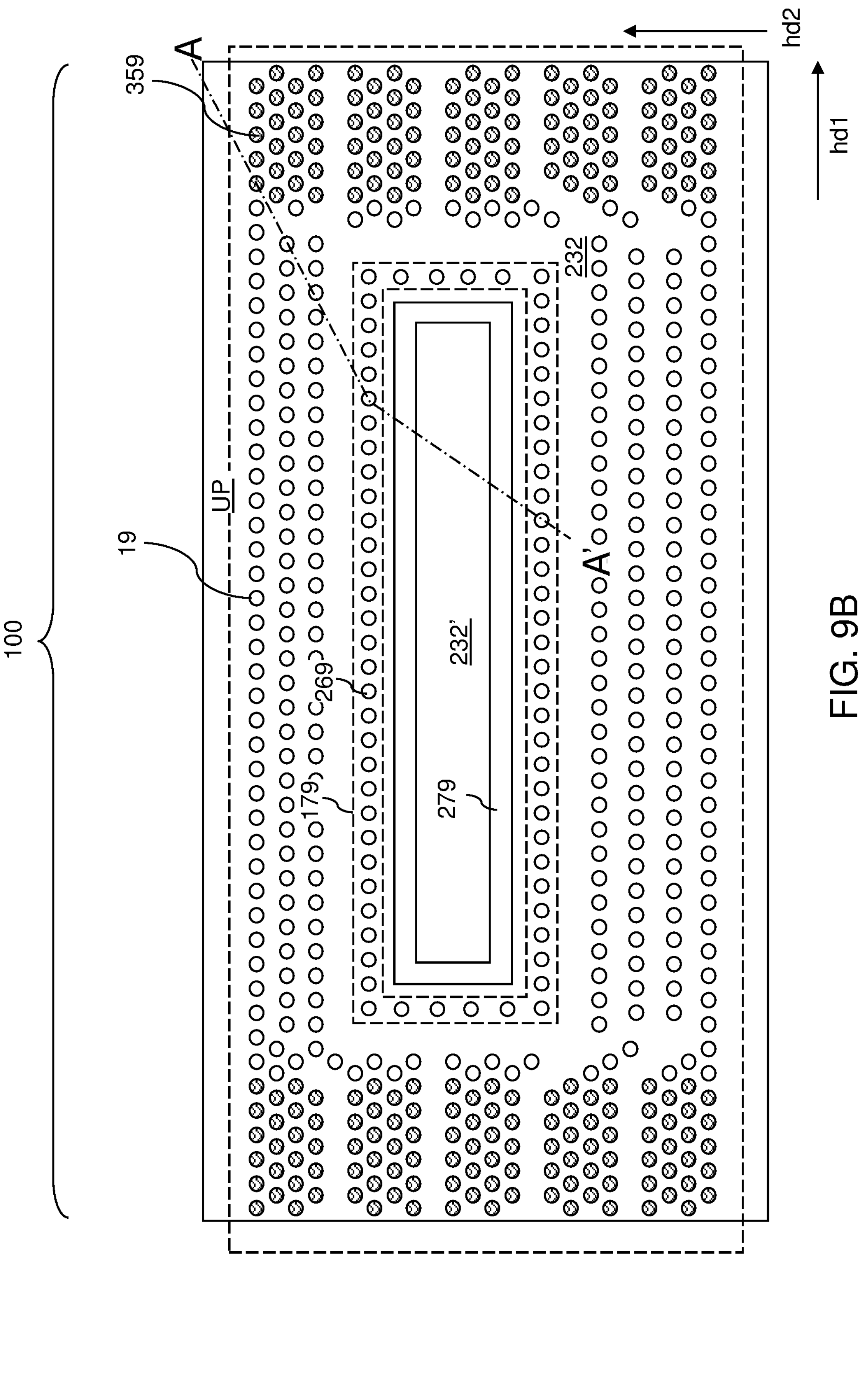
FIG. 9B is a horizontal cross-sectional view of the exemplary structure along the plane B-B' of FIG. 9A.

Referring to FIGS. 9A and 9B, a sacrificial fill material can be deposited into the various openings (49, 19, 179, 269, 279). The sacrificial fill material includes a material that can be subsequently removed selective to the materials of the first-tier alternating stack (132, 142) and the second-tier alternating stack (232, 242). In one embodiment, the sacrificial fill material can include amorphous carbon, diamond-like carbon (DLC), a polymer material, germanium, or a silicon-germanium alloy. In one embodiment, the sacrificial fill material may be anisotropically deposited to form voids at lower portions of each opening through the second-tier alternating stack (232, 242) and the first-tier alternating stack (132, 142). Excess portions of the sacrificial fill material can be removed from above the horizontal plane including the top surface of the second insulating cap layer 270 by a planarization process such as a chemical mechanical planarization process. Each remaining portion of the sacrificial fill material in the memory openings 49 constitute a sacrificial memory opening fill material portion 359.

A photoresist layer (not shown) can be applied over the exemplary structure, and can be lithographically patterned to cover each of the sacrificial memory opening fill material portion 359 located within the memory openings 49 without covering the support openings 19, the pillar cavities 269, or the second-tier moat trenches 279. An etch process can be performed to remove unmasked portions of the sacrificial fill material from inside the support openings 19, the pillar cavities 269, the first-tier moat trenches 179, and the second-tier moat trenches 279 selective to the materials of the first-tier alternating stack (132, 142) and the second-tier alternating stack (232, 242). The etchant can be provided into the volumes of the first-tier moat trenches 179 through the pillar cavities 269 during the etch process. The etch process may include an isotropic etch process or an anisotropic etch process. Sacrificial fill material portions in the support openings 19, the pillar cavities 269, the first-tier moat trenches 179, and the second-tier moat trenches 279 are removed by the etch process. The photoresist layer can be subsequently removed, for example, by ashing or by dissolving in an organic solvent.

Figure 10A:
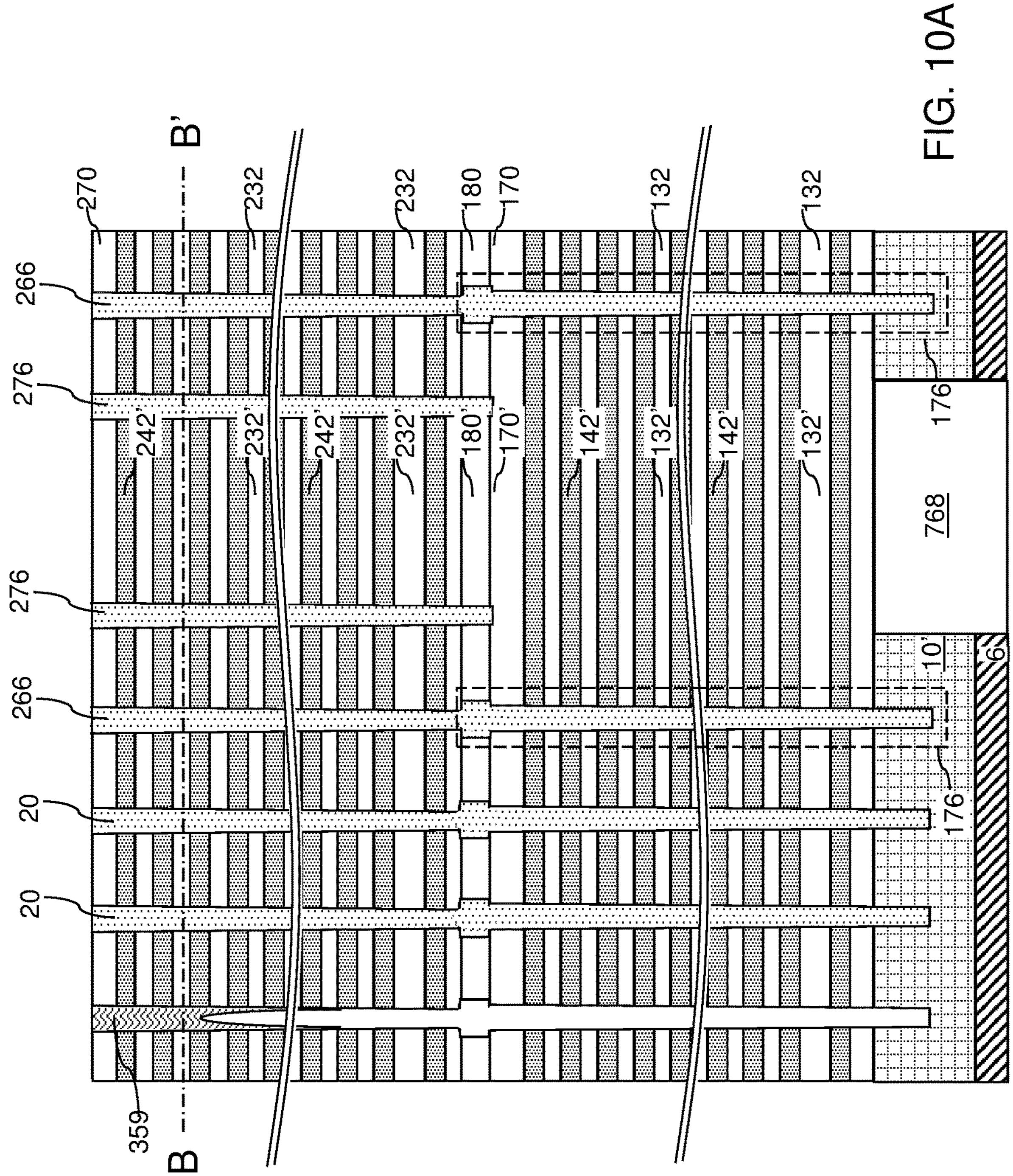
FIG. 10A is a vertical cross-sectional view of a region of the exemplary structure after formation of dielectric fill material portions according to an embodiment of the present disclosure.
Figure 10B:
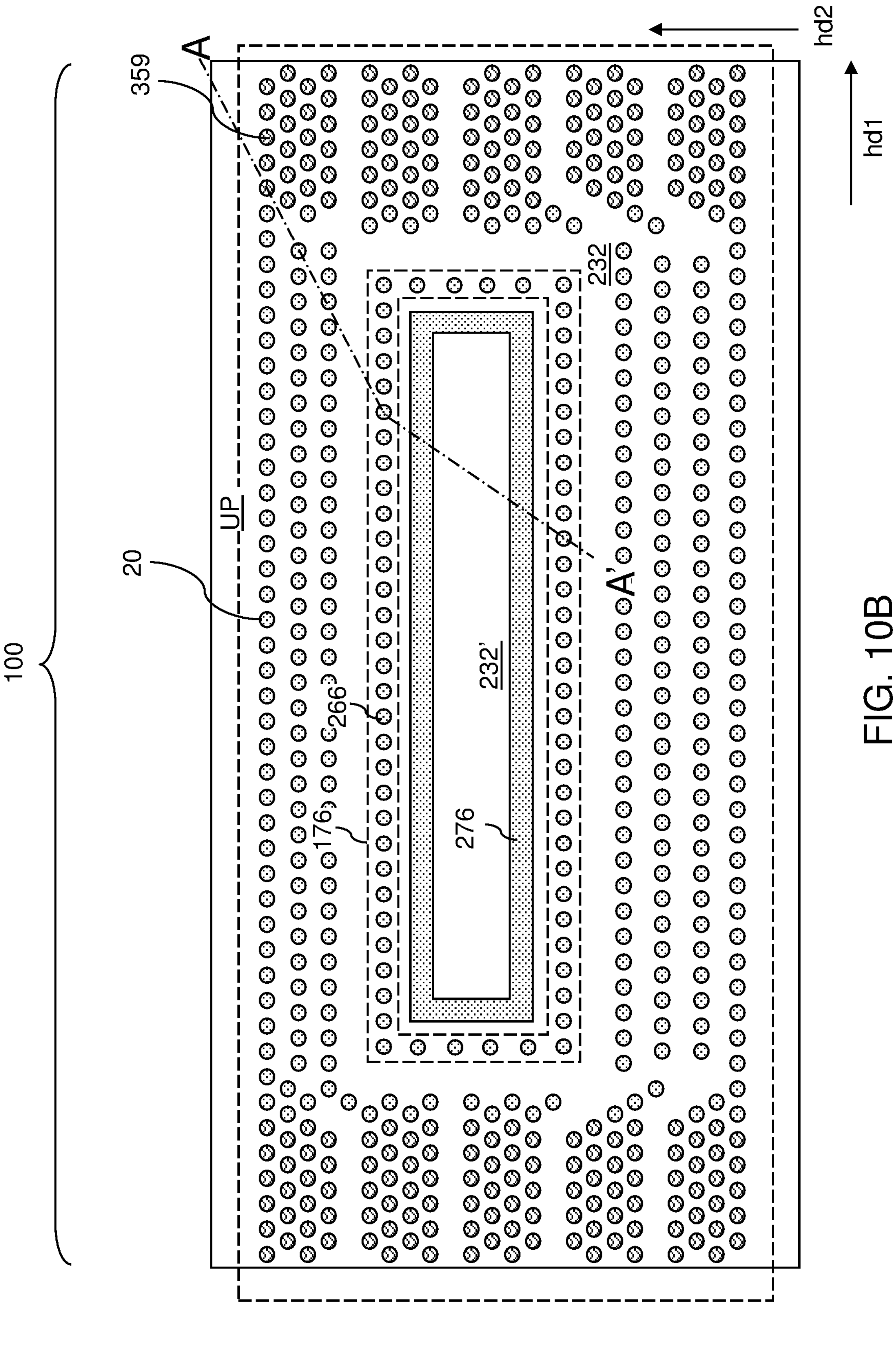
FIG. 10B is a horizontal cross-sectional view of the exemplary structure along the plane B-B' of FIG. 10A.

Referring to FIGS. 10A and 10B, a dielectric fill material such as silicon oxide can be conformally deposited in the support openings 19, the pillar cavities 269, the first-tier moat trenches 179, and the second-tier moat trenches 279. For example, a low pressure chemical vapor deposition process can be performed to deposit the dielectric fill material in each of the support openings 19, the pillar cavities 269, the first-tier moat trenches 179, and the second-tier moat trenches 279. Excess portions of the dielectric fill material overlying the top surface of the second insulating cap layer 270 can be removed by a planarization process such as a recess etch process and/or a chemical mechanical planarization process.

Each portion of the dielectric fill material filling a support opening 19 constitutes a support pillar structure 20. Each portion of the dielectric fill material filling a first-tier moat trench 179 constitutes a first dielectric moat structure 176. Each portion of the dielectric fill material filling a pillar cavity 269 constitutes a dielectric pillar structure 266. Each portion of the dielectric fill material filling a second-tier moat trench 279 constitutes a second dielectric moat structure 276. A combination of a first dielectric moat structure 176 and a plurality of dielectric pillar structures 266 can be formed within each continuously extending volume that includes a first-tier moat trench 179 and a plurality of pillar cavities 169. Each first dielectric moat structure 176 fills a volume of a first-tier moat trench 179, which is the volume formed by removing a sacrificial moat trench fill structure. The plurality of dielectric pillar structures 266 fill the plurality of pillar cavities 269. The support pillar structures 20, the first dielectric moat structures 176, the dielectric pillar structures 266, and the second dielectric moat structures 276 can include, and/or can consist essentially of, a same dielectric material such as a silicon oxide material (which can be, for example, undoped silicate glass or a doped silicate glass).

Within each unit pattern UP, a first dielectric moat structure 176 vertically extends through the first-tier alternating stack (132, 142) and laterally surrounds a respective first vertically alternating sequence of first insulating plates 132' and first dielectric material plates 142'. A plurality of dielectric pillar structures 266 vertically extend through the second-tier alternating stack (232, 242) and contact a top surface of the first dielectric moat structure 176. In one embodiment, a combination of the first dielectric moat structure 176 and the plurality of dielectric pillar structures 266 consists of a single continuously-extending dielectric material portion having a uniform material composition throughout.

Within each unit pattern UP, a second dielectric moat structure 276 vertically extends through the second-tier alternating stack (232, 242) and laterally surrounds a second vertically alternating sequence of second insulating plates 232' and second dielectric material plates 242', and overlies the first vertically alternating sequence of first insulating plates 132' and first dielectric material plates 142'. In one embodiment, a bottom periphery of outer sidewalls of the second dielectric moat structure 276 is laterally recessed inward relative to a top periphery of inner sidewalls of the first dielectric moat structure 176. Outer sidewalls of the first dielectric moat structure 176 contact the first insulating layers 132 and the first sacrificial material layers 142 of the first-tier alternating stack (132, 142), while outer sidewalls of the second dielectric moat structure 276 contact the second insulating layers 232 and the second sacrificial material layers 242 of the second-tier alternating stack (232, 242). A bottom surface of the second dielectric moat structure 276 can be located above, or at, a horizontal plane including a topmost surface of the first-tier alternating stack (132, 142), or extends into the first-tier alternating stack (132, 142) and is located above at least one layer within the first-tier alternating stack (132, 142). The total number of layers within the first-tier alternating stack (132, 142) through which the second dielectric moat structure 276 vertically extends may be zero, or may be in a range from 1 to 10, such as from 1 to 4, and is less than 10% of the total number of layers within the first-tier alternating stack (132, 142).

Figure 11A:
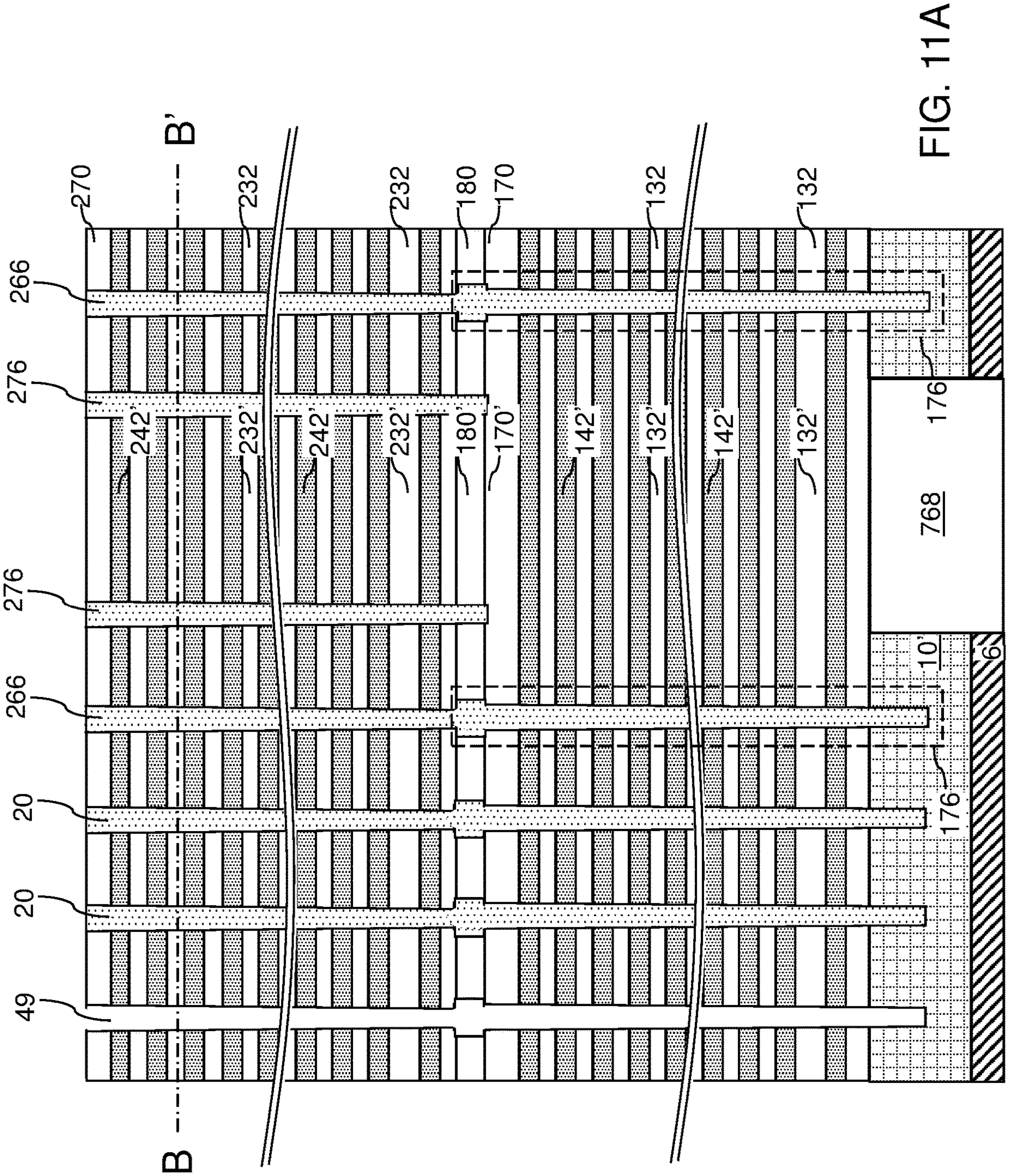
FIG. 11A is a vertical cross-sectional view of a region of the exemplary structure after removal of the sacrificial memory opening fill material portions according to an embodiment of the present disclosure.
Figure 11B:
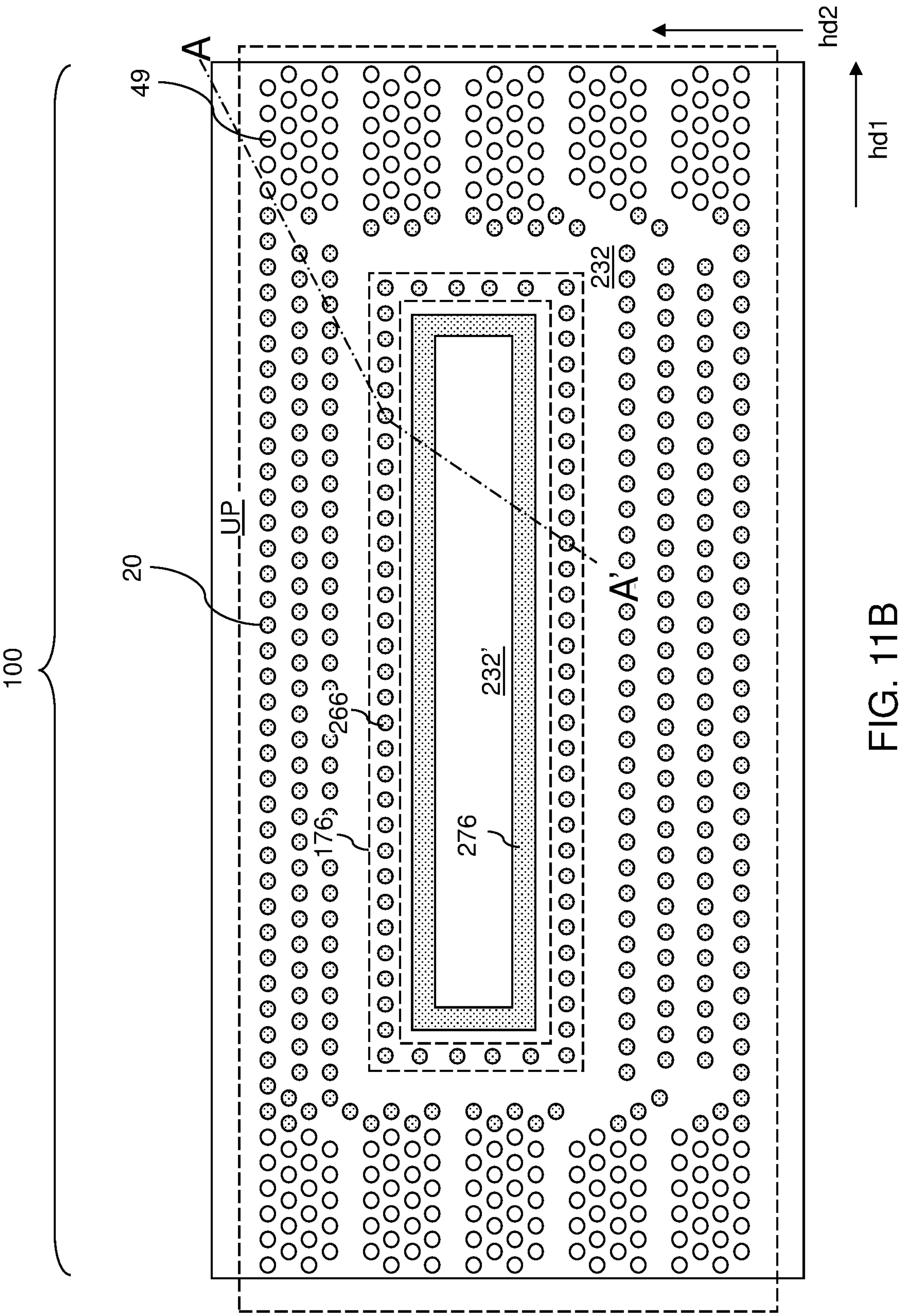
FIG. 11B is a horizontal cross-sectional view of the exemplary structure along the plane B-B' of FIG. 11A.
Figure 12B:
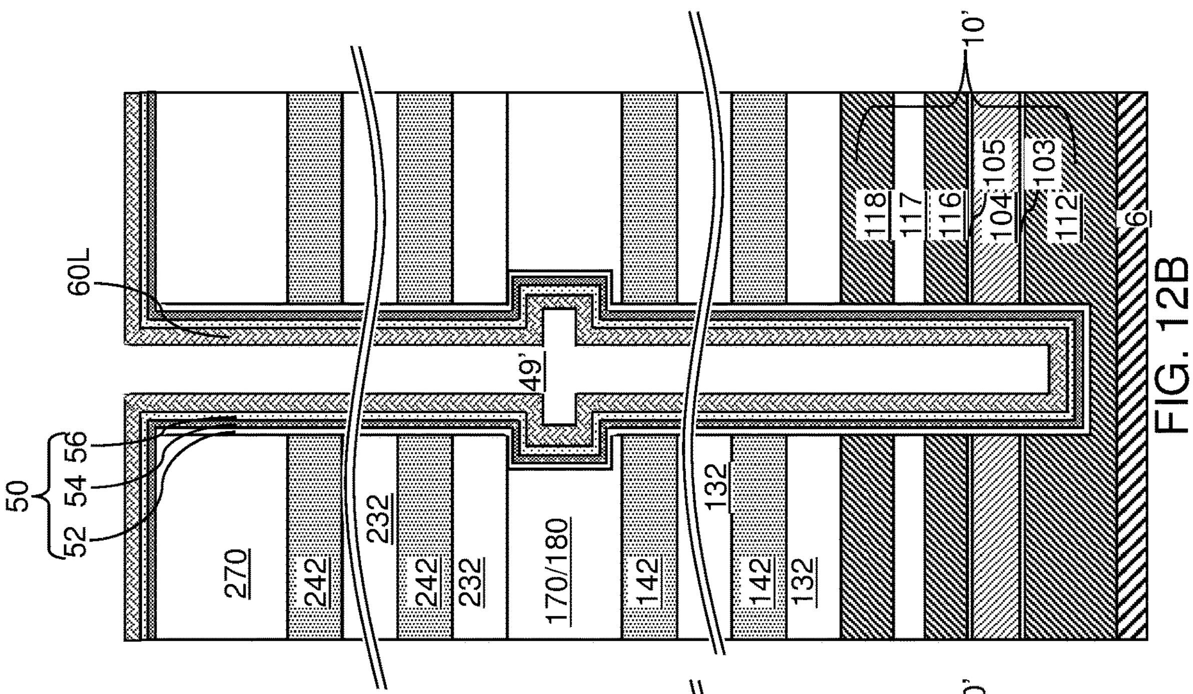
FIGS. 12A-12D illustrate sequential vertical cross-sectional views of a memory opening during formation of a memory opening fill structure according to an embodiment of the present disclosure.
Figure 12A:
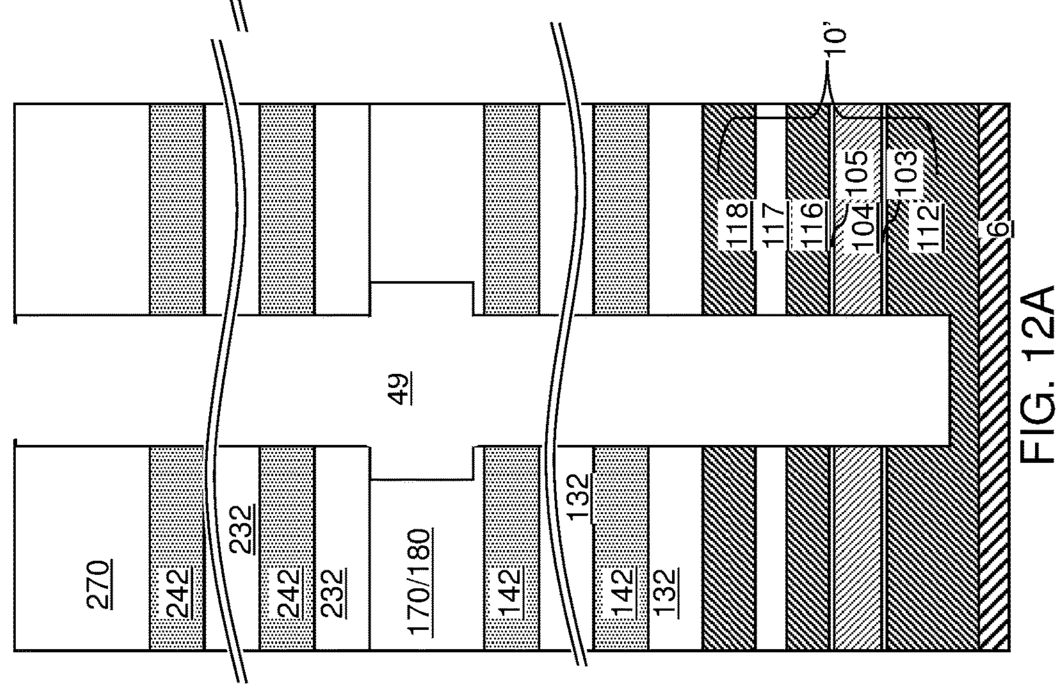

Referring to FIGS. 11A, 11B, and 12A, the sacrificial memory opening fill material portions 359 can be removed selective to the materials of the first-tier alternating stack (132, 142), the second-tier alternating stack (232, 242), and the various dielectric fill material portions (20, 266, 176, 276). For example, if the sacrificial memory opening fill material portions 359 include a carbon-based material, the sacrificial memory opening fill material portions 359 can be removed by ashing. If the sacrificial memory opening fill material portions 359 include a silicon-germanium alloy or germanium, a wet etch employing a mixture of ammonium hydroxide and hydrogen peroxide can be performed to remove the sacrificial memory opening fill material portions 359. The memory openings 49 become empty after this step.

Referring to FIG. 12B, a blocking dielectric layer 52, a charge storage layer 54, a tunneling dielectric layer 56, and a semiconductor channel material layer 60L can be sequentially deposited in each memory opening 49. The blocking dielectric layer 52 can be conformally deposited by a conformal deposition process (such as a low pressure chemical vapor deposition process), and may include a single dielectric material layer or a stack of a plurality of dielectric material layers. In one embodiment, the blocking dielectric layer 52 may include a dielectric metal oxide layer consisting essentially of a dielectric metal oxide. As used herein, a dielectric metal oxide refers to a dielectric material that includes at least one metallic element and at least oxygen. The dielectric metal oxide may consist essentially of the at least one metallic element and oxygen, or may consist essentially of the at least one metallic element, oxygen, and at least one non-metallic element such as nitrogen. In one embodiment, the blocking dielectric layer 52 may include a dielectric metal oxide having a dielectric constant greater than 7.9, i.e., having a dielectric constant greater than the dielectric constant of silicon nitride. The thickness of the dielectric metal oxide layer may be in a range from 1 nm to 20 nm, although lesser and greater thicknesses may also be used. The dielectric metal oxide layer may subsequently function as a dielectric material portion that blocks leakage of stored electrical charges to control gate electrodes. In one embodiment, the blocking dielectric layer 52 includes aluminum oxide. Alternatively, or additionally, the blocking dielectric layer 52 may include a dielectric semiconductor compound such as silicon oxide, silicon oxynitride, silicon nitride, or a combination thereof.

The charge storage layer 54 can be conformally deposited over the blocking dielectric layer 52. In one embodiment, the charge storage layer 54 may be a continuous layer or patterned discrete portions of a charge trapping material including a dielectric charge trapping material, which may be, for example, silicon nitride. Alternatively, the charge storage layer 54 may include a continuous layer or patterned discrete portions of a conductive material such as doped polysilicon or a metallic material that is patterned into multiple electrically isolated portions (e.g., floating gates), for example, by being formed within lateral recesses into sacrificial material layers (142, 242). In one embodiment, the charge storage layer 54 includes a silicon nitride layer. In one embodiment, the sacrificial material layers (142, 242) and the insulating layers (132, 232) may have vertically coincident sidewalls, and the charge storage layer 54 may be formed as a single continuous layer. Alternatively, the sacrificial material layers (142, 242) may be laterally recessed with respect to the sidewalls of the insulating layers (132, 232), and a combination of a deposition process and an anisotropic etch process may be used to form the charge storage layer 54 as a plurality of memory material portions that are vertically spaced apart. The thickness of the charge storage layer 54 may be in a range from 2 nm to 20 nm, although lesser and greater thicknesses may also be used.

A tunneling dielectric layer 56 can be formed over the charge storage layer 54. The tunneling dielectric layer 56 includes a dielectric material through which charge tunneling may be performed under suitable electrical bias conditions. The charge tunneling may be performed through hot-carrier injection or by Fowler-Nordheim tunneling induced charge transfer depending on the mode of operation of the monolithic three-dimensional NAND string memory device to be formed. The tunneling dielectric layer 56 may include silicon oxide, silicon nitride, silicon oxynitride, dielectric metal oxides (such as aluminum oxide and hafnium oxide), dielectric metal oxynitride, dielectric metal silicates, alloys thereof, and/or combinations thereof. In one embodiment, the tunneling dielectric layer 56 may include a stack of a first silicon oxide layer, a silicon oxynitride layer, and a second silicon oxide layer, which is commonly known as an ONO stack. In one embodiment, the tunneling dielectric layer 56 may include a silicon oxide layer that is substantially free of carbon or a silicon oxynitride layer that is substantially free of carbon. The thickness of the tunneling dielectric layer 56 may be in a range from 2 nm to 20 nm, although lesser and greater thicknesses may also be used. The stack of the blocking dielectric layer 52, the charge storage layer 54, and the tunneling dielectric layer 56 constitutes a memory film 50 that stores memory bits. The combination of the blocking dielectric layer 52, the charge storage layer 54, and the tunneling dielectric layer 56 constitutes a memory film 50.

A semiconductor channel material layer 60L can be formed over the tunneling dielectric layer 56. The semiconductor channel material layer 60L may include a doped semiconductor material such as at least one elemental semiconductor material, at least one III-V compound semiconductor material, at least one II-VI compound semiconductor material, at least one organic semiconductor material, or other semiconductor materials known in the art. The conductivity type of dopants in the semiconductor channel material layer 60L is herein referred to as a first conductivity type, which may be p-type or n-type. In one embodiment, the semiconductor channel material layer 60L has a p-type doping in which p-type dopants (such as boron atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. In one embodiment, the semiconductor channel material layer 60L includes, and/or consists essentially of, boron-doped amorphous silicon or boron-doped polysilicon. In another embodiment, the semiconductor channel material layer 60L has an n-type doping in which n-type dopants (such as phosphor atoms or arsenic atoms) are present at an atomic concentration in a range from $1.0\times10^{12}/cm^3$ to $1.0\times10^{18}/cm^3$, such as from $1.0\times10^{14}/cm^3$ to $1.0\times10^{17}/cm^3$. The semiconductor channel material layer 60L may be formed by a conformal deposition method such as low pressure chemical vapor deposition (LPCVD). The thickness of the semiconductor channel material layer 60L may be in a range from 2 nm to 10 nm, although lesser and greater thicknesses may also be used. A cavity 49' is formed in the volume of each memory opening 49 that is not filled with the deposited material layers (52, 54, 56, 60L). A memory cavity 49' can be present within each unfilled volume of the memory openings 49.

Figure 12D:
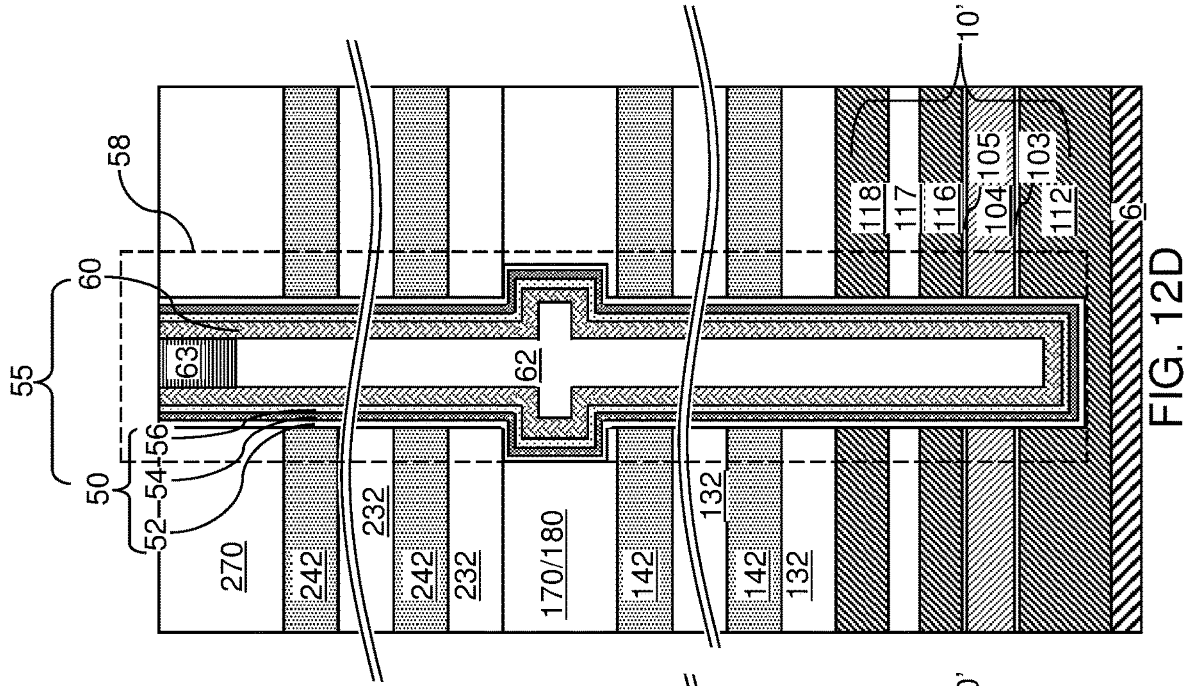
Figure 12C:
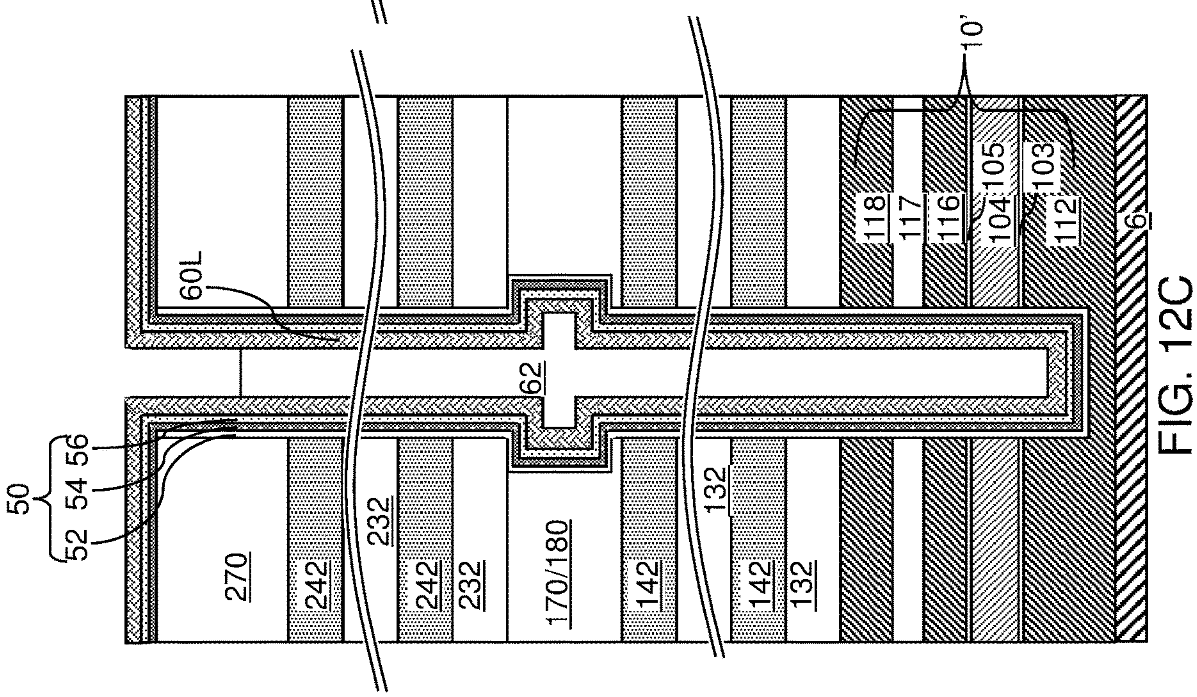

Referring to FIG. 12C, in embodiments in which the memory cavity 49' in each memory opening is not completely filled by the semiconductor channel material layer 60L, a dielectric core layer may be deposited in the memory cavity 49' to fill any remaining portion of the memory cavity 49' within each memory opening. The dielectric core layer includes a dielectric material such as silicon oxide or organo silicate glass. The dielectric core layer may be deposited by a conformal deposition method such as low pressure chemical vapor deposition (LPCVD), or by a self-planarizing deposition process such as spin coating. The horizontal portion of the dielectric core layer overlying the second insulating cap layer 270 may be removed, for example, by a recess etch. The recess etch continues until top surfaces of the remaining portions of the dielectric core layer are recessed to a height between the top surface of the second insulating cap layer 270 and the bottom surface of the second insulating cap layer 270. Each remaining portion of the dielectric core layer constitutes a dielectric core 62.

Referring to FIG. 12D, a doped semiconductor material may be deposited in cavities overlying the dielectric cores 62. The doped semiconductor material has a doping of the opposite conductivity type of the doping of the semiconductor channel material layer 60L. In one embodiment, the doped semiconductor material has an n-type doping. Portions of the deposited doped semiconductor material, the semiconductor channel material layer 60L, the tunneling dielectric layer 56, the charge storage layer 54, and the blocking dielectric layer 52 that overlie the horizontal plane including the top surface of the second insulating cap layer 270 may be removed by a planarization process such as a chemical mechanical planarization (CMP) process.

Each remaining portion of the doped semiconductor material—constitutes a drain region 63. The dopant concentration in the drain regions 63 may be in a range from $5.0\times10^{19}/cm^3$ to $2.0\times10^{21}/cm^3$, although lesser and greater dopant concentrations may also be used. The doped semiconductor material may be, for example, doped polysilicon.

Each remaining portion of the semiconductor channel material layer 60L constitutes a vertical semiconductor channel 60 through which electrical current may flow when a vertical NAND device including the vertical semiconductor channel 60 is turned on. A tunneling dielectric layer 56 may be surrounded by a charge storage layer 54, and laterally surrounds a vertical semiconductor channel 60. Each adjoining set of a blocking dielectric layer 52, a charge storage layer 54, and a tunneling dielectric layer 56 collectively constitute a memory film 50, which may store electrical charges with a macroscopic retention time. In some embodiments, a blocking dielectric layer 52 may not be present in the memory film 50 at this step, and a backside blocking dielectric layer may be subsequently formed after formation of backside recesses. As used herein, a macroscopic retention time refers to a retention time suitable for operation of a memory device as a permanent memory device such as a retention time in excess of 24 hours.

Each combination of a memory film 50 and a vertical semiconductor channel 60 (which is a vertical semiconductor channel) within a memory opening 49 constitutes a memory stack structure 55. The memory stack structure 55 may be a combination of a vertical semiconductor channel 60, a tunneling dielectric layer 56, a plurality of memory elements comprising portions of the charge storage layer 54, and an optional blocking dielectric layer 52. Each combination of a memory stack structure 55, a dielectric core 62, and a drain region 63 within a memory opening 49 constitutes a memory opening fill structure 58. Each drain region 63 in a memory opening fill structure 58 is electrically connected to an upper end of a respective one of the vertical semiconductor channels 60. The in-process source-level material layers 10', the first-tier structure (132, 142, 170, 165), the second-tier structure (232, 242, 270, 265), the inter-tier dielectric layer 180, and the memory opening fill structures 58 collectively constitute a memory-level assembly.

The memory stack structures 55 are formed through the alternating stack {(132, 142), (232, 242)}. Each of the memory stack structures 55 comprises a vertical semiconductor channel 60 and a vertical stack of memory elements located in the memory film 50 at levels of the sacrificial material layers (142, 242). Each vertical stack of memory elements comprises charge storage material portions (i.e., portions of a charge storage layer 54) located at each level of the sacrificial material layers 142 and laterally spaced from a vertical semiconductor channel 60 within a same memory opening 49 by a tunneling dielectric layer 56.

Figure 13A:
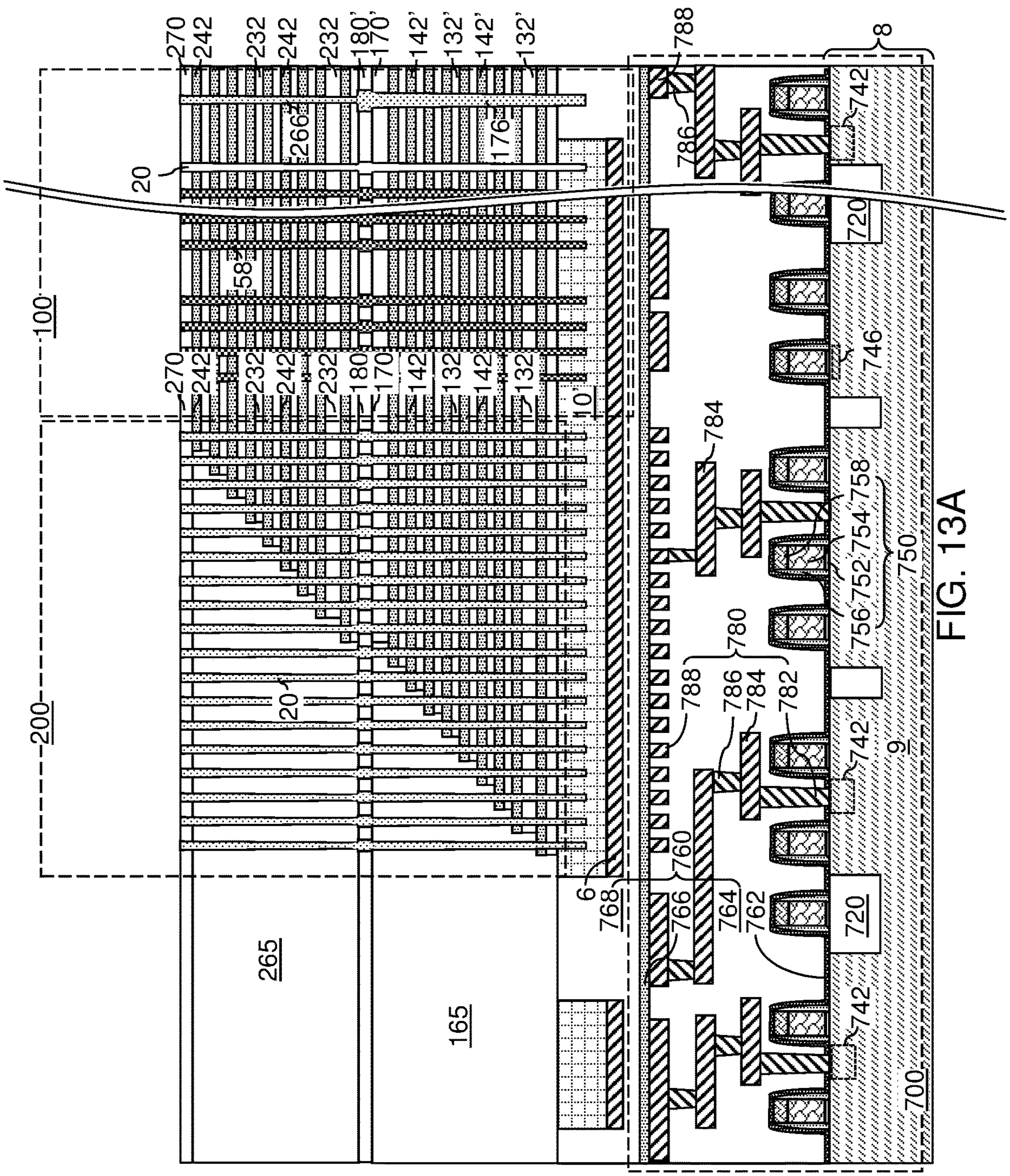
FIG. 13A is a vertical cross-sectional view of the exemplary structure after formation of memory opening fill structures according to an embodiment of the present disclosure.
Figure 13B:
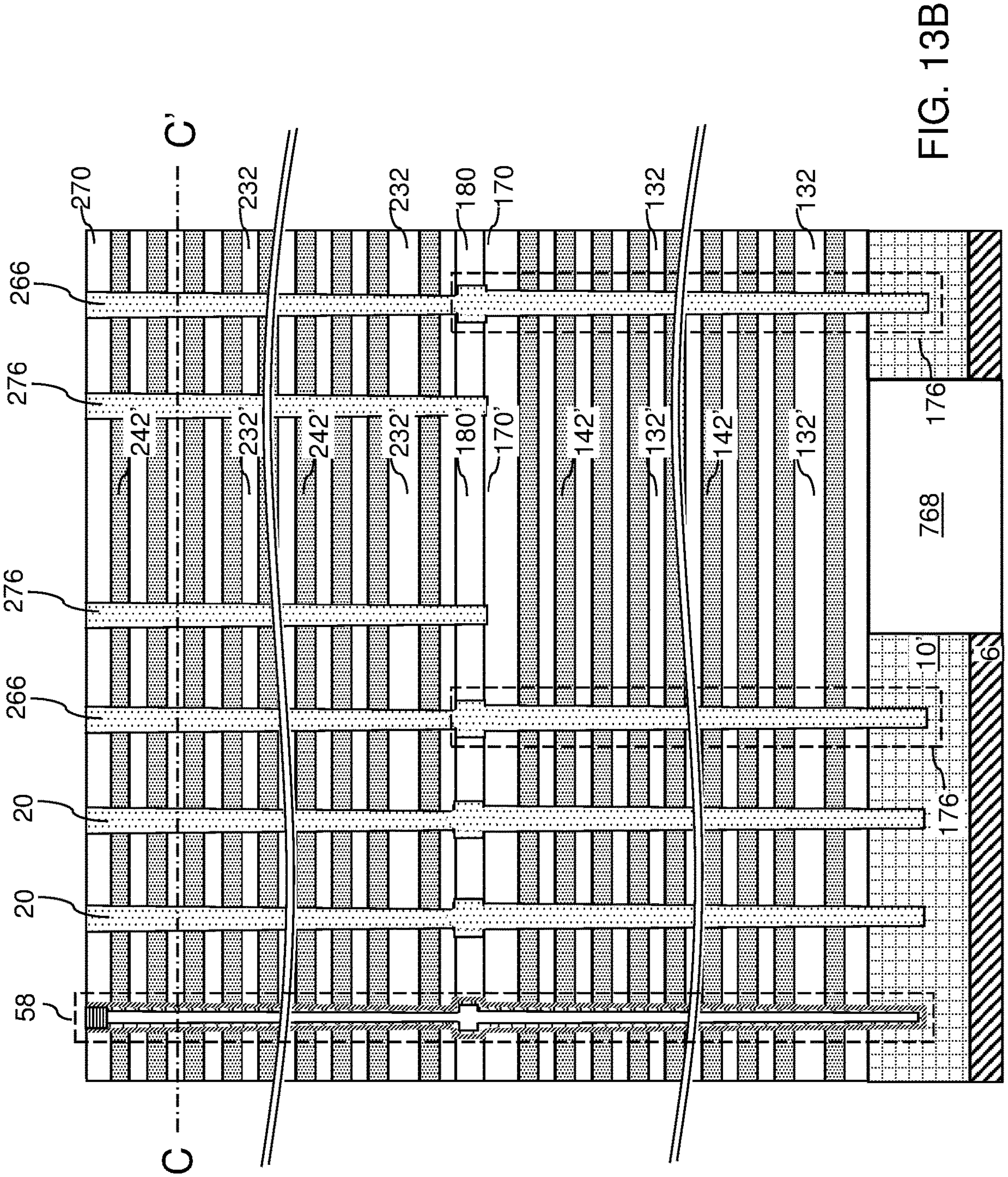
FIG. 13B is another vertical cross-sectional view of the exemplary structure of FIGS. 8A and 8B.
Figure 13C:
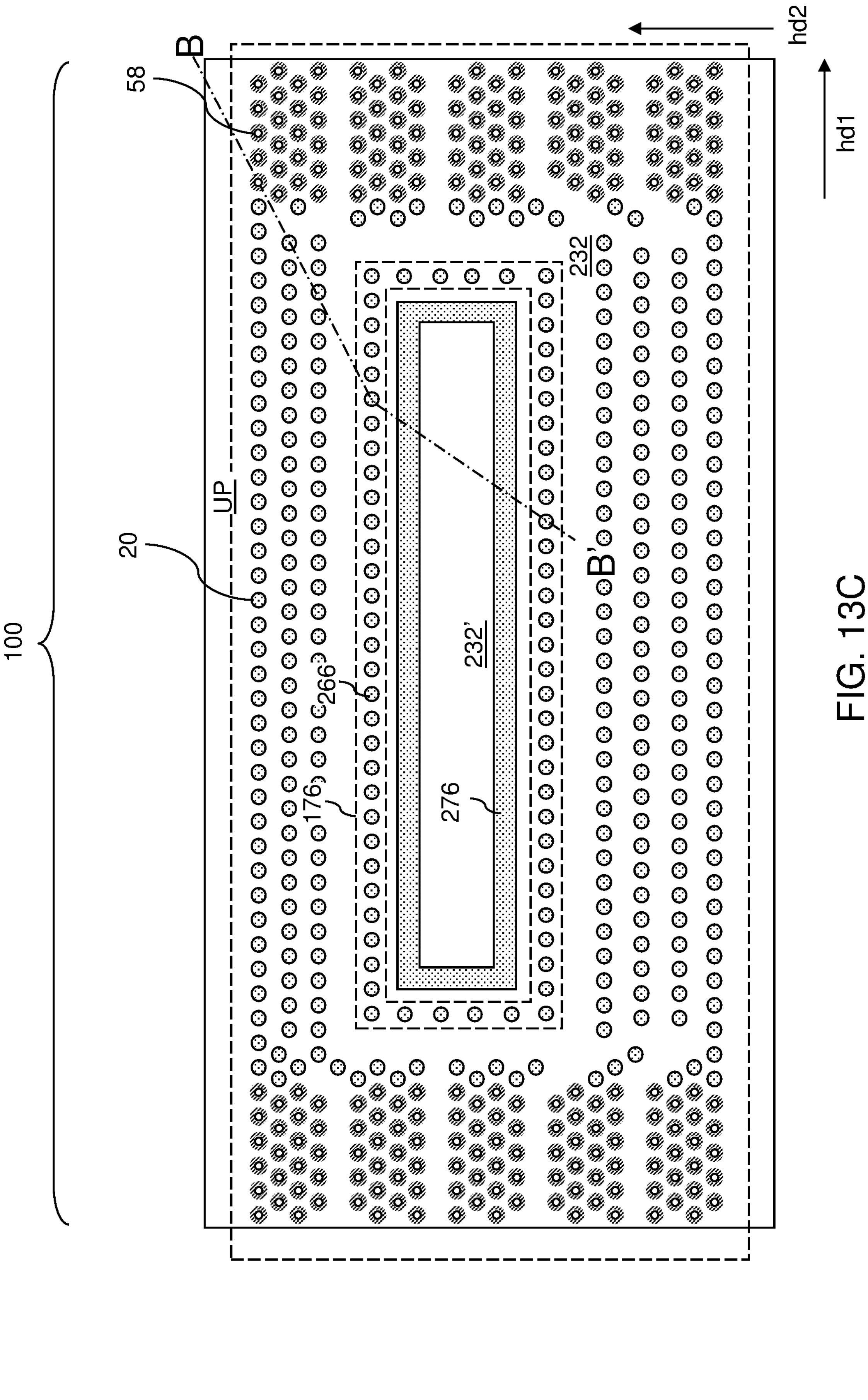
FIG. 13C is a horizontal cross-sectional view of the exemplary structure along the horizontal plane C-C' of FIG. 13B. The hinged vertical plane B-B' corresponds to the plane of the vertical cross-sectional view of FIG. 13B.
Figure 14A:
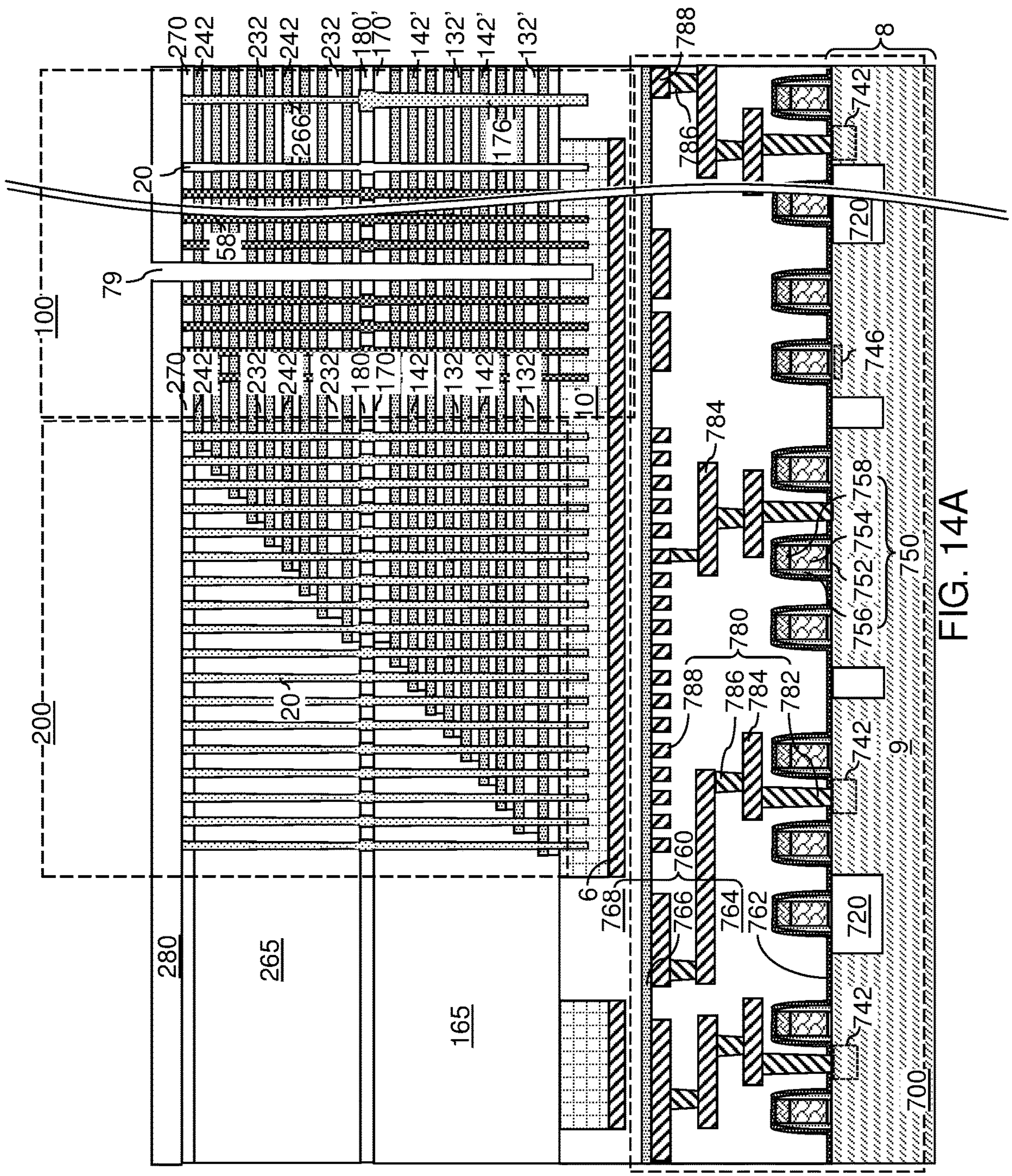
FIG. 14A is a vertical cross-sectional view of the exemplary structure after formation of backside trenches according to an embodiment of the present disclosure.
Figure 14B:
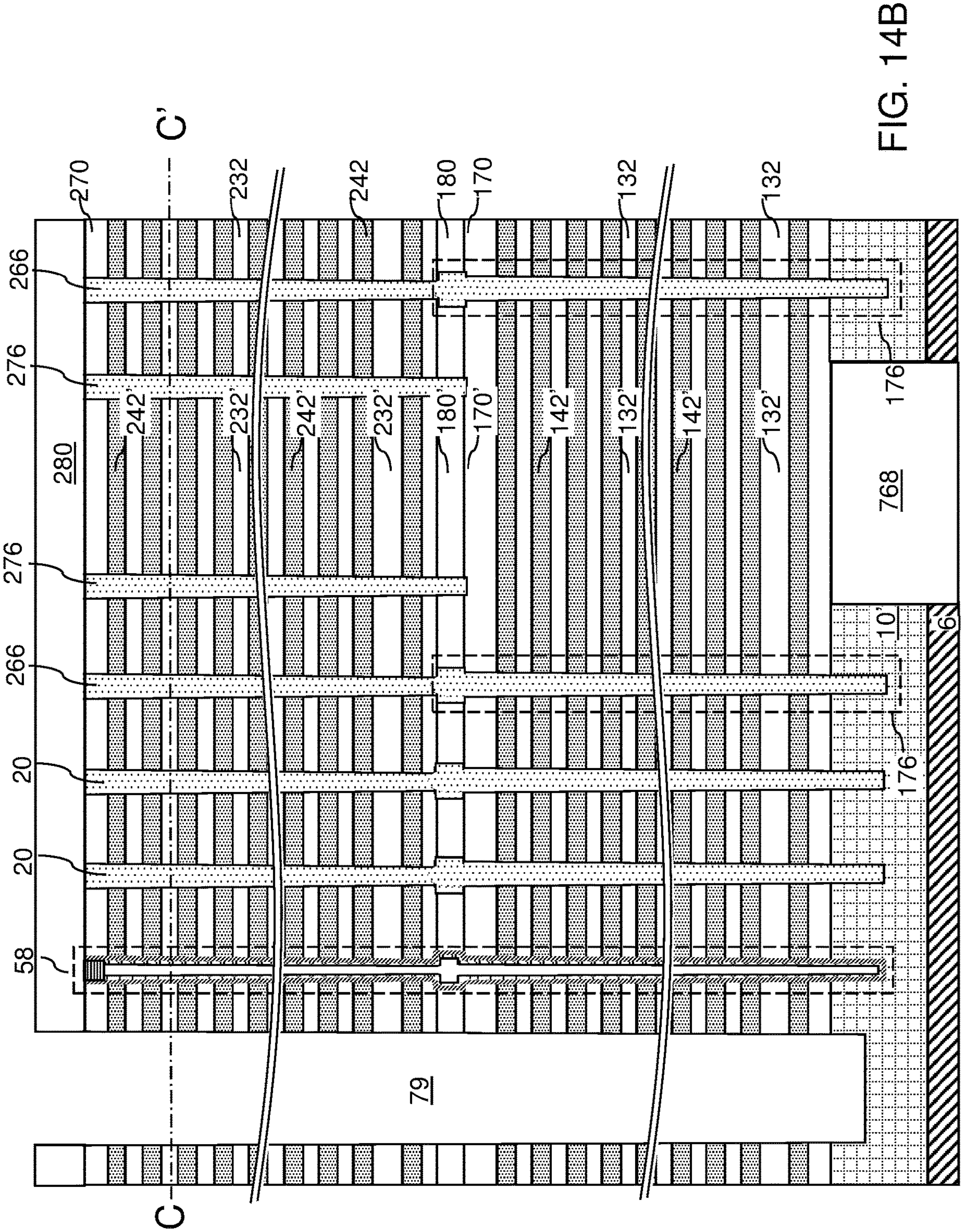
FIG. 14B is another vertical cross-sectional view of the exemplary structure of FIG. 14A.
Figure 14C:
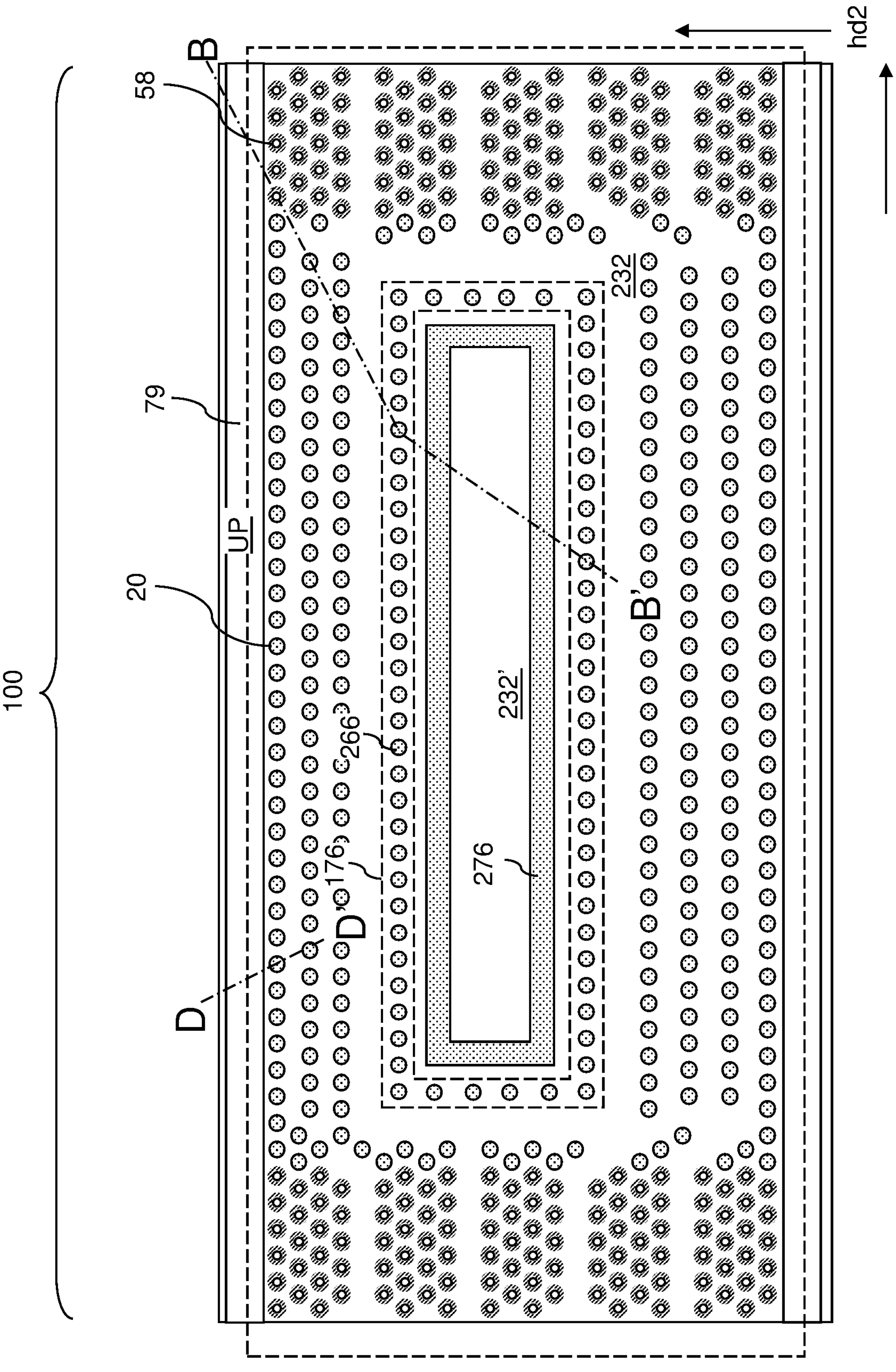
FIG. 14C is a horizontal cross-sectional view of the exemplary structure along the horizontal plane C-C' of FIG. 14B. The hinged vertical plane B-B' corresponds to the plane of the vertical cross-sectional view of FIG. 14B.
Figure 14D:
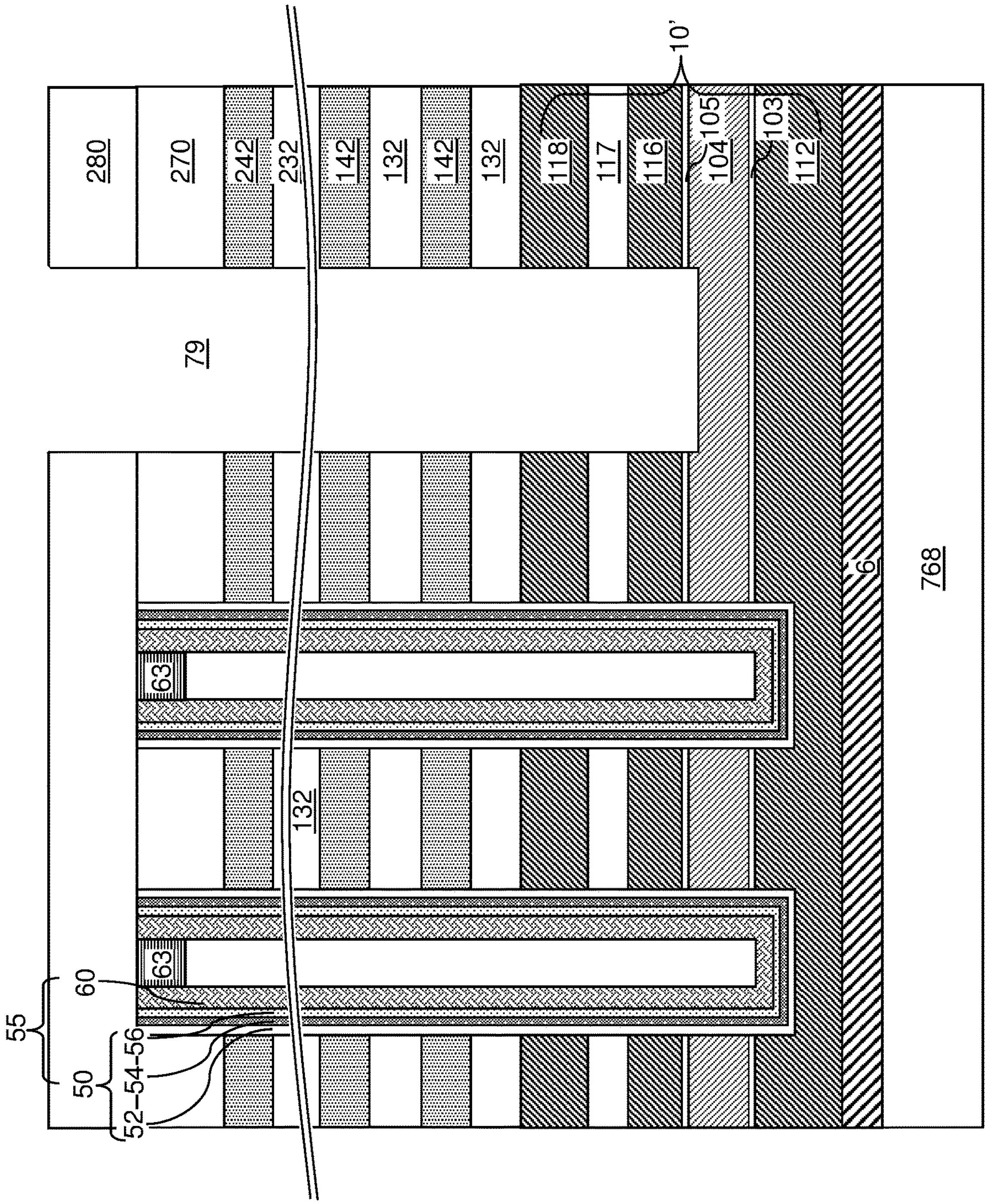
FIG. 14D is a vertical cross-sectional view of a region of the exemplary structure along the vertical plane D-D' of FIG. 14C.

Referring to FIGS. 13A-13C, the exemplary structure is illustrated after formation of the memory opening fill structures 58. Each of the alternating stacks {(132, 142), (232, 242)} comprises a terrace region in which each sacrificial material layer (142, 242) other than a topmost sacrificial material layer (142, 242) within the alternating stack {(132, 142) and/or (232, 242)} laterally extends farther than any overlying sacrificial material layer (142, 242) within the alternating stack {(132, 142) and/or (232, 242)}. The terrace region includes stepped surfaces of the alternating stack that continuously extend from a bottommost layer within the alternating stack {(132, 142) or (232, 242)} to a topmost layer within the alternating stack {(132, 142) or (232, 242)}. Support pillar structures 20 extend through the stepped surfaces and through a retro-stepped dielectric material portion (165 or 265) that overlies the stepped surfaces.

A first subset of the memory stack structures 55 is located in a first portion of a memory array region 100 in which each layer of the first-tier alternating stack (132, 142) and each layer of the second-tier alternating stack (232, 242) are present. A second subset of the memory stack structures 55 is located in a second portion of the memory array region 100 in which each layer of the first-tier alternating stack (132, 142) and each layer of the second-tier alternating stack (232, 242) are present and are laterally spaced from the first portion of the memory array region 100 along a first horizontal direction hd1.

Referring to FIGS. 14A-14D, a first contact-level dielectric layer 280 may be formed over the second-tier structure (232, 242, 270, 265). The first contact-level dielectric layer 280 includes a dielectric material such as silicon oxide, and may be formed by a conformal or non-conformal deposition process. For example, the first contact-level dielectric layer 280 may include undoped silicate glass and may have a thickness in a range from 100 nm to 600 nm, although lesser and greater thicknesses may also be used.

A photoresist layer (not shown) may be applied over the first contact-level dielectric layer 280, and may be lithographically patterned to form various openings in the memory array region 100 and the staircase region 200. The openings in the photoresist layer include first elongated openings that laterally extend along the first horizontal direction hd1 through the entire lateral extent of the memory array region 100 and the staircase region 200 along the first horizontal direction hd1. The first elongated openings laterally extend between groups of memory opening fill structures 58 and support pillar structures 20. Further, the openings in the photoresist layer may include second elongated openings that extend along the first horizontal direction hd1 between clusters of memory opening fill structures 58 that are laterally spaced apart along the first horizontal direction hd1 and located between a neighboring pair of first elongated openings. Each second elongated opening has a lesser lateral extent that the lateral extent of the memory array region 100 along the first horizontal direction hd1. Optionally, the openings in the photoresist layer may include discrete openings located between end regions of a neighboring pair of second elongated openings.

An anisotropic etch may be performed to transfer the pattern in the photoresist layer through underlying material portions including the alternating stacks {(132, 142), (232, 242)} and an upper portion of the in-process source-level material layers 10'. Backside trenches 79 may be formed underneath the first elongated openings in the photoresist layer through the first contact-level dielectric layer 280, the second-tier structure (232, 242, 270, 265), and the first-tier structure (132, 142, 170, 165), and into the in-process source-level material layers 10'. Portions of the first contact-level dielectric layer 280, the second-tier structure (232, 242, 270, 265), the first-tier structure (132, 142, 170, 165), and the in-process source-level material layers 10' that underlie the first elongated openings in the photoresist layer may be removed to form the backside trenches 79. In one embodiment, the backside trenches 79 may be formed between groups of memory stack structures 55 that are laterally spaced apart along the second horizontal direction. A top surface of a source-level sacrificial layer 104 may be physically exposed at the bottom of each backside trench 79. Since the backside trenches 79 are formed separately from the moat trenches (179, 279), portions of the alternating stacks {(132, 232), (142, 242)} located between the moat trenches (179, 279) and the backside trenches 79 do not have a chance to topple sideways into the backside trenches 79 because the moat trenches (179, 279) are filled with the dielectric moat structures (176, 276) which together with the overlying first contact-level dielectric layer 280 hold the alternating stacks {(132, 232), (142, 242)} in place after formation of the backside trenches 79.

Generally, an alternating stack {(132, 232), (142, 242)} of insulating layers 132 and sacrificial material layers (142, 242) may be formed over a semiconductor substrate 8 including the substrate semiconductor layer 9. The sacrificial material layers (142, 242) may comprise a dielectric material such as silicon nitride. The alternating stack {(132, 232), (142, 242)} may be etched by performing an anisotropic etch process using a patterned mask layer (such as a photoresist layer). The alternating stack {(132, 232), (142, 242)} may be divided into a plurality of alternating stacks {(132, 232), (142, 242)} of respective insulating layers (132, 232) and respective sacrificial material layers (142, 242) by the backside trenches 79.

A photoresist layer (not shown) can be applied over the exemplary structure, and can be lithographically patterned to form laterally-extending line-shaped openings that laterally extend along the first horizontal direction hd1 between neighboring clusters of memory opening fill structures 58. The pattern of the laterally-extending line-shaped openings can be transferred through the upper set of at least one insulating layer 232 and at least one sacrificial material layer 242 to form drain-select-level trenches. The photoresist layer can be removed, for example, by ashing.

A dielectric fill material such as undoped silicate glass or a doped silicate glass can be deposited in the drain-select-level trenches. Excess portions of the dielectric fill material may be removed from above first contact-level dielectric layer 280 by a planarization process. Portions of the dielectric fill material that fills the drain-select-level trenches constitute drain-select-level isolation structures 72, which separate drain select electrodes to be formed in a later step in place of the one or more upper sacrificial material layers 242.

Figure 15A:
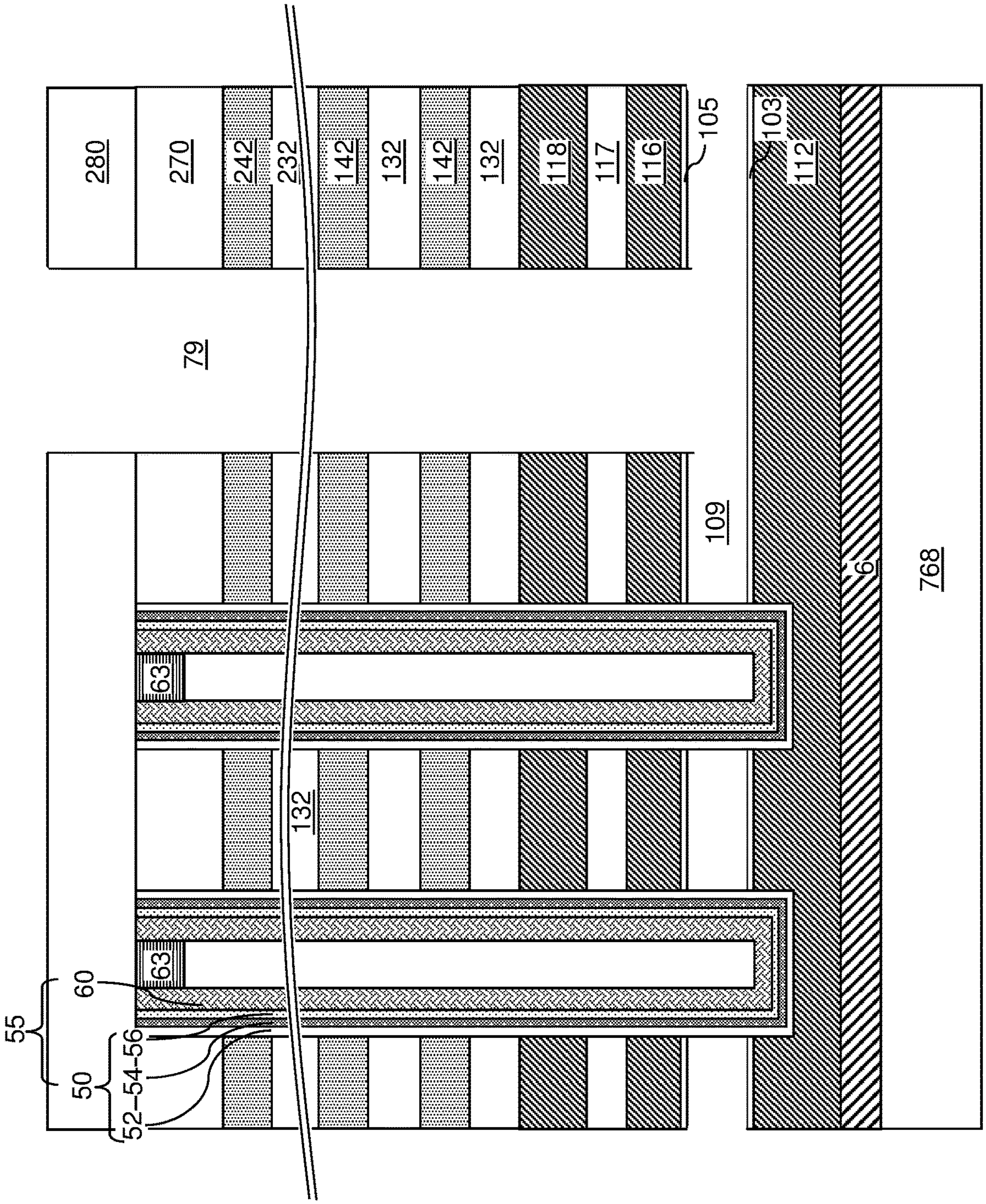
FIGS. 15A-15C illustrate sequential vertical cross-sectional views of memory opening fill structures and a backside trench during formation of source-level material layers according to an embodiment of the present disclosure.

Referring to FIG. 15A, an etchant that etches the material of the source-level sacrificial layer 104 selective to the materials of the first-tier alternating stack (132, 142), the second-tier alternating stack (232, 242), the first and second insulating cap layers (170, 270), the first contact-level dielectric layer 280, the upper sacrificial liner 105, and the lower sacrificial liner 103 may be introduced into the backside trenches in an isotropic etch process. For example, if the source-level sacrificial layer 104 includes undoped amorphous silicon or an undoped amorphous silicon-germanium alloy and if the upper and lower sacrificial liners (105, 103) include silicon oxide, a wet etch process using hot trimethyl-2 hydroxyethyl ammonium hydroxide ("hot TMY") or tetramethyl ammonium hydroxide (TMAH) may be used to remove the source-level sacrificial layer 104 selective to the upper and lower sacrificial liners (105, 103). A source cavity 109 may be formed in the volume from which the source-level sacrificial layer 104 is removed.

Wet etch chemicals such as hot TMY and TMAH are selective to the doped semiconductor materials of the upper source-level semiconductor layer 116 and the lower source-level semiconductor layer 112. Thus, use of selective wet etch chemicals such as hot TMY and TMAH for the wet etch process that forms the source cavity 109 provides a large process window against etch depth variation during formation of the backside trenches 79. Specifically, in embodiments in which sidewalls of the upper source-level semiconductor layer 116 are physically exposed or in other embodiments in which a surface of the lower source-level semiconductor layer 112 is physically exposed upon formation of the source cavity 109, collateral etching of the upper source-level semiconductor layer 116 and/or the lower source-level semiconductor layer 112 is minimal, and the structural change to the exemplary structure caused by accidental physical exposure of the surfaces of the upper source-level semiconductor layer 116 and/or the lower source-level semiconductor layer 112 during manufacturing steps do not result in device failures. Each of the memory opening fill structures 58 may be physically exposed to the source cavity 109. Specifically, each of the memory opening fill structures 58 may include a sidewall and a bottom surface that are physically exposed to the source cavity 109.

Figure 15B:
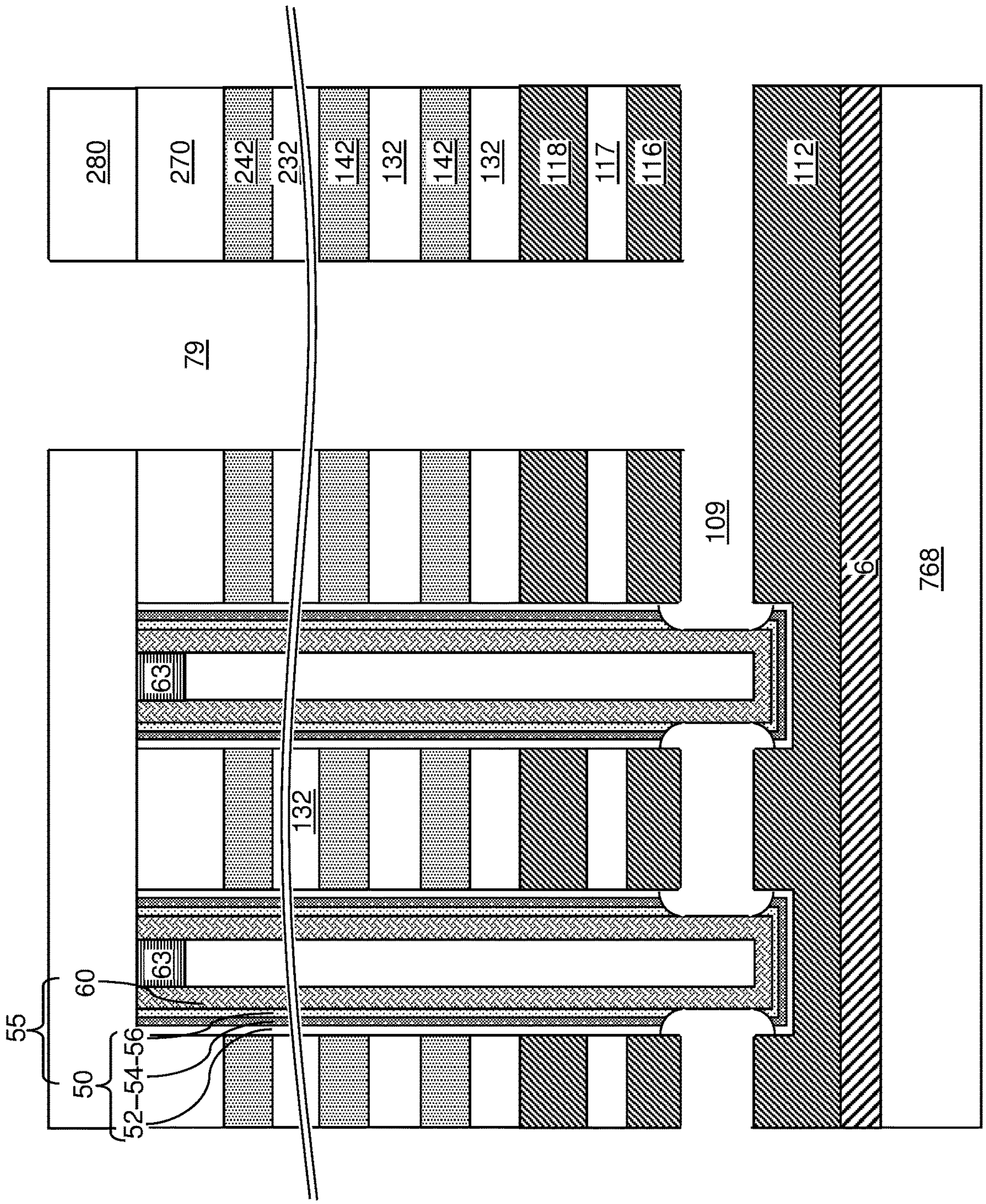

Referring to FIG. 15B, a sequence of isotropic etchants, such as wet etchants, may be applied to the physically exposed portions of the memory films 50 to sequentially etch the various component layers of the memory films 50 from outside to inside, and to physically expose cylindrical surfaces of the vertical semiconductor channels 60 at the level of the source cavity 109. The upper and lower sacrificial liners (105, 103) may be collaterally etched during removal of the portions of the memory films 50 located at the level of the source cavity 109. The source cavity 109 may be expanded in volume by removal of the portions of the memory films 50 at the level of the source cavity 109 and the upper and lower sacrificial liners (105, 103). A top surface of the lower source-level semiconductor layer 112 and a bottom surface of the upper source-level semiconductor layer 116 may be physically exposed to the source cavity 109. The source cavity 109 may be formed by isotropically etching the source-level sacrificial layer 104 and a bottom portion of each of the memory films 50 selective to at least one source-level semiconductor layer (such as the lower source-level semiconductor layer 112 and the upper source-level semiconductor layer 116) and the vertical semiconductor channels 60.

Figure 15C:
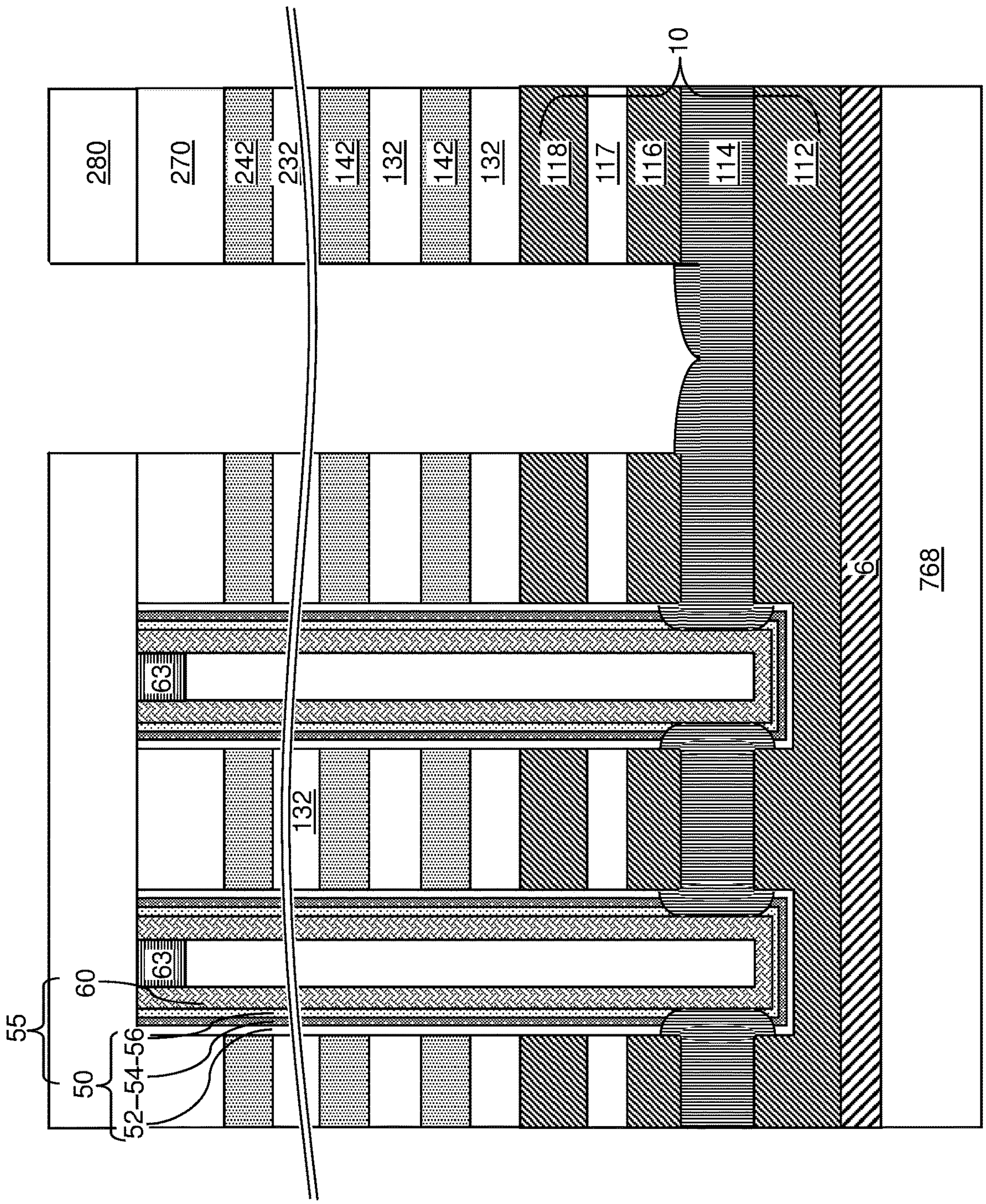
Figure 16A:
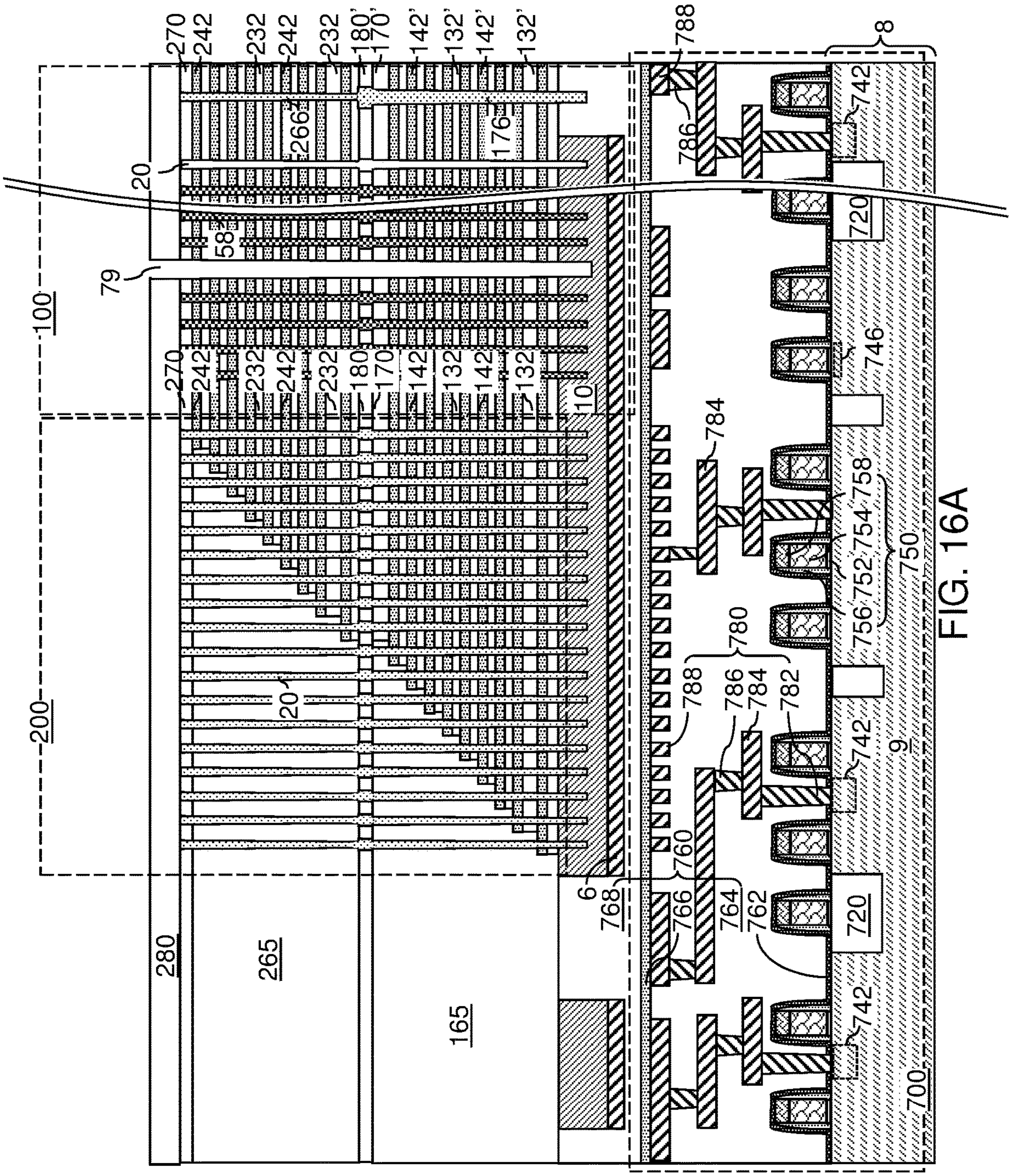
FIG. 16A is a vertical cross-sectional view of the exemplary structure after formation of dielectric semiconductor oxide material portions according to an embodiment of the present disclosure.
Figure 16B:
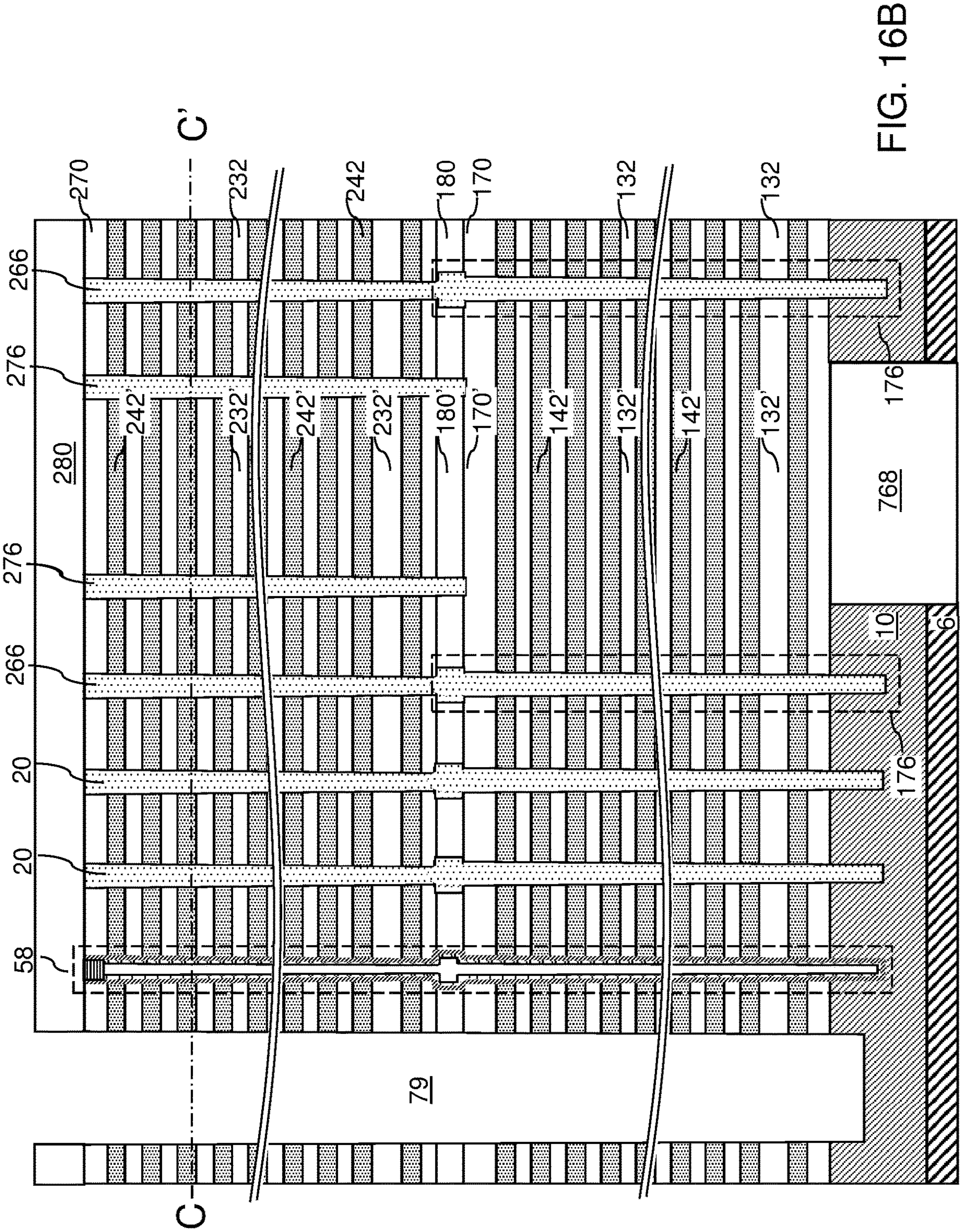
FIG. 16B is another vertical cross-sectional view of the exemplary structure of FIG. 16A.
Figure 16C:
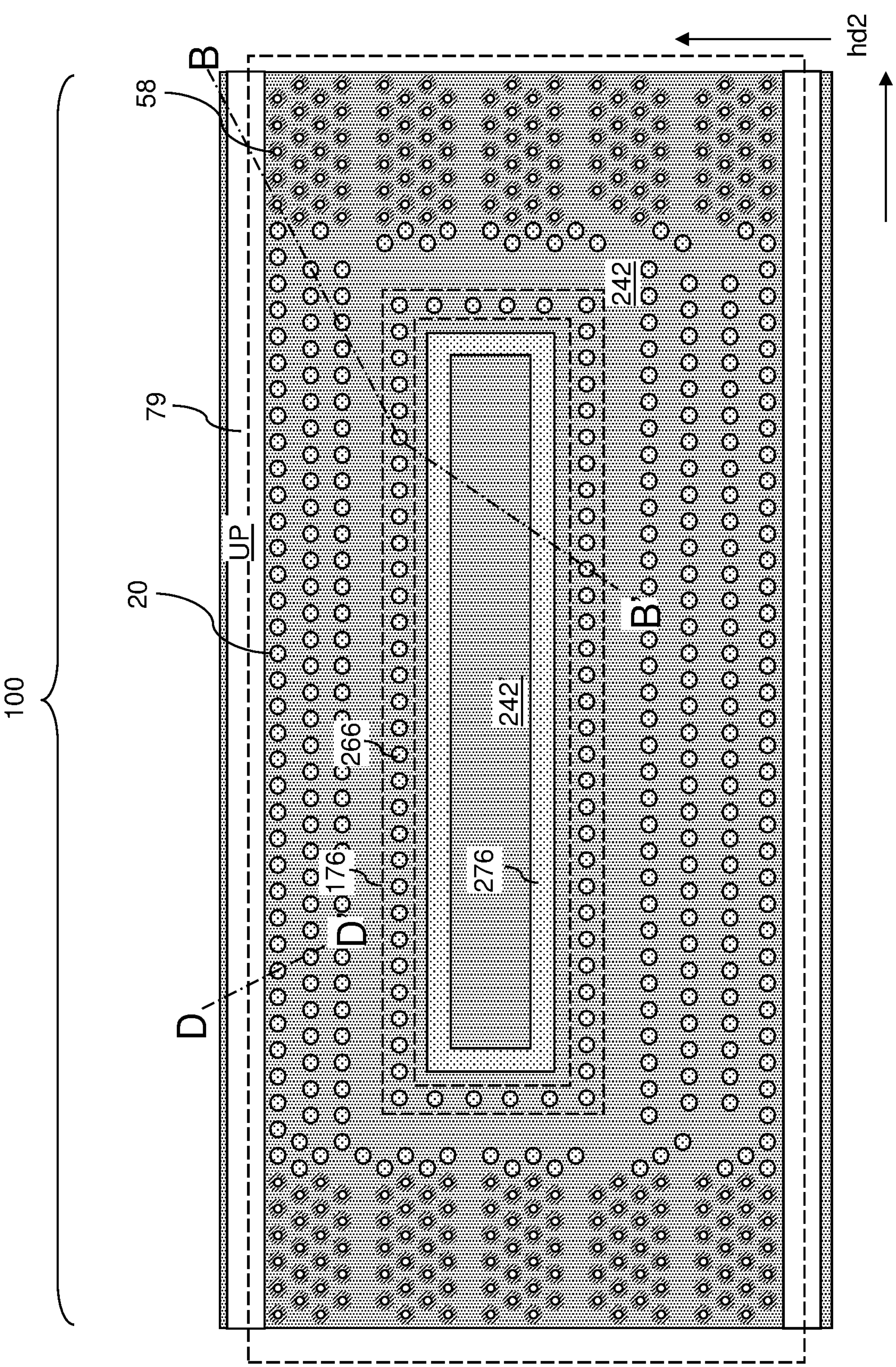
FIG. 16C is a horizontal cross-sectional view of the exemplary structure along the horizontal plane C-C' of FIG. 16B. The hinged vertical plane B-B' corresponds to the plane of the vertical cross-sectional view of FIG. 16B.
Figure 16D:
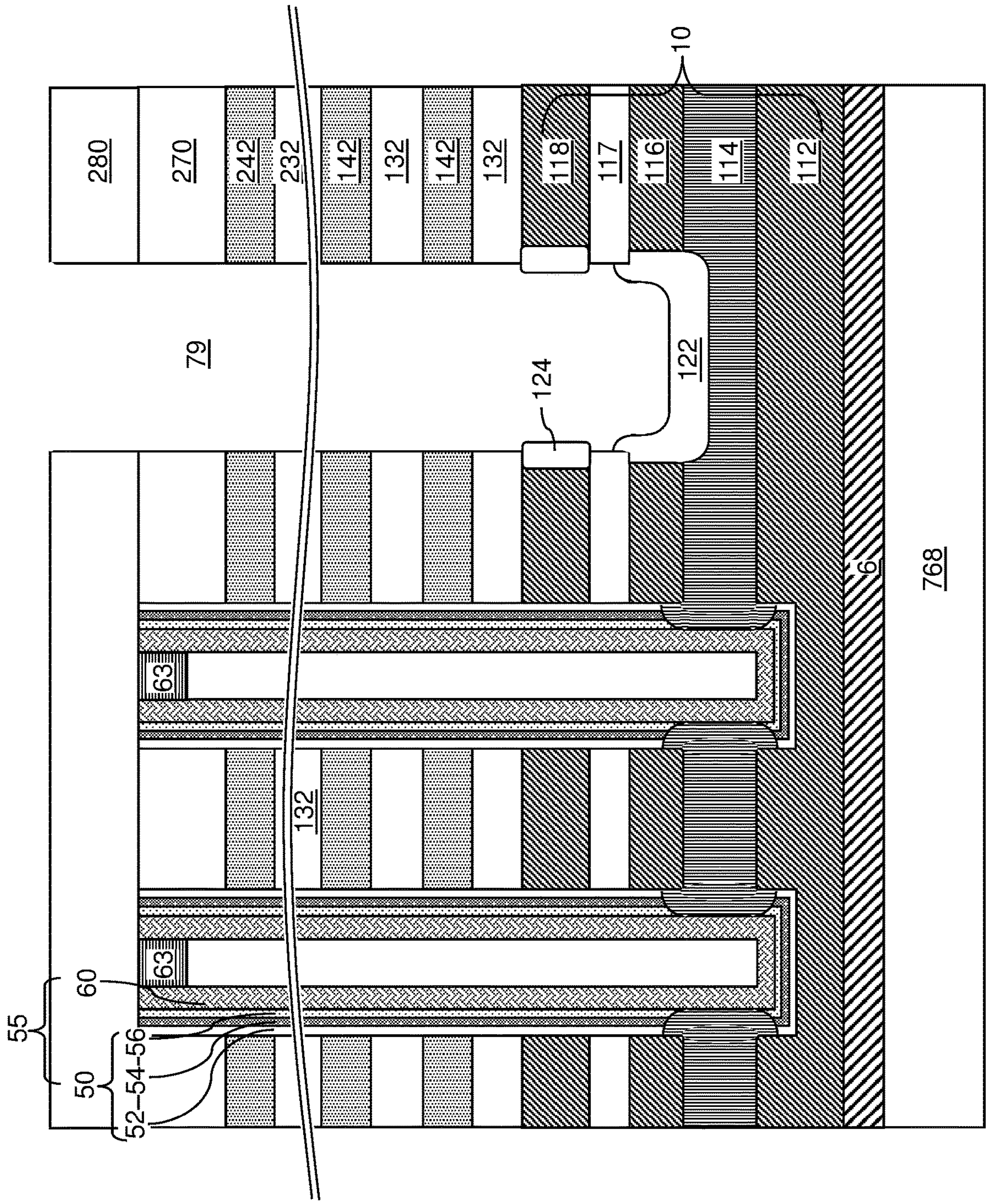
FIG. 16D is a vertical cross-sectional view of a region of the exemplary structure along the vertical plane D-D' of FIG. 16C.
Figure 17A:
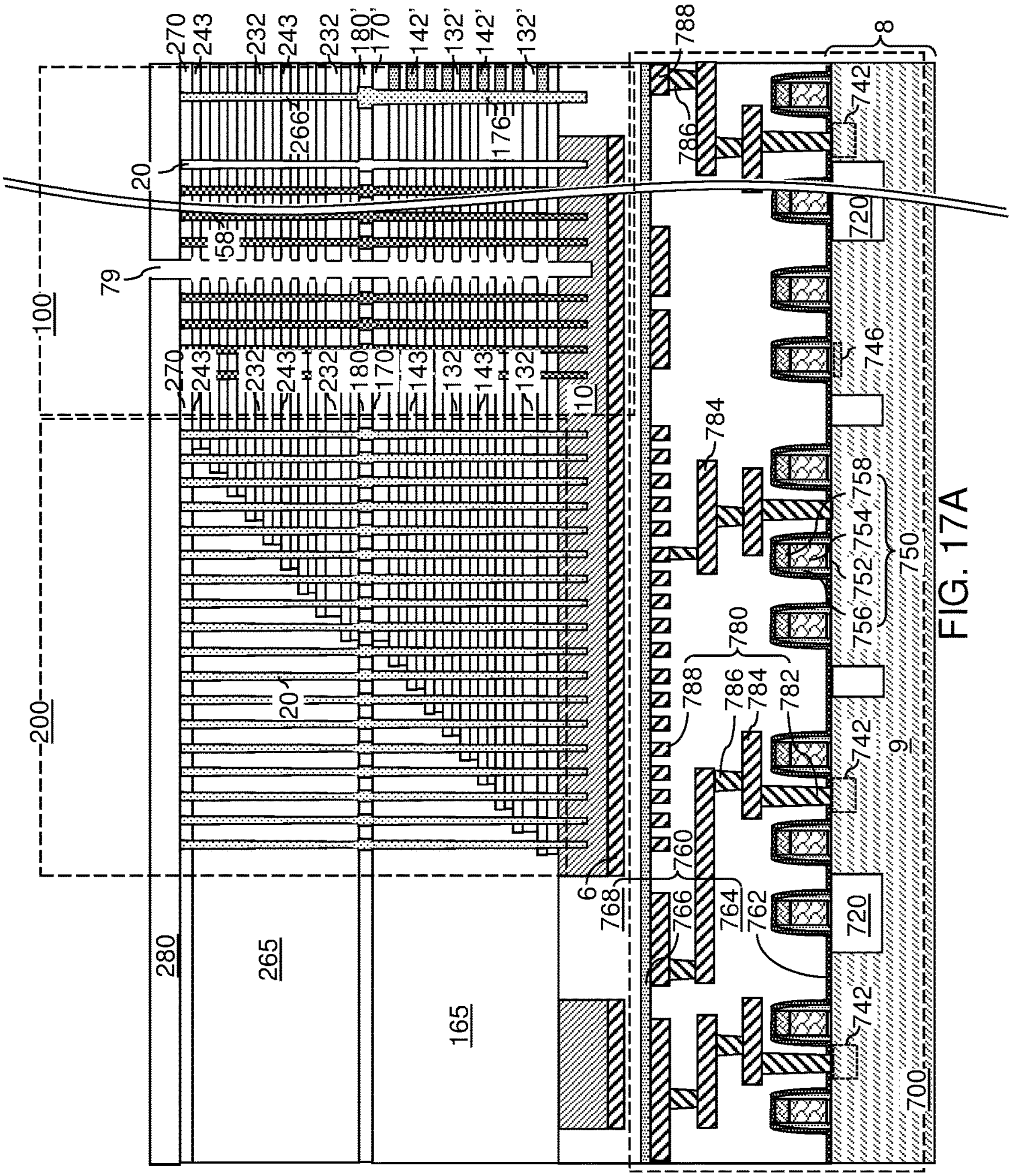
FIG. 17A is a vertical cross-sectional view of the exemplary structure after formation of backside recesses according to an embodiment of the present disclosure.
Figure 17B:
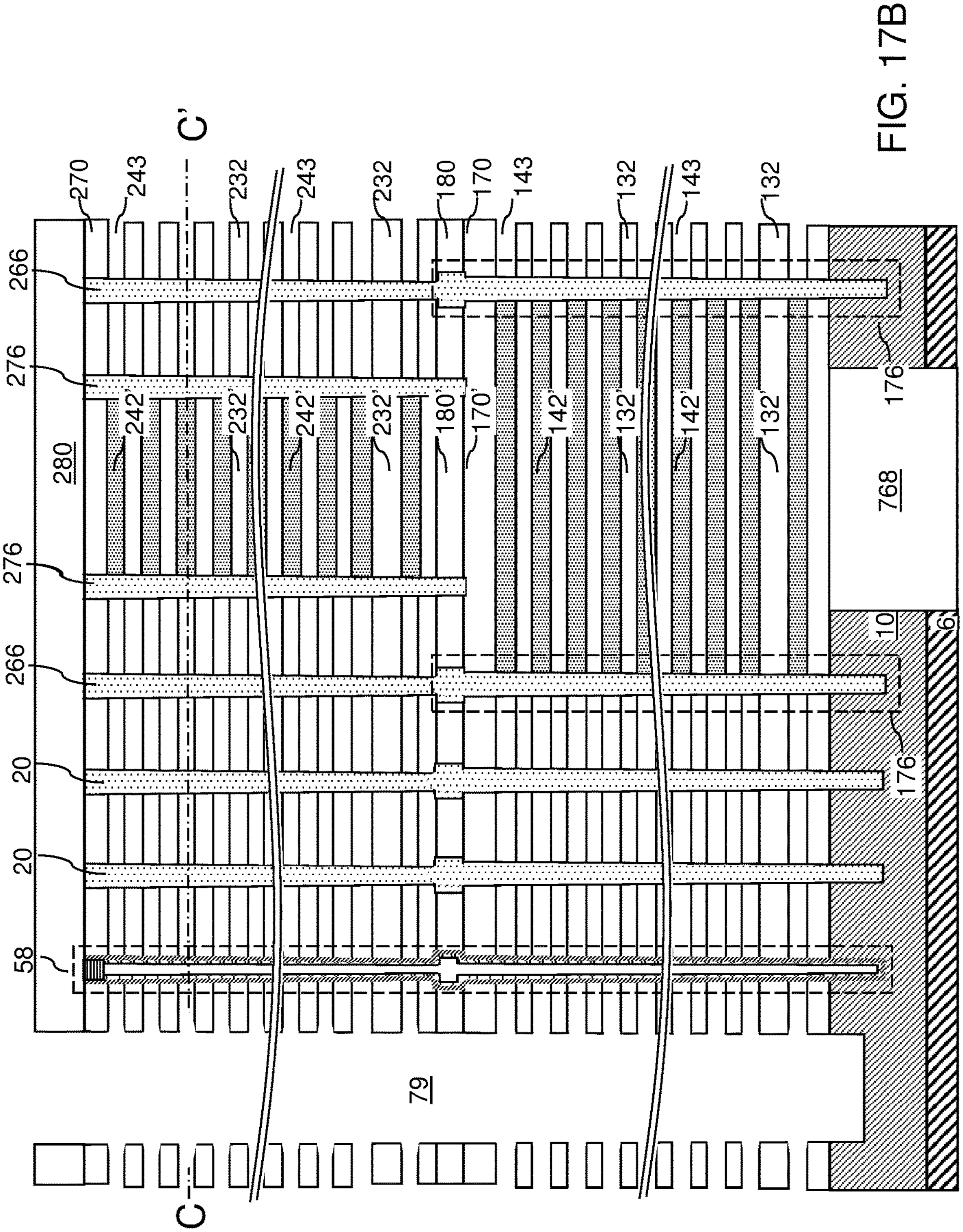
FIG. 17B is another vertical cross-sectional view of the exemplary structure of FIG. 17A.
Figure 17C:
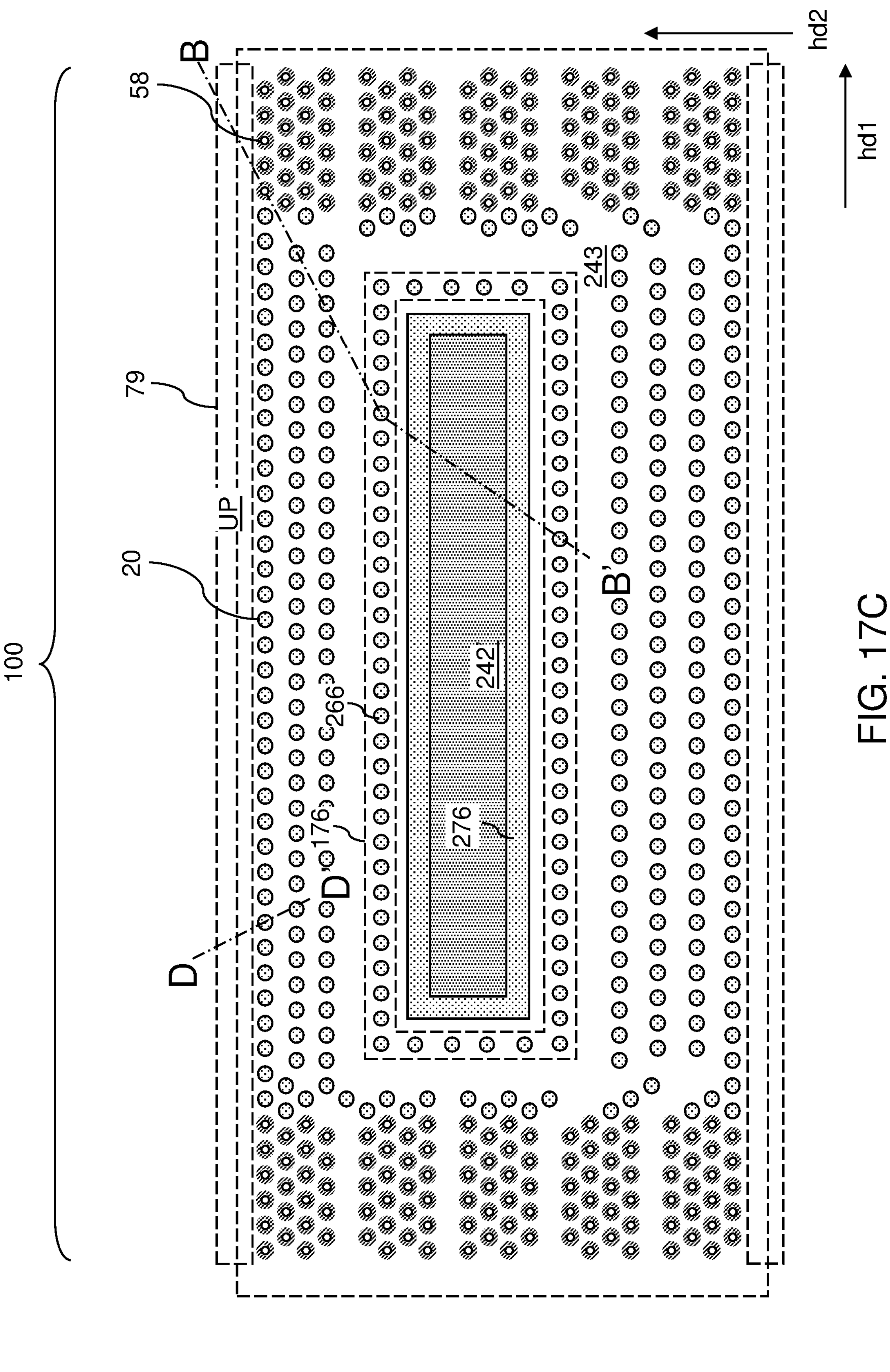
FIG. 17C is a horizontal cross-sectional view of the exemplary structure along the horizontal plane C-C' of FIG. 17B. The hinged vertical plane B-B' corresponds to the plane of the vertical cross-sectional view of FIG. 17B.
Figure 17D:
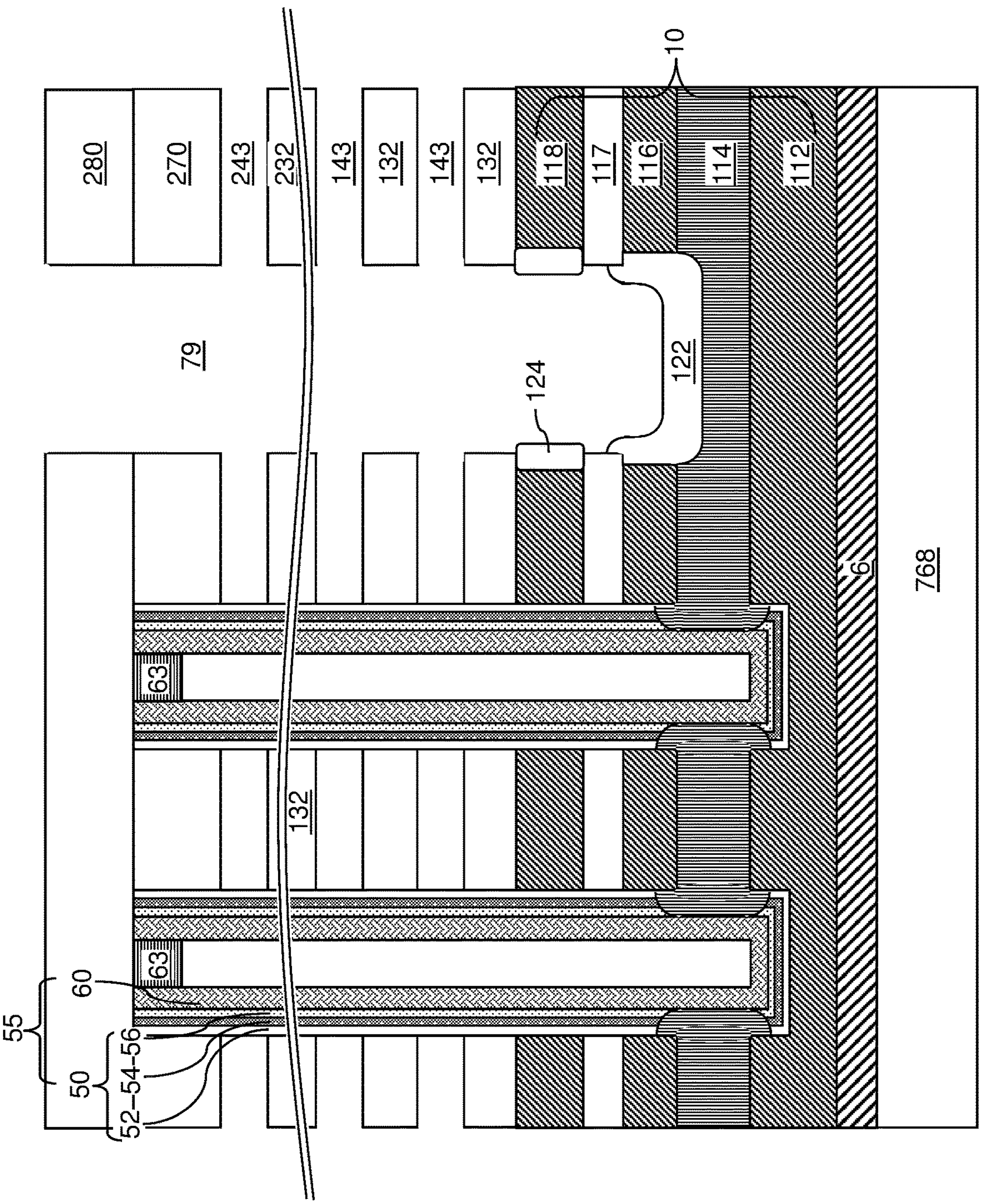
FIG. 17D is a vertical cross-sectional view of a region of the exemplary structure along the vertical plane D-D' of FIG. 17C.
Figure 18A:
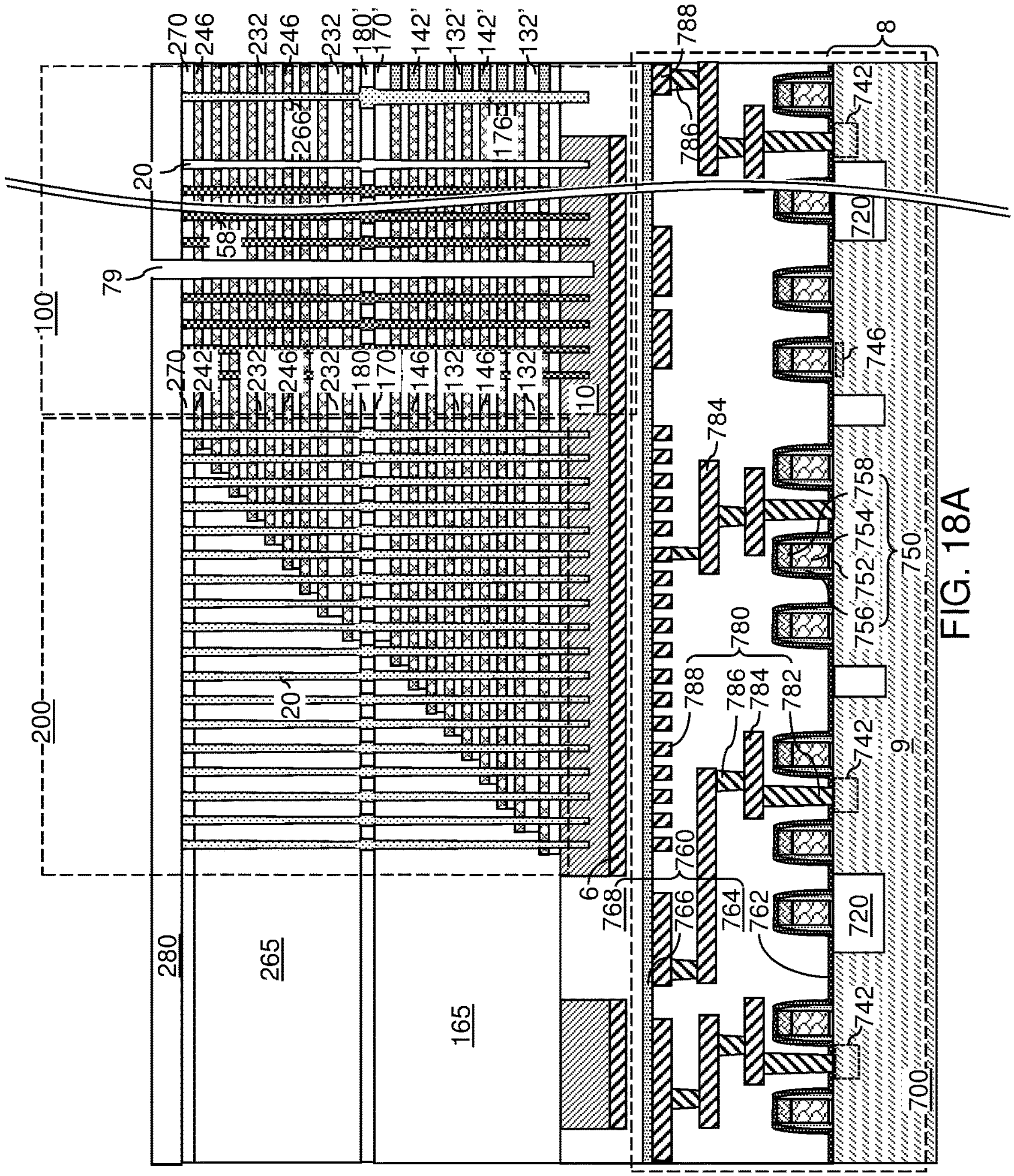
FIG. 18A is a vertical cross-sectional view of the exemplary structure after formation of electrically conductive layers according to an embodiment of the present disclosure.
Figure 18B:
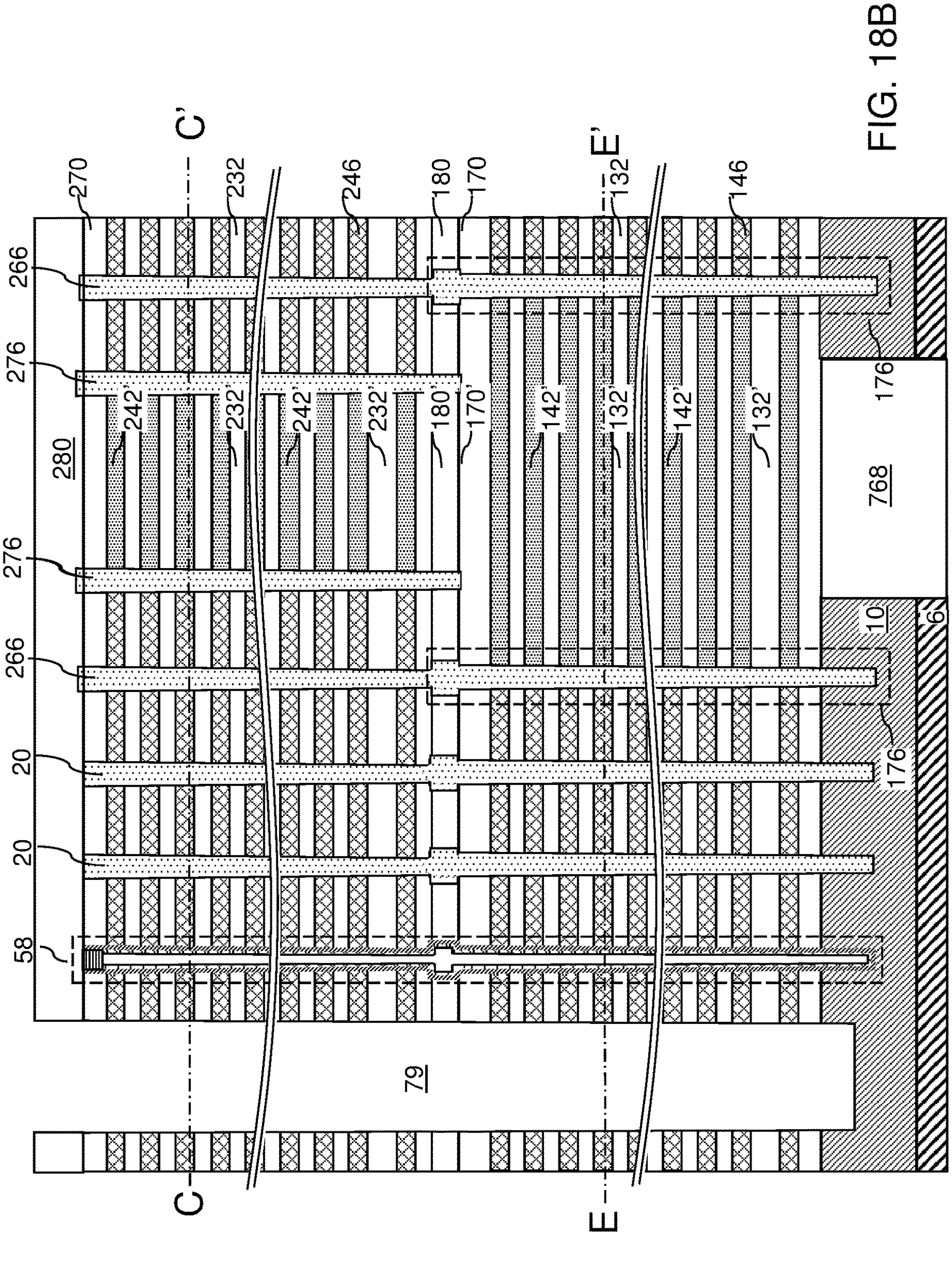
FIG. 18B is another vertical cross-sectional view of the exemplary structure of FIG. 18A.
Figure 18C:
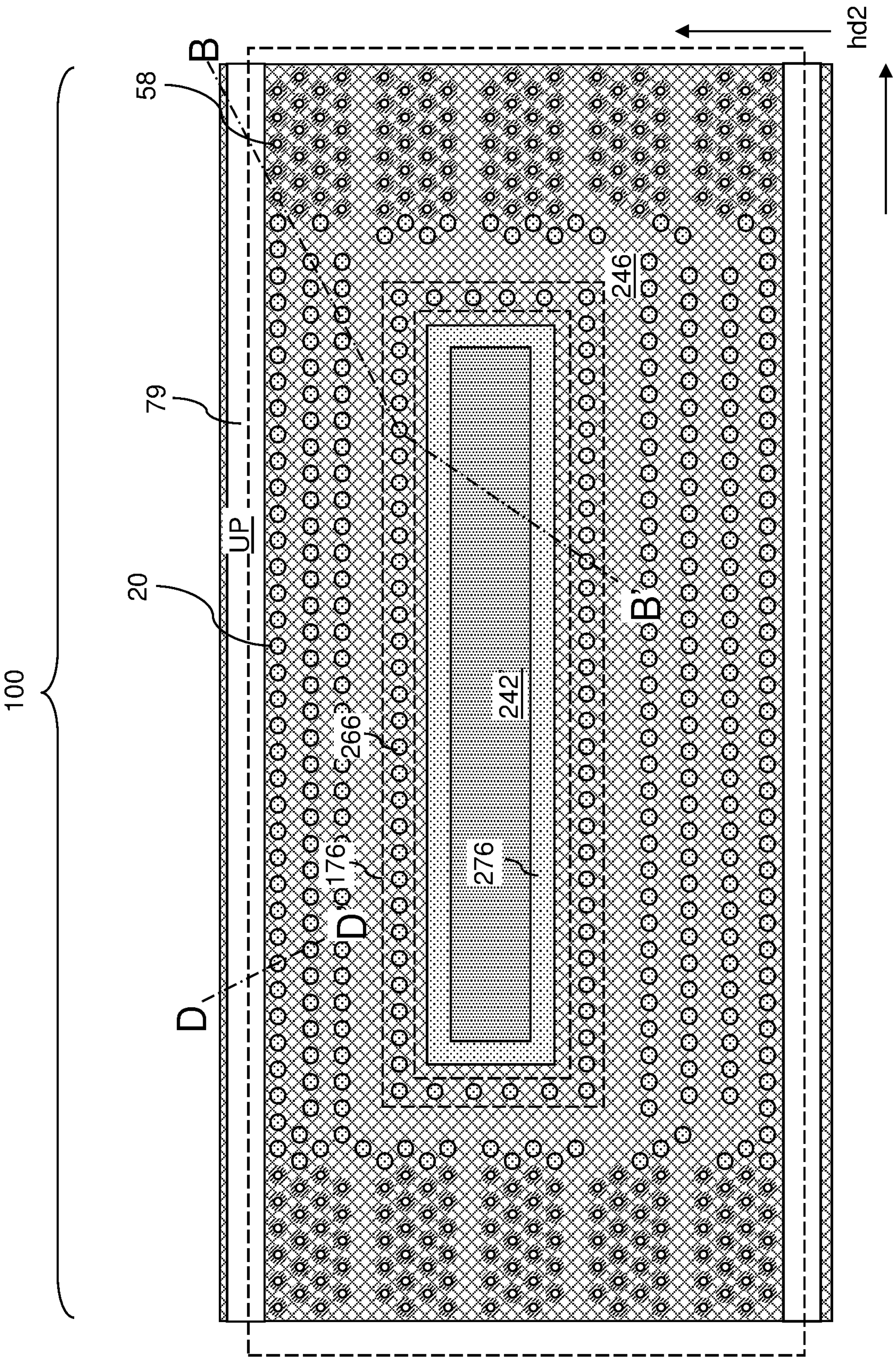
FIG. 18C is a horizontal cross-sectional view of the exemplary structure along the horizontal plane C-C' of FIG. 18B. The hinged vertical plane B-B' corresponds to the plane of the vertical cross-sectional view of FIG. 18B.
Figure 18D:
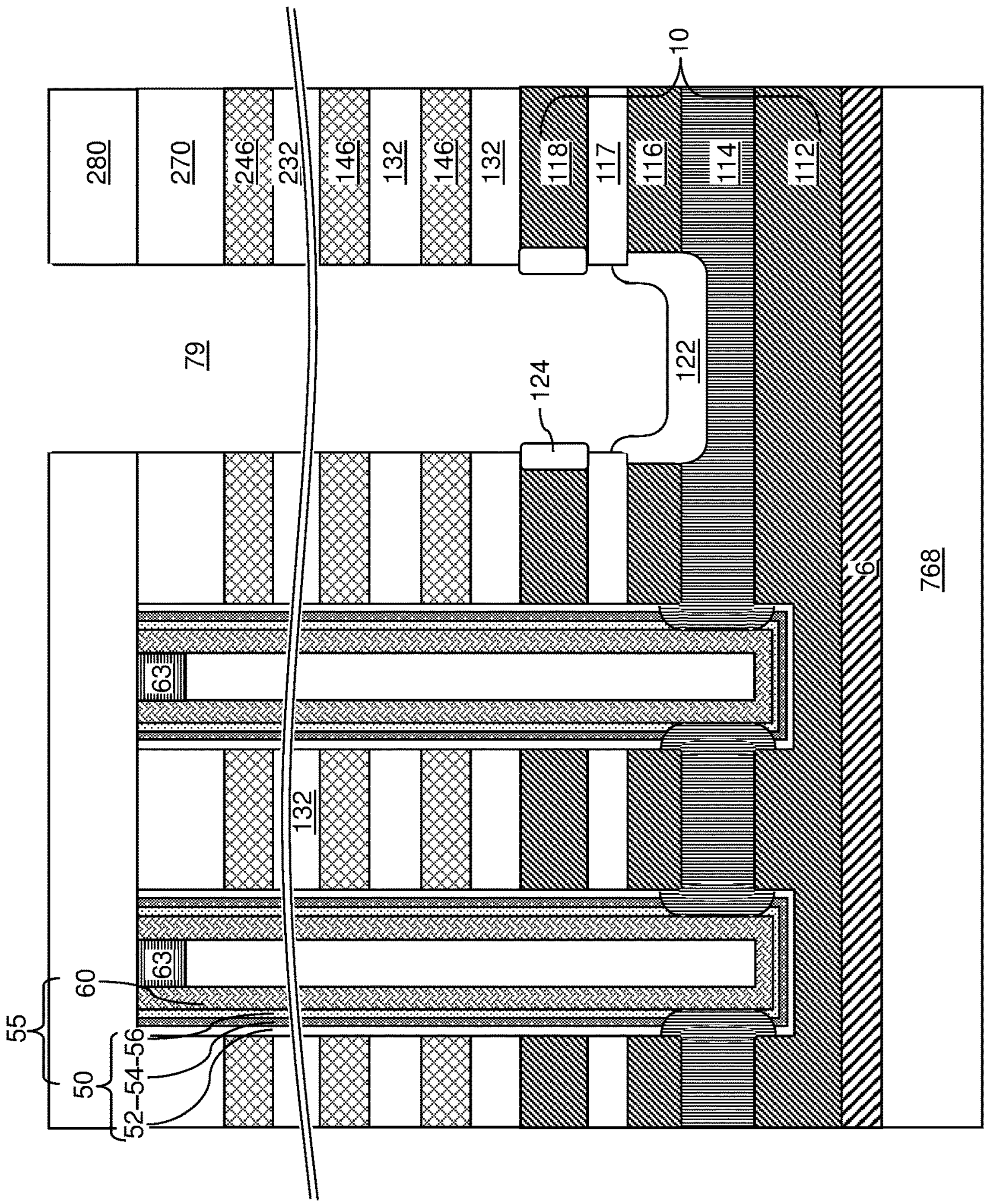
FIG. 18D is a vertical cross-sectional view of a region of the exemplary structure along the vertical plane D-D' of FIG. 18C.
Figure 18E:
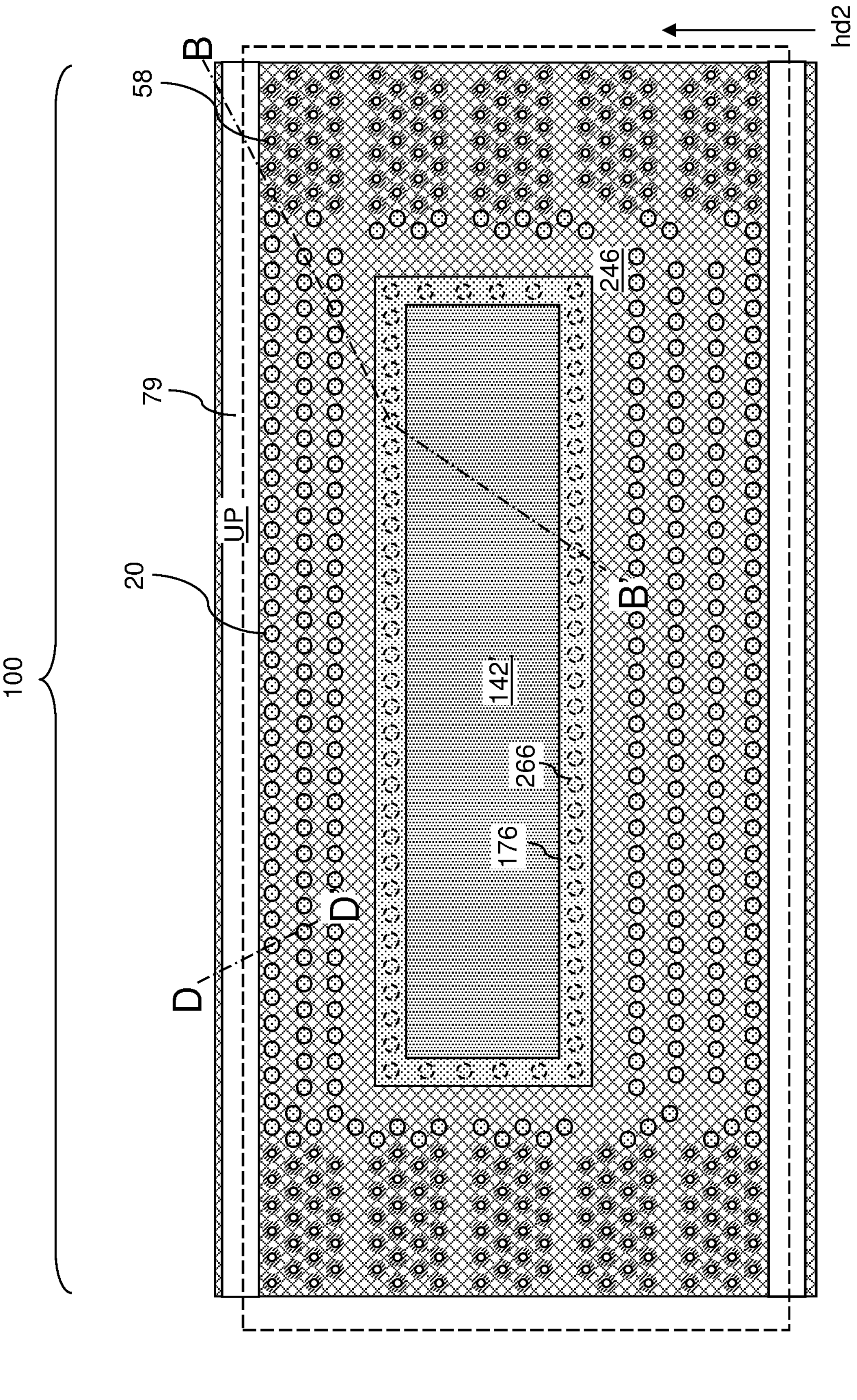
FIG. 18E is a horizontal cross-sectional view of the exemplary structure along the horizontal plane E-E' of FIG. 18B. The hinged vertical plane B-B' corresponds to the plane of the vertical cross-sectional view of FIG. 18B.

Referring to FIG. 15C, a doped semiconductor material having a doping of the second conductivity type may be deposited on the physically exposed semiconductor surfaces around the source cavity 109. The second conductivity type is the opposite of the first conductivity type, which is the conductivity type of the doping of the vertical semiconductor channels 60. The physically exposed semiconductor surfaces include bottom portions of outer sidewalls of the vertical semiconductor channels 60 and horizontal surfaces of the at least one source-level semiconductor layer (112, 116). For example, the physically exposed semiconductor surfaces may include the bottom portions of outer sidewalls of the vertical semiconductor channels 60, the top horizontal surface of the lower source-level semiconductor layer 112, and the bottom surface of the upper source-level semiconductor layer 116.

In one embodiment, the doped semiconductor material of the second conductivity type may be deposited on the physically exposed semiconductor surfaces around the source cavity 109 by a selective semiconductor deposition process. A semiconductor precursor gas, an etchant, and an n-type dopant precursor gas may flow concurrently into a process chamber including the exemplary structure during the selective semiconductor deposition process. For example, the semiconductor precursor gas may include silane, disilane, or dichlorosilane, the etchant gas may include gaseous hydrogen chloride, and the n-type dopant precursor gas such as phosphine, arsine, or stibine. In this case, the selective semiconductor deposition process grows an in-situ doped semiconductor material from physically exposed semiconductor surfaces around the source cavity 109. The deposited doped semiconductor material forms a source contact layer 114, which may contact sidewalls of the vertical semiconductor channels 60. The atomic concentration of the dopants of the second conductivity type in the deposited semiconductor material may be in a range from $1.0\times10^{20}/cm^3$ to $2.0\times10^{21}/cm^3$, such as from $2.0\times10^{20}/cm^3$ to $8.0\times10^{20}/cm^3$. The source contact layer 114 as initially formed may consist essentially of semiconductor atoms and the dopant atoms of the second conductivity type. Alternatively, at least one non-selective doped semiconductor material deposition process may be used to form the source contact layer 114. Optionally, one or more etch back processes may be used in combination with a plurality of selective or non-selective deposition processes to provide a seamless and/or voidless source contact layer 114.

The duration of the selective semiconductor deposition process may be selected such that the source cavity 109 is filled with the source contact layer 114. In one embodiment, the source contact layer 114 may be formed by selectively depositing a doped semiconductor material from semiconductor surfaces around the source cavity 109. In one embodiment, the doped semiconductor material may include doped polysilicon. Thus, the source-level sacrificial layer 104 may be replaced with the source contact layer 114.

The layer stack including the lower source-level semiconductor layer 112, the source contact layer 114, and the upper source-level semiconductor layer 116 constitutes a source region (112, 114, 116). The source region (112, 114, 116) is electrically connected to a first end (such as a bottom end) of each of the vertical semiconductor channels 60. The set of layers including the source region (112, 114, 116), the source-level insulating layer 117, and the source-select-level conductive layer 118 constitutes source-level material layers 10, which replaces the in-process source-level material layers 10'.

Referring to FIG. 16A-16D, an oxidation process may be performed to convert physically exposed surface portions of semiconductor materials into dielectric semiconductor oxide portions. For example, surfaces portions of the source contact layer 114 and the upper source-level semiconductor layer 116 may be converted into dielectric semiconductor oxide plates 122, and surface portions of the source-select-level conductive layer 118 may be converted into annular dielectric semiconductor oxide spacers 124.

Referring to FIGS. 17A-17D, the sacrificial material layers (142, 242) can be removed selective to the insulating layers (132, 232), the first and second insulating cap layers (170, 270), the first contact-level dielectric layer 280, and the source contact layer 114, the dielectric semiconductor oxide plates 122, and the annular dielectric semiconductor oxide spacers 124. An isotropic etchant that selectively etches the materials of the sacrificial material layers (142, 242) with respect to the materials of the insulating layers (132, 232), the first and second insulating cap layers (170, 270), the retro-stepped dielectric material portions (165, 265), and the material of the outermost layer of the memory films 50 may be introduced into the backside trenches 79, for example, using an isotropic etch process.

The isotropic etch process may be a wet etch process using a wet etch solution, or may be a gas phase (dry) etch process in which the etchant is introduced in a vapor phase into the backside trench 79. For example, if the sacrificial material layers (142, 242) include silicon nitride, the etch process may be a wet etch process in which the exemplary structure is immersed within a wet etch tank including phosphoric acid, which etches silicon nitride selective to silicon oxide, silicon, and various other materials used in the art. The duration of the isotropic etch process may be selected such that the entirety of the sacrificial material layers (142, 242) is removed by the isotropic etch process.

Backside recesses (143, 243) may be formed in volumes from which the sacrificial material layers (142, 242) are removed. The backside recesses (143, 243) include first backside recesses 143 that may be formed in volumes from which the first sacrificial material layers 142 are removed and second backside recesses 243 that may be formed in volumes from which the second sacrificial material layers 242 are removed. Each of the backside recesses (143, 243) may be a laterally extending cavity having a lateral dimension that is greater than the vertical extent of the cavity. In other words, the lateral dimension of each of the backside recesses (143, 243) may be greater than the height of the respective backside recess (143, 243). A plurality of backside recesses (143, 243) may be formed in the volumes from which the material of the sacrificial material layers (142, 242) is removed. Each of the backside recesses (143, 243) may extend substantially parallel to the top surface of the substrate semiconductor layer 9. A backside recess (143, 243) may be vertically bounded by a top surface of an underlying insulating layer (132, 232) and a bottom surface of an overlying insulating layer (132, 232). In one embodiment, each of the backside recesses (143, 243) may have a uniform height throughout.

The first lateral recesses 143 can be laterally bounded by the outer sidewalls of a respective first dielectric moat structure 176. Thus, the outer sidewalls of the first dielectric moat structures 176 are physically exposed to the first lateral recesses 143. The second lateral recesses 243 can be laterally bounded by the outer sidewalls of a respective second dielectric moat structure 276. Thus, the outer sidewalls of the second dielectric moat structures 276 are physically exposed to the second lateral recesses 243. Sidewalls of the dielectric pillar structures 266 are physically exposed to the second lateral recesses 243. A set of dielectric pillar structures 266 can laterally surround a second dielectric moat structure 276, and can be adjoined to a top portion of an underlying first dielectric moat structure 176.

Referring to FIGS. 18A-18E, a backside blocking dielectric layer (not shown) may be optionally deposited in the backside recesses (143, 243) and the backside trenches 79 and over the first contact-level dielectric layer 280. The backside blocking dielectric layer includes a dielectric material such as a dielectric metal oxide, silicon oxide, or a combination thereof. For example, the backside blocking dielectric layer may include aluminum oxide. The backside blocking dielectric layer may be formed by a conformal deposition process such as atomic layer deposition or chemical vapor deposition. The thickness of the backside blocking dielectric layer may be in a range from 1 nm to 20 nm, such as from 2 nm to 10 nm, although lesser and greater thicknesses may also be used.

At least one conductive material may be deposited in the plurality of backside recesses (243, 243), on the sidewalls of the backside trenches 79, and over the first contact-level dielectric layer 280. The at least one conductive material may be deposited by a conformal deposition method, which may be, for example, chemical vapor deposition (CVD), atomic layer deposition (ALD), electroless plating, electroplating, or a combination thereof. The at least one conductive material may include an elemental metal, an intermetallic alloy of at least two elemental metals, a conductive nitride of at least one elemental metal, a conductive metal oxide, a conductive doped semiconductor material, a conductive metal-semiconductor alloy such as a metal silicide, alloys thereof, and combinations or stacks thereof.

In one embodiment, the at least one conductive material may include at least one metallic material, i.e., an electrically conductive material that includes at least one metallic element. Non-limiting exemplary metallic materials that may be deposited in the backside recesses (143, 243) include tungsten, tungsten nitride, titanium, titanium nitride, tantalum, tantalum nitride, cobalt, and ruthenium. For example, the at least one conductive material may include a conductive metallic nitride liner that includes a conductive metallic nitride material such as TiN, TaN, WN, or a combination thereof, and a conductive fill material such as W, Co, Ru, Mo, Cu, or combinations thereof. In one embodiment, the at least one conductive material for filling the backside recesses (143, 243) may be a combination of titanium nitride layer and a tungsten fill material.

Electrically conductive layers (146, 246) may be formed in the backside recesses (143, 243) by deposition of the at least one conductive material. A plurality of first electrically conductive layers 146 may be formed in the plurality of first backside recesses 143, a plurality of second electrically conductive layers 246 may be formed in the plurality of second backside recesses 243, and a continuous metallic material layer (not shown) may be formed on the sidewalls of each backside trench 79 and over the first contact-level dielectric layer 280. Each of the first electrically conductive layers 146 and the second electrically conductive layers 246 may include a respective conductive metallic nitride liner and a respective conductive fill material. Thus, the first and second sacrificial material layers (142, 242) may be replaced with the first and second electrically conductive layers (146, 246), respectively. Specifically, each first sacrificial material layer 142 may be replaced with an optional portion of the backside blocking dielectric layer and a first electrically conductive layer 146, and each second sacrificial material layer 242 may be replaced with an optional portion of the backside blocking dielectric layer and a second electrically conductive layer 246. A backside cavity is present in the portion of each backside trench 79 that is not filled with the continuous metallic material layer.

Residual conductive material may be removed from inside the backside trenches 79. Specifically, the deposited metallic material of the continuous metallic material layer may be etched back from the sidewalls of each backside trench 79 and from above the first contact-level dielectric layer 280, for example, by an anisotropic or isotropic etch. Each remaining portion of the deposited metallic material in the first backside recesses constitutes a first electrically conductive layer 146. Each remaining portion of the deposited metallic material in the second backside recesses constitutes a second electrically conductive layer 246. Sidewalls of the first electrically conductive layers 146 and the second electrically conductive layers may be physically exposed to a respective backside trench 79.

Generally, remaining portions of the first sacrificial material layers 142 located outside the first dielectric moat structures 176 are replaced with the first electrically conductive layers 146, and remaining portions of the second sacrificial material layers 242 outside the second dielectric moat structures 276 are replaced with the second electrically conductive layers 246. Each electrically conductive layer (146, 246) may be a conductive sheet including openings therein. A first subset of the openings through each electrically conductive layer (146, 246) may be filled with memory opening fill structures 58. A second subset of the openings through each electrically conductive layer (146, 246) may be filled with the support pillar structures 20. Each of the memory stack structures 55 comprises a vertical stack of memory elements located at each level of the electrically conductive layers (146, 246). A subset of the electrically conductive layers (146, 246) may comprise word lines for the memory elements. The semiconductor devices in the underlying peripheral device region 700 may comprise word line switch devices configured to control a bias voltage to respective word lines. The memory-level assembly is located over the substrate semiconductor layer 9. The memory-level assembly includes at least one alternating stack {(132, 146), (232, 246)} and memory stack structures 55 vertically extending through the at least one alternating stack (132, 146, 232, 246).

Figure 19A:
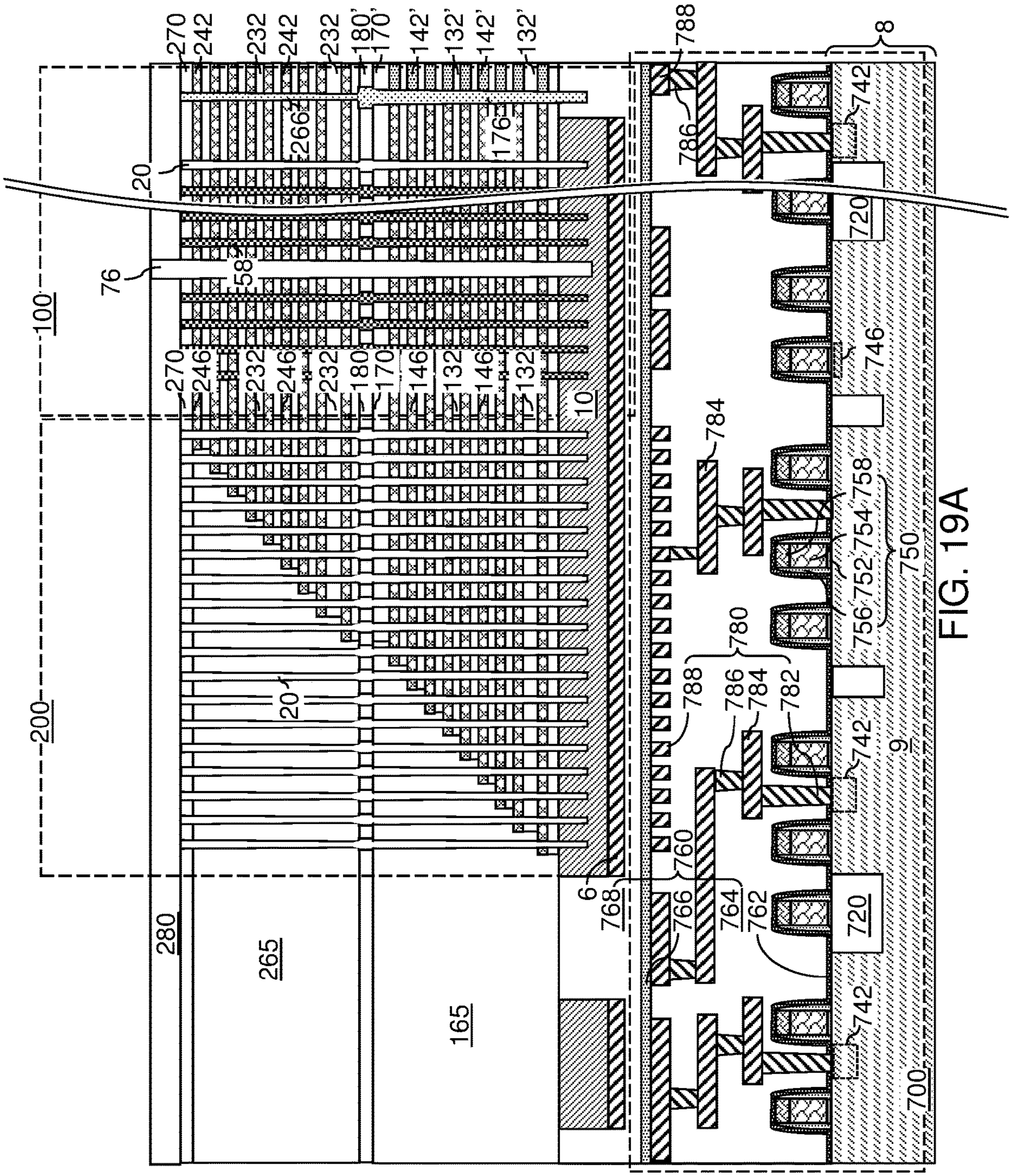
FIG. 19A is a vertical cross-sectional view of the exemplary structure after formation of dielectric wall structures in the backside trenches according to an embodiment of the present disclosure.
Figure 19B:
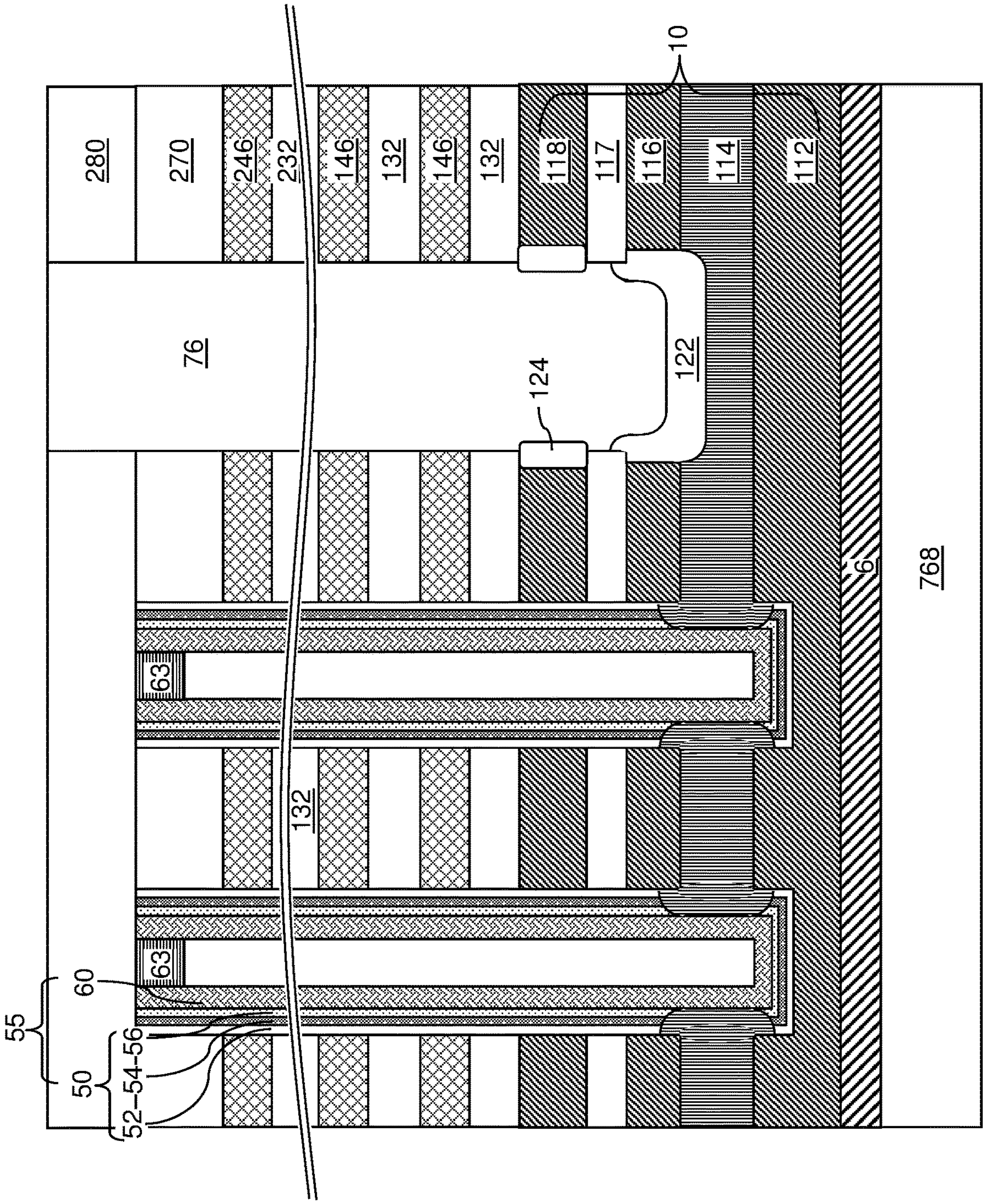
FIG. 19B is a vertical cross-sectional view of a region of the exemplary structure of FIG. 19A.
Figure 20A:
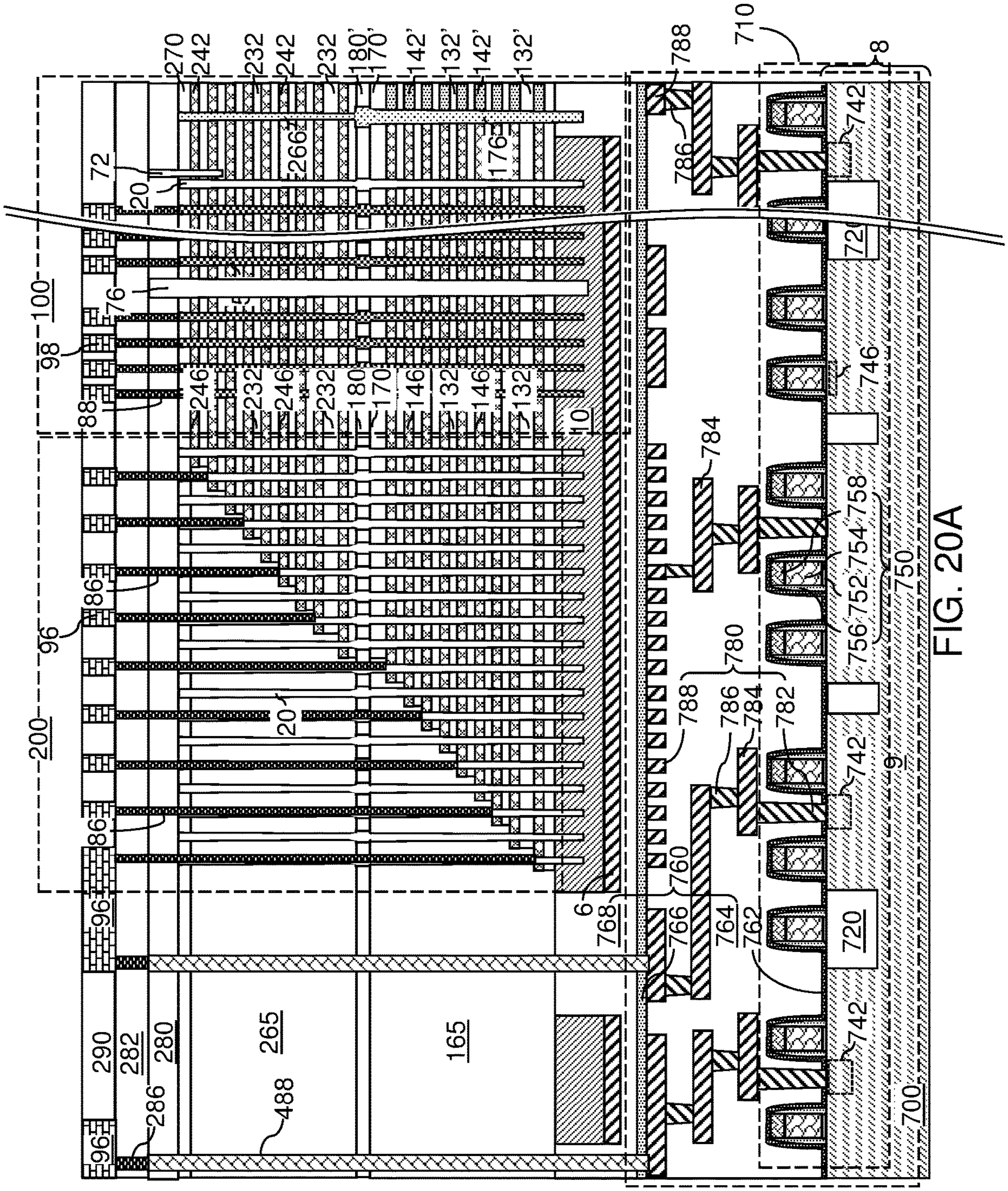
FIG. 20A is a vertical cross-sectional view of the exemplary structure after formation of upper-level dielectric material layers and upper-level metal interconnect structures according to an embodiment of the present disclosure.
Figure 20B:
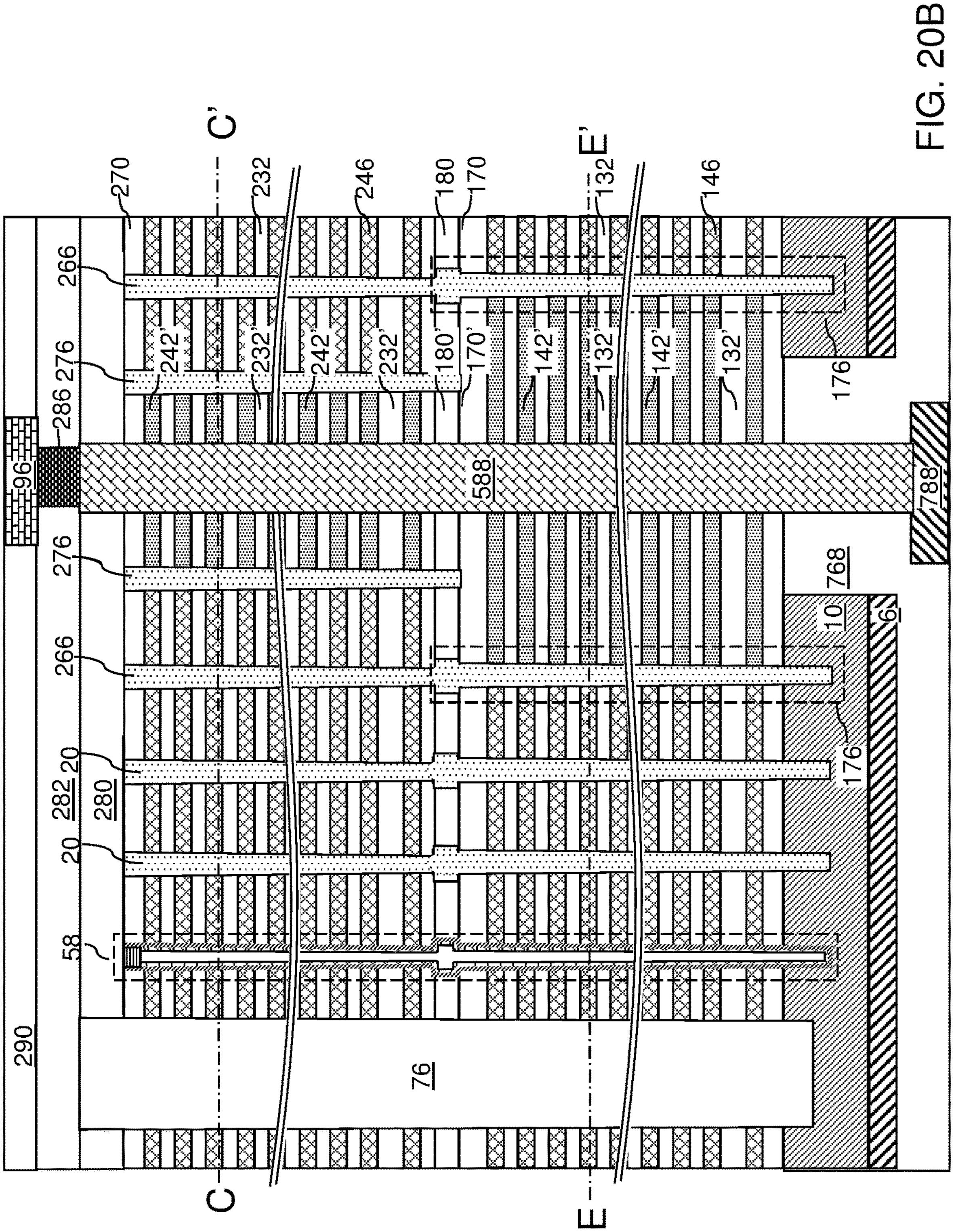
FIG. 20B is another vertical cross-sectional view of the exemplary structure of FIG. 20A.
Figure 20C:
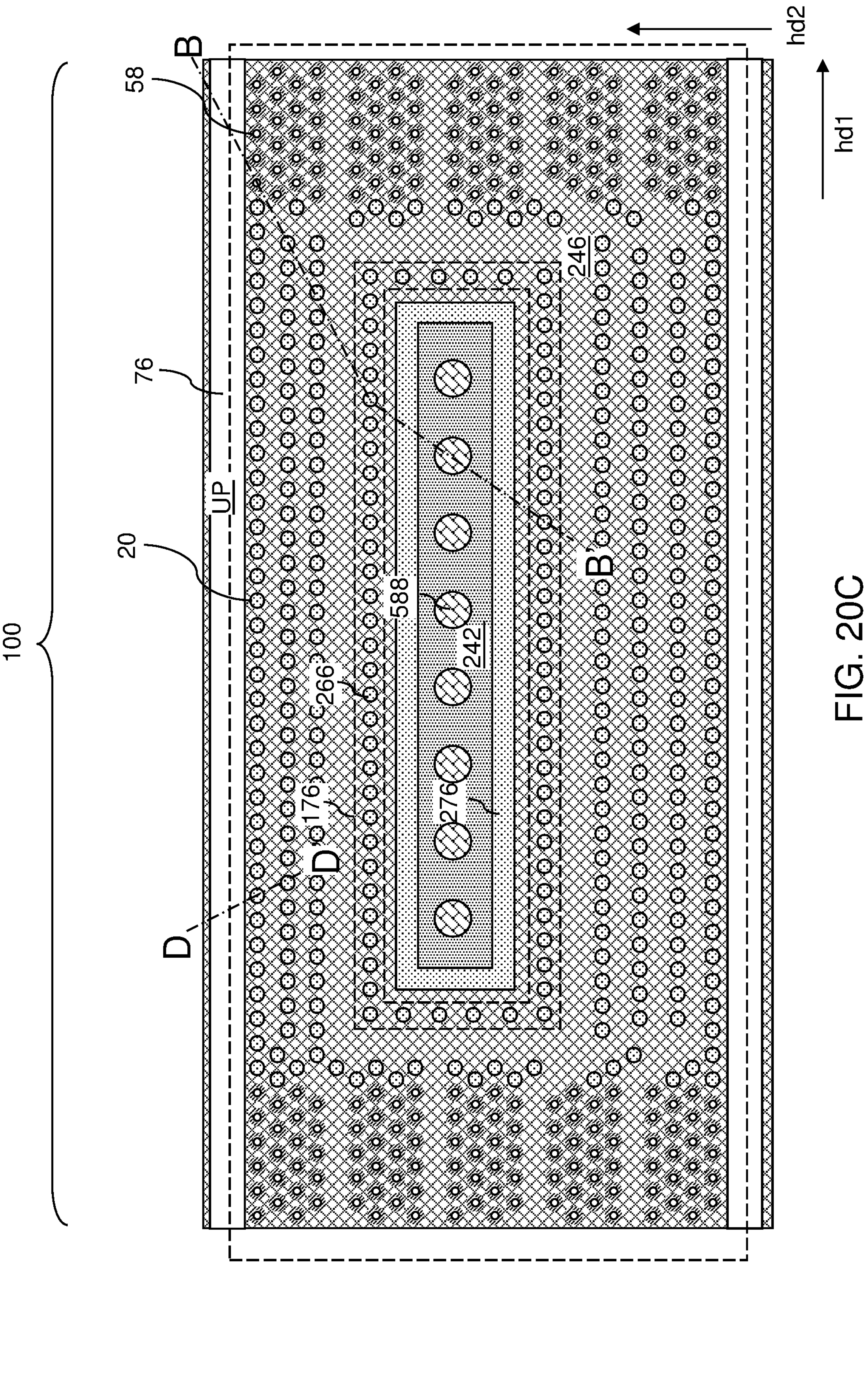
FIG. 20C is a horizontal cross-sectional view of the exemplary structure along the horizontal plane C-C' of FIG. 20B. The hinged vertical plane B-B' corresponds to the plane of the vertical cross-sectional view of FIG. 20B.
Figure 20D:
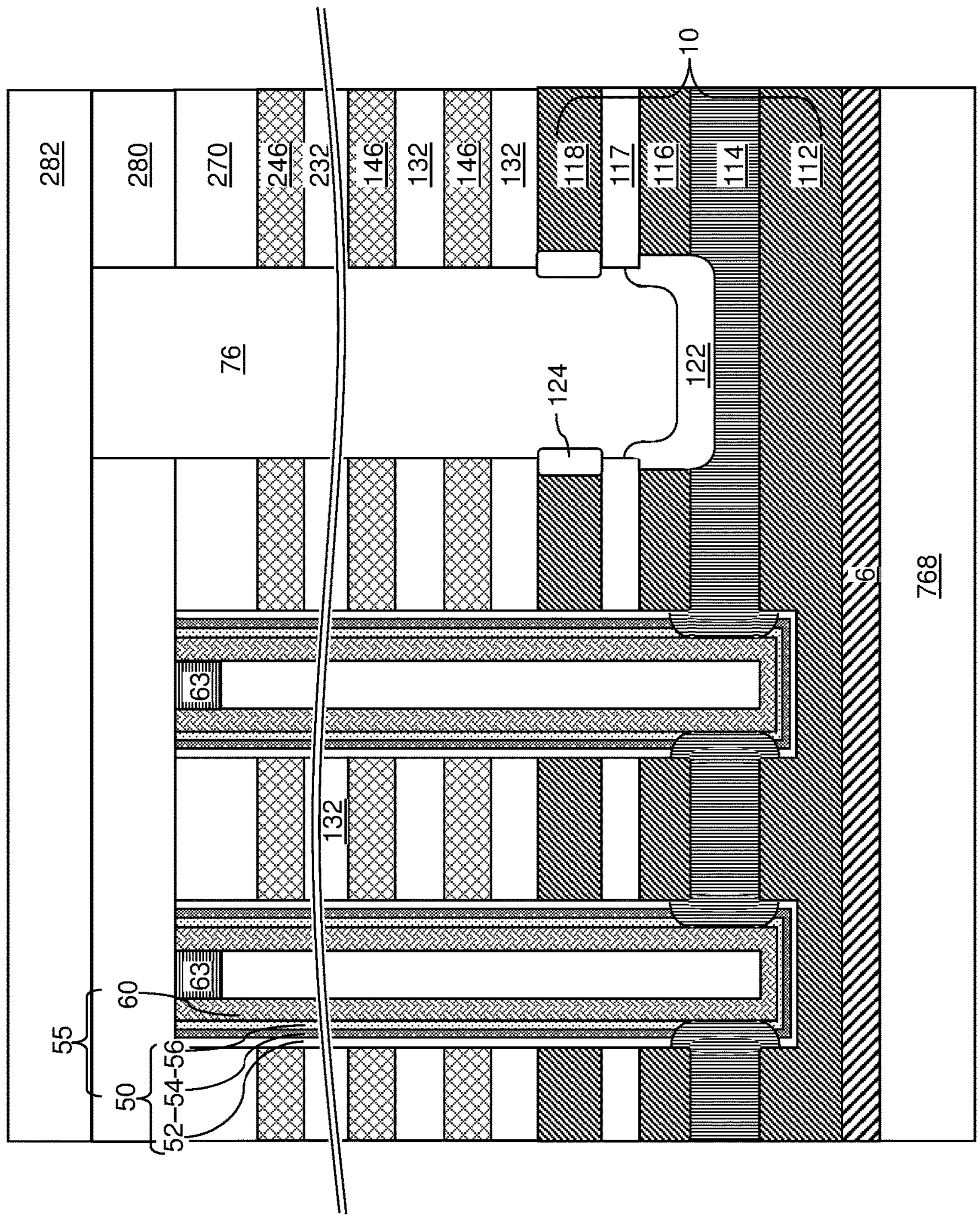
FIG. 20D is a vertical cross-sectional view of a region of the exemplary structure along the vertical plane D-D' of FIG. 20C.
Figure 20E:
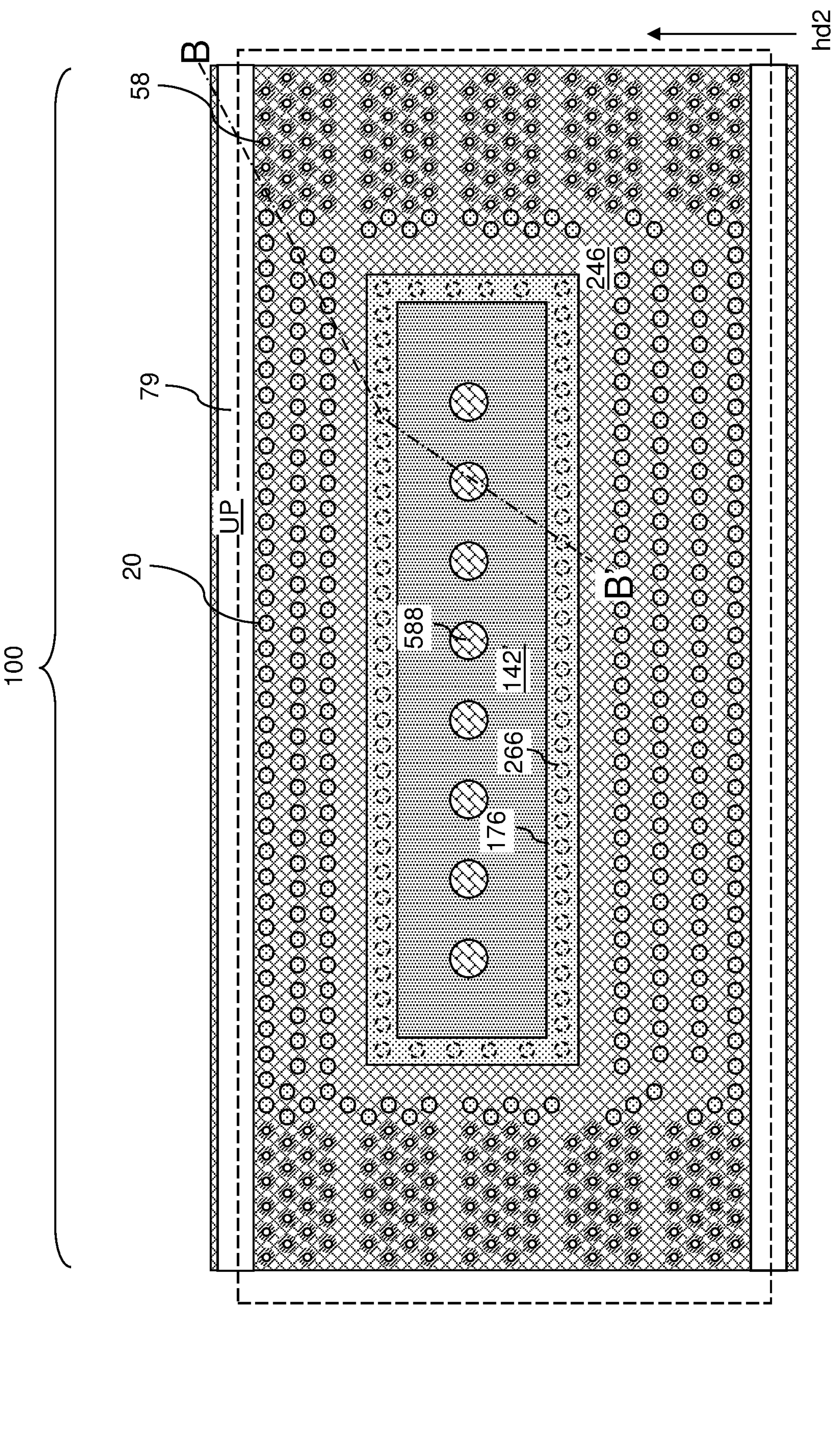
FIG. 20E is a horizontal cross-sectional view of the exemplary structure along the horizontal plane E-E' of FIG. 20B. The hinged vertical plane B-B' corresponds to the plane of the vertical cross-sectional view of FIG. 20B.

Referring to FIGS. 19A and 19B, a dielectric material can be deposited in unfilled volumes of the backside trenches 79. Excess portions of the dielectric material may be removed from above the top surface of the first contact-level dielectric layer 280 by a planarization process, which may employ a recess etch process or a chemical mechanical planarization process. Each remaining portion of the dielectric material filling a backside trench 79 constitutes a dielectric wall structure 76. The dielectric wall structures 76 can laterally extend along the first horizontal direction hd1, and includes a dielectric material such as undoped silicate glass or a doped silicate glass.

Referring to FIGS. 20A-20E, through-memory-level interconnection via structures (588, 488) can be formed through the levels of the first-tier alternating stack (132, 146) and the second-tier alternating stack (232, 246). The through-memory-level interconnection via structures (588, 488) include array-region through-memory-level interconnection via structures 588 and peripheral through-memory-level interconnection via structures 488. The array-region through-memory-level interconnection via structures 588 can be formed through the first vertical stack of first insulating plates 132' and the first dielectric material plates 142' and through the second vertical stack of second insulating plates 232' and second dielectric material plates 242' in the area of each unit pattern UP. The peripheral through-memory-level interconnection via structures 488 can be formed through the retro-stepped dielectric material portions (165, 265). Each of the array-region through-memory-level interconnection via structures 588 and the peripheral through-memory-level interconnection via structures 488 can be formed on a respective one of the landing-pad-level metal line structures 788, which are a subset of the lower-level metal interconnect structures 780 embedded in the lower-level dielectric material layers 760. Each array-region through-memory-level interconnection via structures 588 is laterally surrounded by a first dielectric moat structure 176 and a second dielectric moat structure 276, and can vertically extend through the vertical levels of each insulating layer (132, 232) and electrically conductive layers (146, 246).

Subsequently, upper-level dielectric material layers (282, 290) and upper-level metal interconnect structures (88, 86, 286, 98, 96) can be formed. The upper-level dielectric material layers (282, 290) can include a second contact-level dielectric layer 282 and a first line-level dielectric layer 290. The upper-level metal interconnect structures (88, 86, 286, 98, 96) can include drain contact via structures 88, word line layer contact via structures 86, connection via structures 286, bit lines 98, and connection metal lines 96. The drain contact via structures 88 extend through the first contact-level dielectric layer 280 and the second contact-level dielectric layer 282 and contact a respective one of the drain regions 63. The word line layer contact via structures 86 extend through the first contact-level dielectric layer 280, the second contact-level dielectric layer 282, the second retro-stepped dielectric material portion 265, and optionally through the first retro-stepped dielectric material portion 165, and contact a respective one of the electrically conductive layers (e.g., word lines) (146, 246). The connection via structures 286 extend through the second contact-level dielectric layer 282, and contact a top surface of a respective one of the array-region through-memory-level interconnection via structures 588 and the peripheral through-memory-level interconnection via structures 488. Thus, each of the array-region through-memory-level interconnection via structures 588 and the peripheral through-memory-level interconnection via structures 488 can be electrically connected to a bottom surface of one of the upper-level metal interconnect structures, such as a bottom surface of a connection metal line 96. The bit lines 98 are embedded in the first line-level dielectric layer 290, and contact a respective subset of the drain contact via structures 88. The connection metal lines 96 are embedded in the first line-level dielectric layer 290, and contacts a respective subset of via structures such as the word line layer contact via structures 86 and/or the connection via structures 286. Additional upper-level dielectric material layers (not shown) and additional upper-level metal interconnect structures (not shown) may be formed as needed.

Generally, at least one through-memory-level interconnection via structure (such as at least one array-region through-memory-level interconnection via structure 588) can be formed through a first vertically alternating sequence of first insulating plates 132' and first dielectric material plates 142' and through an overlying second vertically alternating sequence of second insulating plates 232' and second dielectric material plates 242'. The at least one through-memory-level interconnection via structure (such as at least one array-region through-memory-level interconnection via structure 588) can be formed through a volume that is laterally surrounded by the combination of the first dielectric moat structure 176 and the plurality of dielectric pillar structures 266 adjoined thereto, and be located directly on a respective one of the lower-level metal interconnect structures 780 such as a landing-pad-level metal line structure 788. Each through-memory-level interconnection via structure (588, 488) vertically extends at least from a horizontal plane including a top surface of the second-tier alternating stack (232, 246) down to a metal interconnect structure (such as a landing-pad-level metal line structure 788) underlying a horizontal plane including a bottom surface of a semiconductor material layer (such as a source contact layer 114).

Referring to all drawings and according to various embodiments of the present disclosure, a three-dimensional memory device is provided, which comprises: a first-tier alternating stack of first insulating layers 132 and first electrically conductive layers 146 located over a semiconductor material layer (such as a source contact layer 114); a second-tier alternating stack of second insulating layers 232 and second electrically conductive layers 246 located over the first alternating stack (132, 146); memory stack structures 55 vertically extending through the second-tier alternating stack (232, 246) and the first-tier alternating stack (132, 146); a first dielectric moat structure 176 vertically extending through the first-tier alternating stack (132, 146) and laterally surrounding a first vertically alternating sequence of first insulating plates 132' and first dielectric material plates 142'; a plurality of dielectric pillar structures 266 vertically extending through the second-tier alternating stack (232, 246) and contacting a top surface of the first dielectric moat structure 176; and at least one through-memory-level interconnection via structure (such as at least one array-region through-memory-level interconnection via structure 588) vertically extending at least from a horizontal plane including a top surface of the second-tier alternating stack (232, 246), through the first vertically alternating sequence of first insulating plates 132' and first dielectric material plates 142', and down to a respective metal interconnect structure (such as a landing-pad-level metal line structure 788) underlying a horizontal plane including a bottom surface of the semiconductor material layer (such as the source contact layer 114).

In one embodiment, a combination of the first dielectric moat structure 176 and the plurality of dielectric pillar structures 266 consists of a single continuously-extending dielectric material portion (such as an undoped silicate glass portion or a doped silicate glass portion) having a uniform material composition throughout.

In one embodiment, a second dielectric moat structure 276 vertically extends through the second-tier alternating stack (232, 246), laterally surrounds a second vertically alternating sequence of second insulating plates 232' and second dielectric material plates 242', and overlies the first vertically alternating sequence of first insulating plates 132' and first dielectric material plates 142'. In one embodiment, a bottom periphery of outer sidewalls of the second dielectric moat structure 276 is laterally recessed inward relative to a top periphery of inner sidewalls of the first dielectric moat structure 176. In one embodiment, the at least one through-memory-level interconnection via structure (such as at least one array-region through-memory-level interconnection via structure 588) vertically extends through, and directly contacts, the second vertically alternating sequence of second insulating plates 232' and second dielectric material plates 242'.

In one embodiment, outer sidewalls of the first dielectric moat structure 176 contact the first insulating layers 132 of the first-tier alternating stack (132, 146) and the first electrically conductive layers 146 or backside blocking dielectric layers embedding the first electrically conductive layers 146. Outer sidewalls of the second dielectric moat structure 276 contact the second insulating layers 232 of the second-tier alternating stack (232, 246) and the second electrically conductive layers 246 or backside blocking dielectric layers embedding the second electrically conductive layers 246.

In one embodiment, each of the first insulating plates 132' is vertically spaced from a top surface of the semiconductor material layer (such as the source contact layer 114) by a same vertical distance as a respective first insulating layer 132 in the first-tier alternating stack (132, 146) is from the top surface of the semiconductor material layer, and each of the second insulating plates 232' is vertically spaced from the top surface of the semiconductor material layer by a same vertical distance as a respective second insulating layer 232 in the second-tier alternating stack (232, 246) is from the top surface of the semiconductor material layer.

In one embodiment, a bottom surface of the second dielectric moat structure 276 is located above, or at, a horizontal plane including a topmost surface of the first-tier alternating stack (132, 246), or extends into the first-tier alternating stack (132, 146) and is located above at least one layer within the first-tier alternating stack (132, 146).

In one embodiment, a semiconductor substrate 8 underlies the semiconductor material layer (such as the source contact layer 114), and semiconductor devices 710 are located on the semiconductor substrate 8. Lower-level dielectric material layers 760 overlie the semiconductor devices 710, and underlie the semiconductor material layer (such as the source contact layer 114). Lower-level metal interconnect structures 780 can be embedded in the lower-level dielectric material layers 760. Each of the at least one through-memory-level interconnection via structure (such as at least one array-region through-memory-level interconnection via structure 588) contacts a respective one of the lower-level metal interconnect structures 780. In one embodiment, the semiconductor material layer 114 contains an opening in an area that underlies the first vertically alternating sequence of first insulating plates 132' and first dielectric material plates 142', and the at least one through-memory-level interconnection via structure extends through the opening in the semiconductor material layer.

In one embodiment, the first-tier alternating stack (132, 146) and the second-tier alternating stack (232, 246) laterally extend along a first horizontal direction hd1 and have a uniform width along a second horizontal direction hd2 that is perpendicular to the first horizontal direction hd1; and the three-dimensional memory device comprises a pair of backside trench fill structures (such as dielectric wall structures 76) laterally extending along the first horizontal direction hd1, laterally spaced from each other along the second horizontal direction hd2, and contacting respective sidewalls of the first-tier alternating stack (132, 146) and the second-tier alternating stack (232, 246).

In one embodiment, each of the memory stack structures 55 comprises a respective memory film 50 and a respective vertical semiconductor channel 60; and each of the vertical semiconductor channels 60 contacts the semiconductor material layer (such as the source contact layer 114).

In one embodiment, the three-dimensional memory device can comprise support pillar structures 20 including, and/or consisting essentially of, a same dielectric material as the first dielectric moat structure 176 and the plurality of dielectric pillar structures 266. The support pillar structures 20 vertically extend through the first-tier alternating stack (132, 146) and the second-tier alternating stack (232, 246).

In one embodiment, a first subset of the memory stack structures 55 is located in a first portion of a memory array region 100 in which each layer of the first-tier alternating stack (132, 146) and each layer of the second-tier alternating stack (232, 246) are present, and a second subset of the memory stack structures 55 is located in a second portion of the memory array region 100 in which each layer of the first-tier alternating stack (132, 146) and each layer of the second-tier alternating stack (232, 246) is present. The second portion of the memory array region 100 is laterally spaced from the first portion of the memory array region 100 along a first horizontal direction hd1. In one embodiment, the first dielectric moat structure 176, the plurality of dielectric pillar structures 266, the at least one through-memory-level interconnection via structure (such as at least one array-region through-memory-level interconnection via structure 588), and the support pillar structures 20 are located in an intermediate portion of the memory array region 100 located between the first portion of the memory array region 100 and the second portion of the memory array region 100.

Line trenches such as the first-tier moat trenches 179 and the second-tier moat trenches 279 may be formed with lateral wiggles along a horizontal direction that is perpendicular to the lengthwise direction of the trenches. Such lateral wiggles may be caused by the instability of an anisotropic etch process that etches through dielectric material layers, such as the first-tier alternating stack of the first insulating layers 132 and the first sacrificial material layers 142 and the second-tier alternating stack of the second insulating layers 232 and the second sacrificial material layers 242. In contrast, isolated cavities such as the pillar cavities 269 are formed with straight profiles. By employing pillar cavities 269 to connect to the sacrificial moat trench fill structures 178, the sacrificial moat trench fill structures 178 can be replaced with a respective first dielectric moat structure 176 with enhanced reliability. The lateral wiggle of the bottom portion of the second-tier moat trenches 279 would not affect the functionality of the three-dimensional semiconductor device because the second-tier moat trenches 279 are not required to expose the underlying sacrificial moat trench fill structures 178 to remove such sacrificial moat trench fill structures 178. The second dielectric moat structures 276 can laterally surround a respective second vertically alternating sequence of second insulating plates 232' and second dielectric material plates 242' irrespective of any lateral wiggles therein.

Figure 7A:
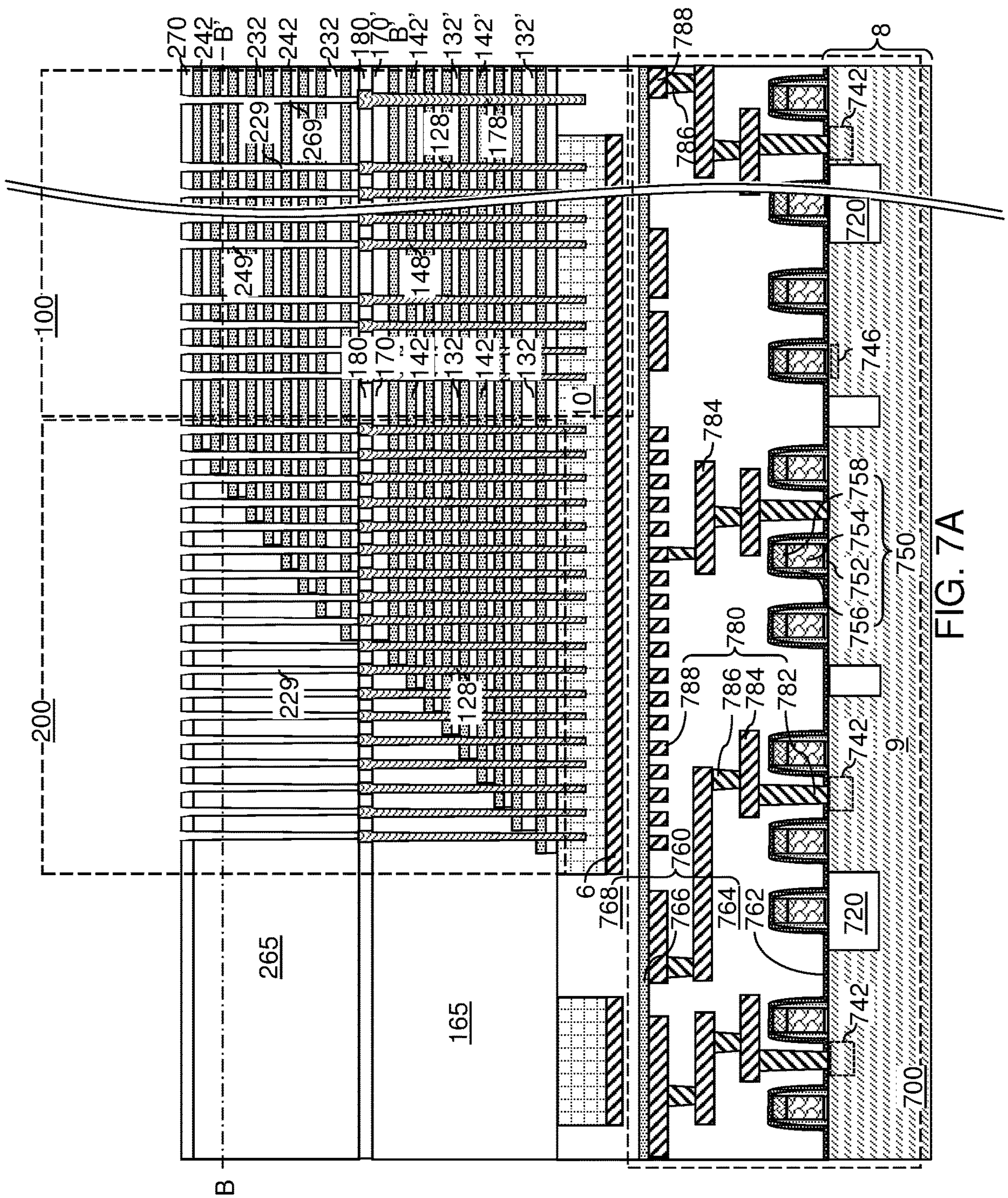
FIG. 7A is a vertical cross-sectional view of the exemplary structure after formation of second-tier memory openings, second-tier support openings, pillar cavities, and a second-tier moat trench according to an embodiment of the present disclosure.
Figure 7B:
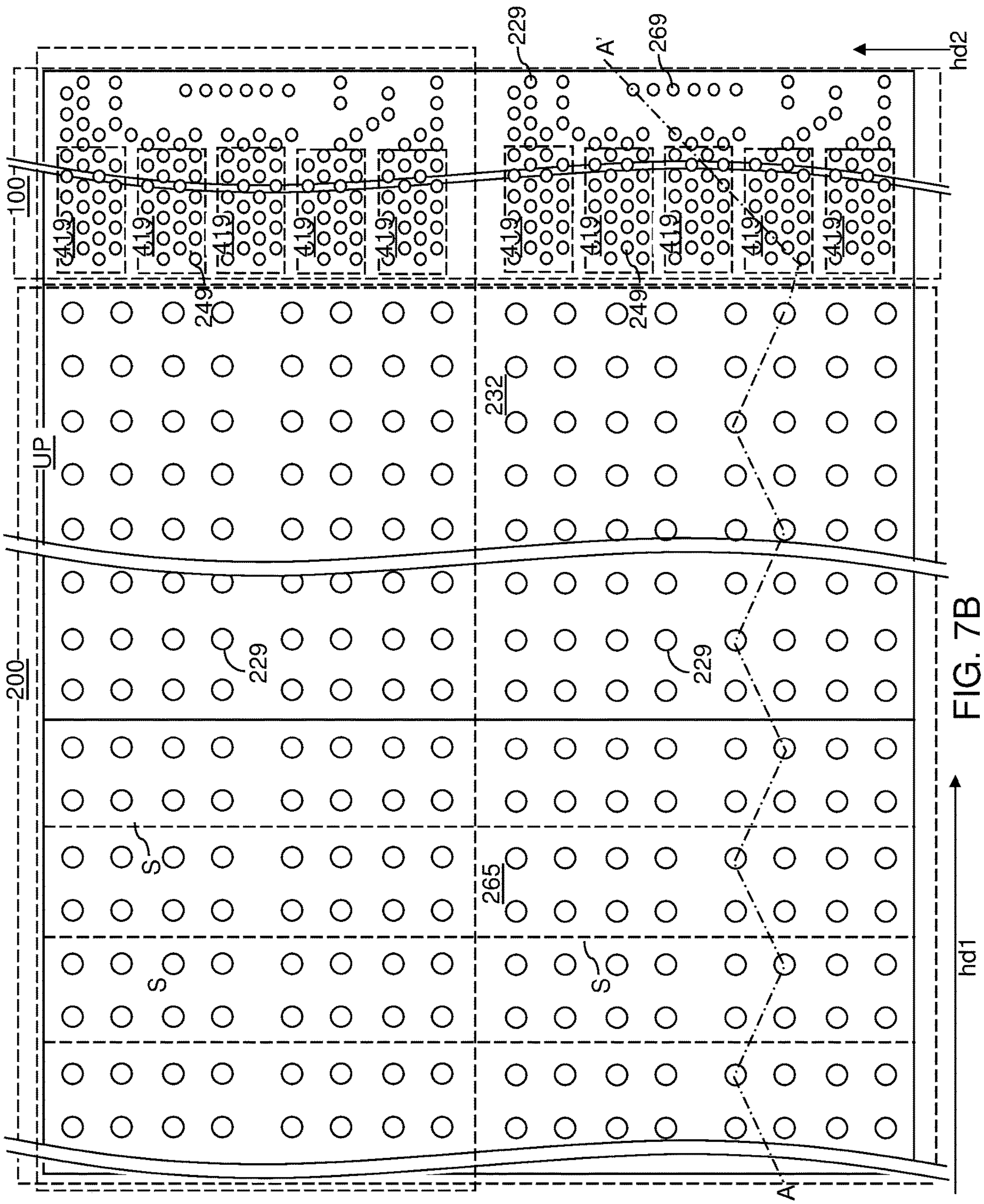
FIG. 7B is a horizontal cross-sectional view of the exemplary structure of FIG. 7A along the plane B-B'. The hinged vertical plane A-A' corresponds to the plane of the vertical cross-sectional view of FIG. 7A.
Figure 7C:
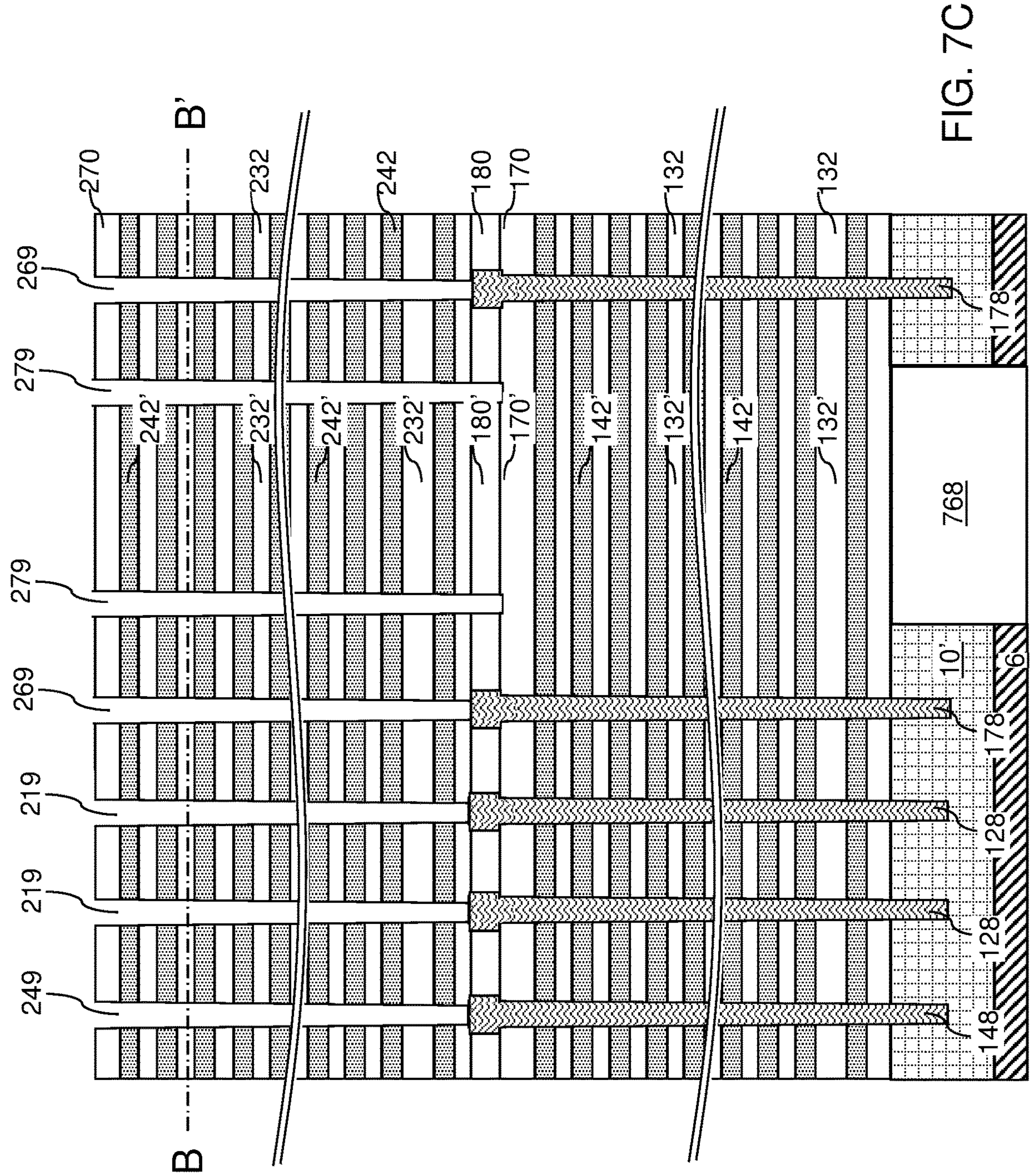
FIG. 7C is another vertical cross-sectional view of the exemplary structure of FIGS. 7A and 7B.
Figure 7D:
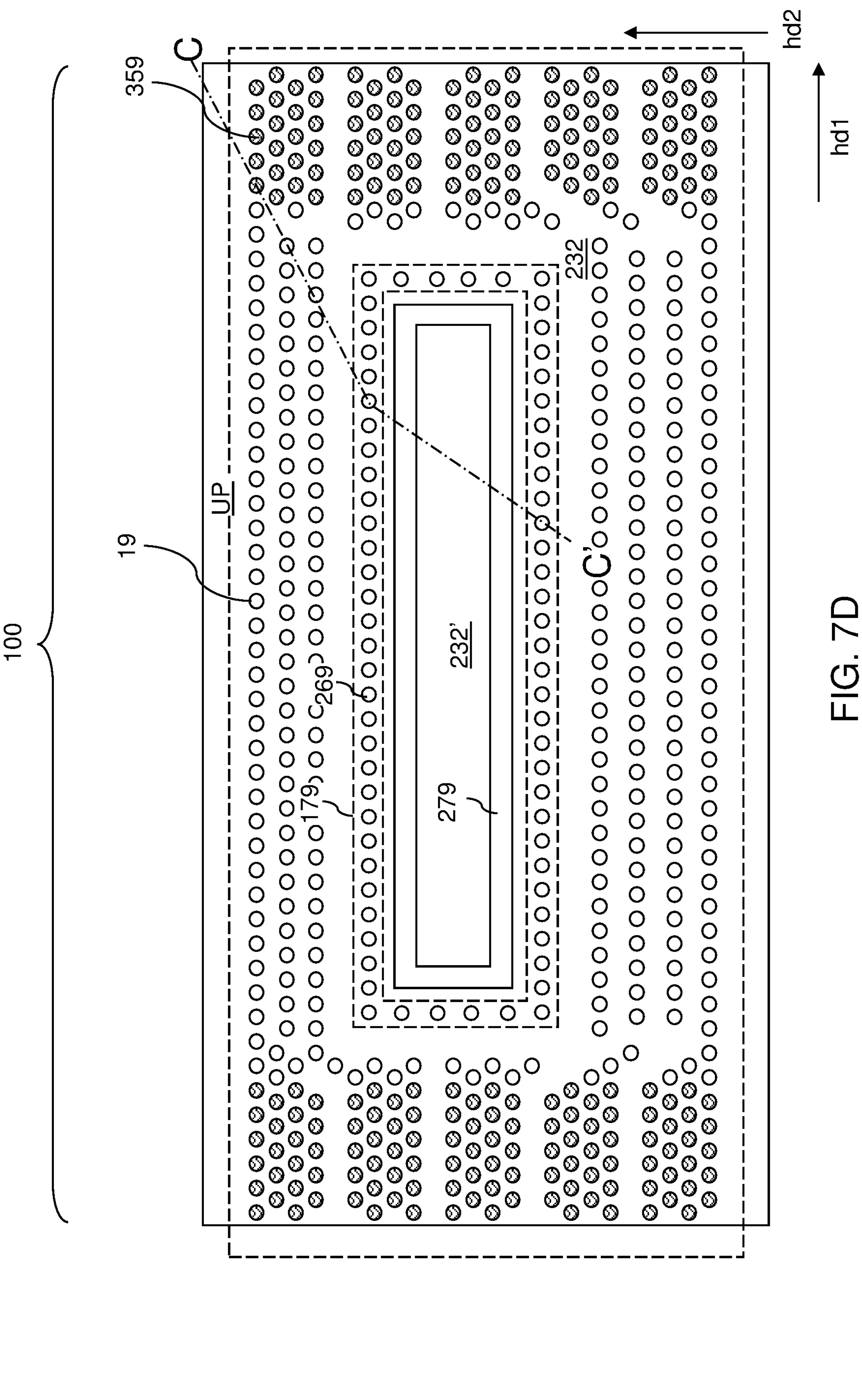
FIG. 7D is a horizontal cross-sectional view of another area of the exemplary structure of FIG. 7A at the height of the horizontal plane B-B'. The hinged vertical plane C-C' corresponds to the plane of the vertical cross-sectional view of FIG. 7C.
Figure 8A:
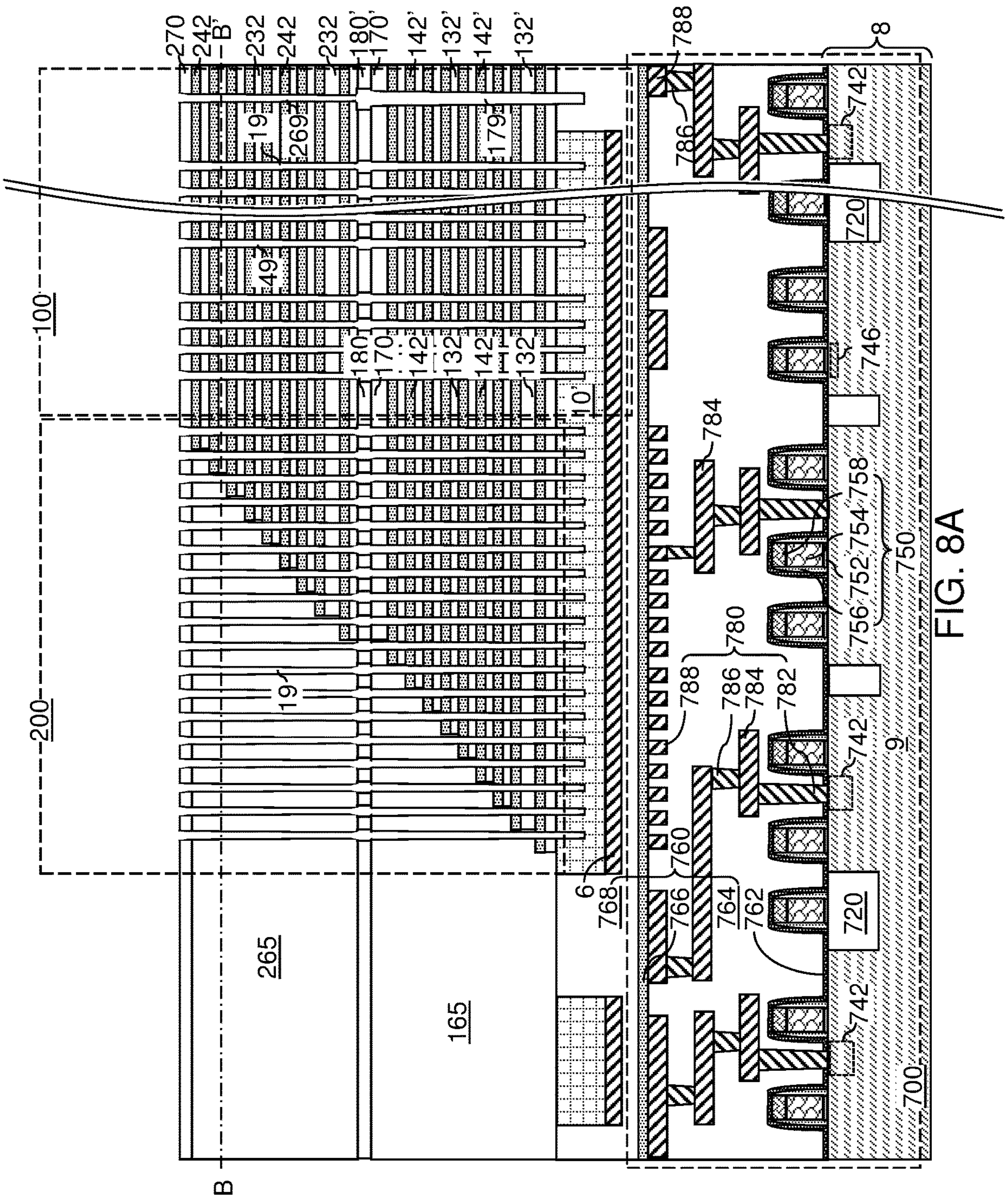
FIG. 8A is a vertical cross-sectional view of the exemplary structure after formation of inter-tier memory openings, inter-tier support openings, and a buried moat trench connected to pillar cavities according to an embodiment of the present disclosure.
Figure 8B:
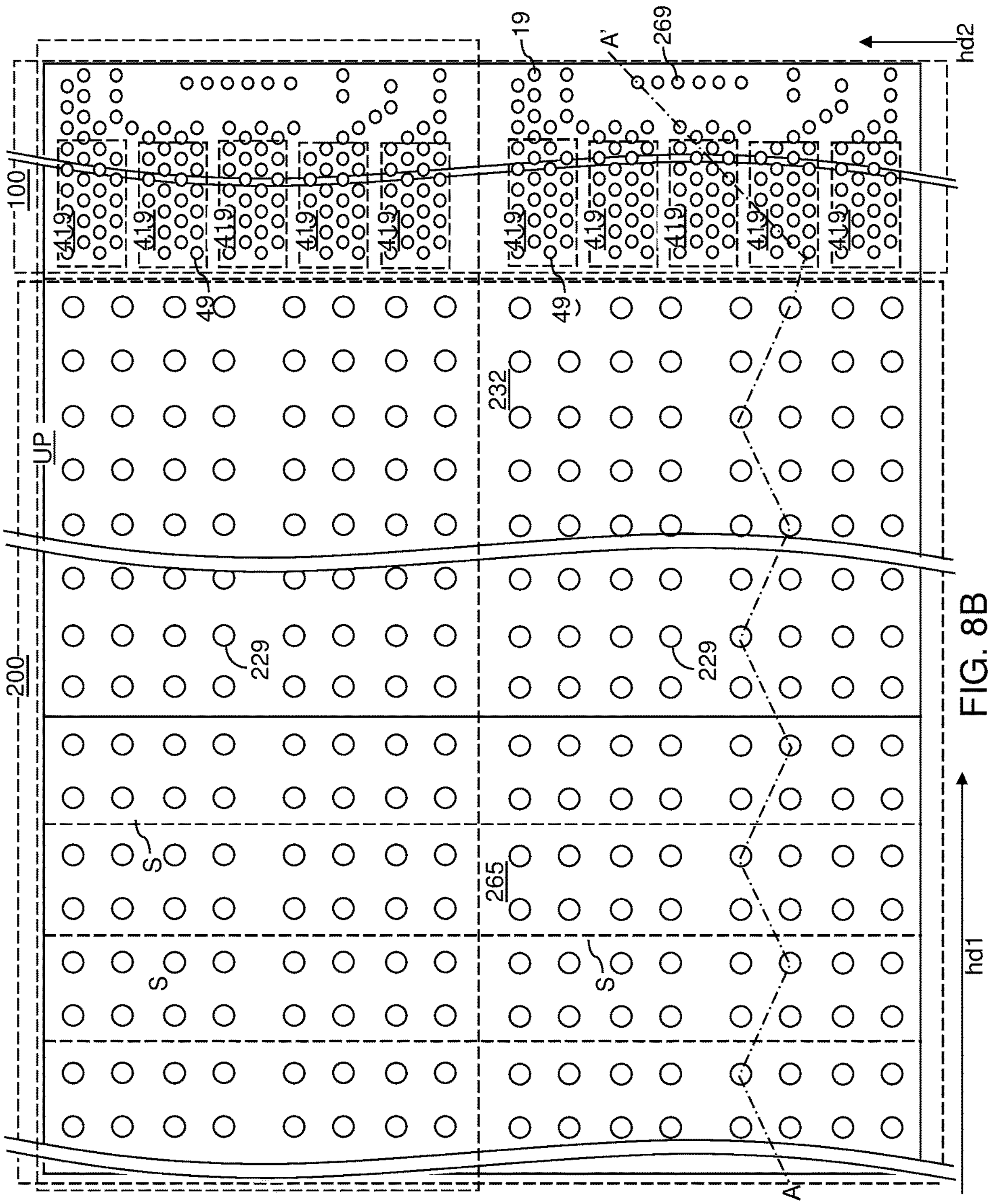
FIG. 8B is a horizontal cross-sectional view of the exemplary structure of FIG. 8A along the plane B-B'. The hinged vertical plane A-A' corresponds to the plane of the vertical cross-sectional view of FIG. 8A.
Figure 8C:
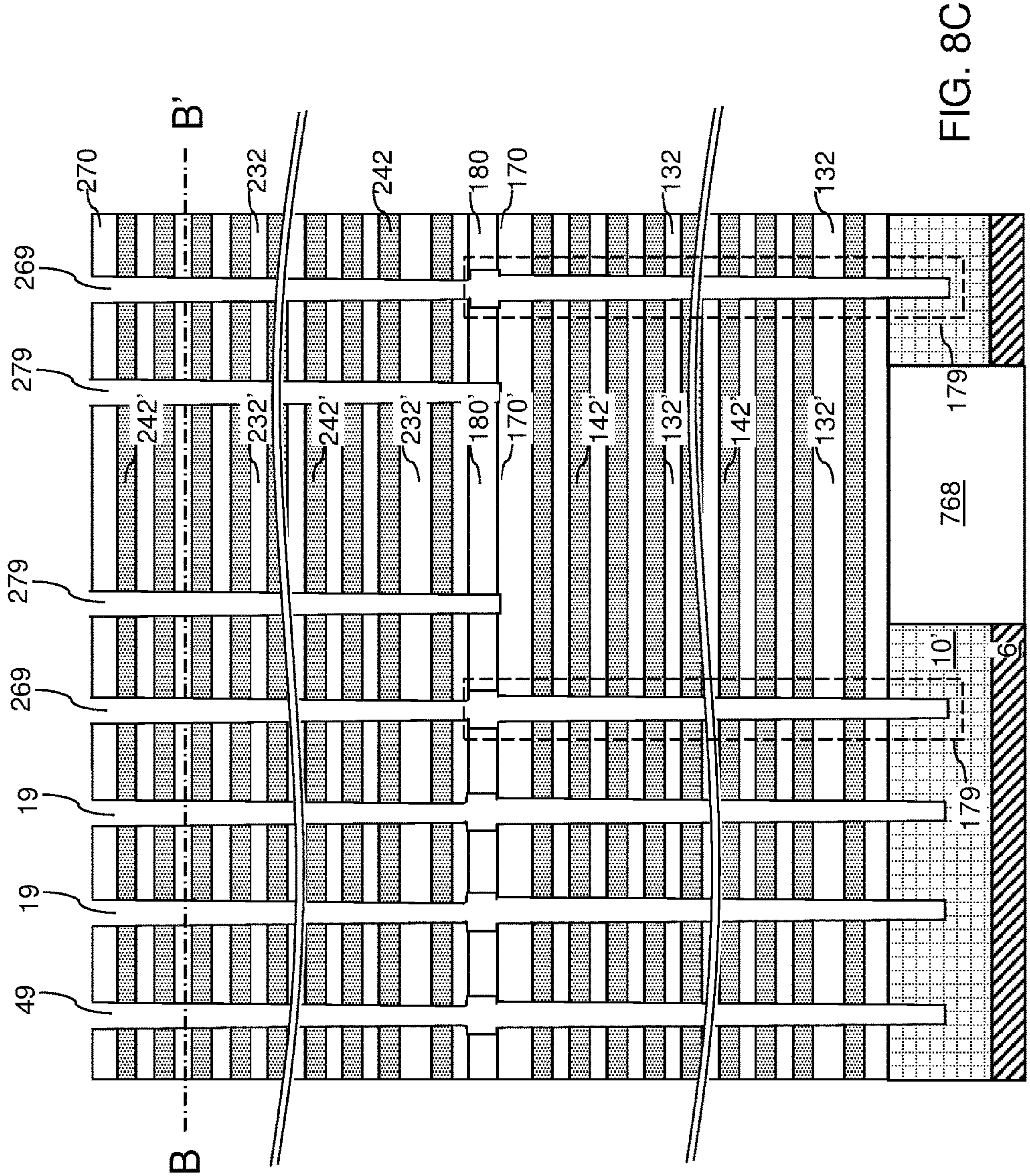
FIG. 8C is another vertical cross-sectional view of the exemplary structure of FIGS. 8A and 8B.
Figure 8D:
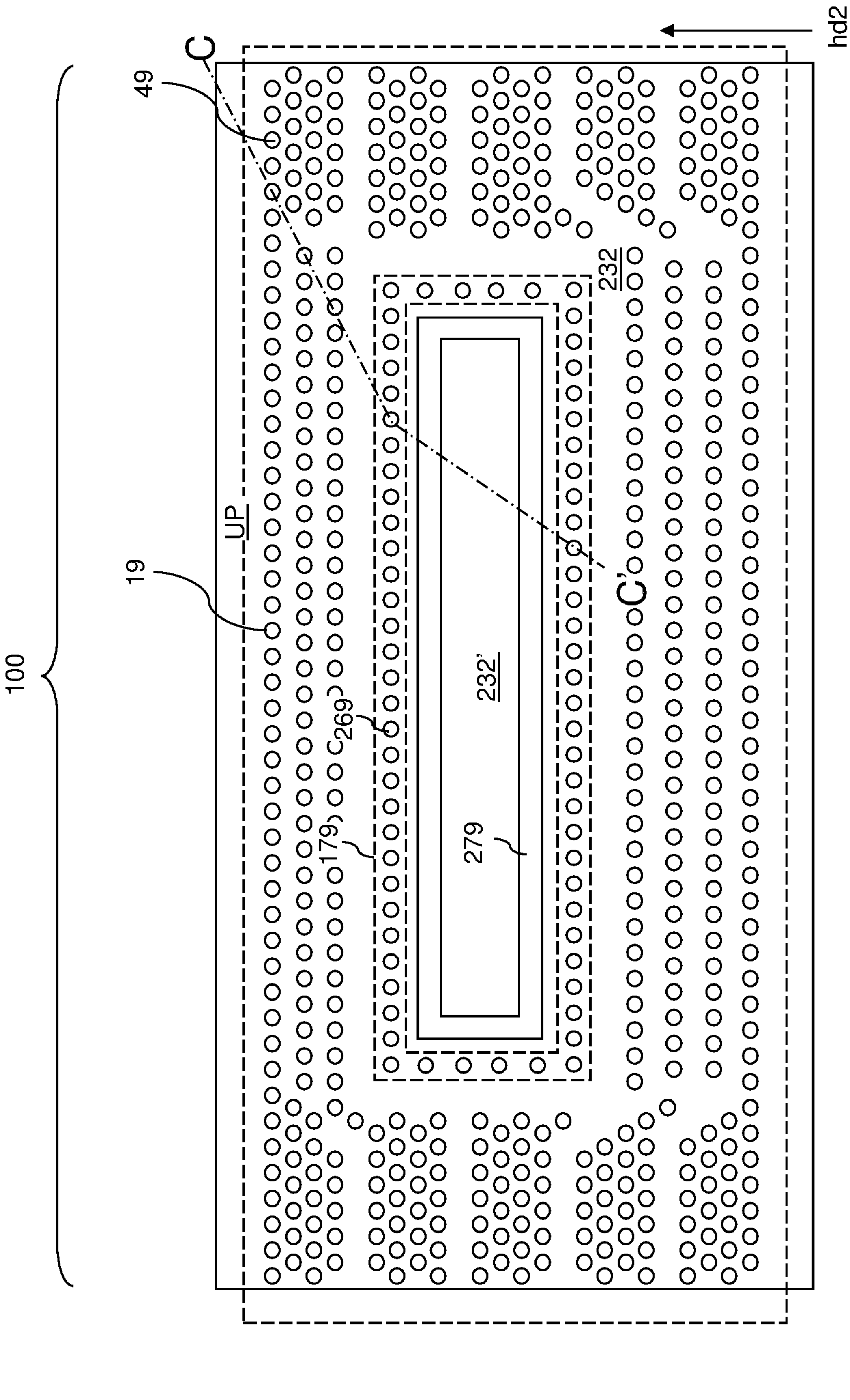
FIG. 8D is a horizontal cross-sectional view of another area of the exemplary structure of FIG. 8A at the height of the horizontal plane B-B'. The hinged vertical plane C-C' corresponds to the plane of the vertical cross-sectional view of FIG. 8C.

In an alternative embodiment, if there are no lateral wiggles in the line trenches, such as the first-tier moat trenches 179 and the second-tier moat trenches 279, then the formation of the pillar cavities 269 in FIGS. 7A-7C may be omitted, and the second-tier moat trenches 279 may be formed directly on the underlying sacrificial moat trench fill structures 178 which fill the first-tier moat trenches 179. The sacrificial moat trench fill structures 178 are then removed through the second-tier moat trenches 279 in the steps shown in FIGS. 8A-8D. The number of process steps is reduced by forming the first and second second-tier moat trenches (179, 279) and the support openings 19 in the same etching step, and by filling at least one of the first and second second-tier moat trenches (179, 279) and the support openings 19 with the same dielectric material during the same deposition step to form the dielectric moat structures and the support pillar structures 20. Furthermore, by forming the backside trenches 79 after forming the dielectric moat structures (176, 276) reduces the likelihood that the alternating stacks will topple into the backside trenches 79.

Although the foregoing refers to particular embodiments, it will be understood that the disclosure is not so limited. It will occur to those of ordinary skill in the art that various modifications may be made to the disclosed embodiments and that such modifications are intended to be within the scope of the disclosure. Compatibility is presumed among all embodiments that are not alternatives of one another. The word "comprise" or "include" contemplates all embodiments in which the word "consist essentially of" or the word "consists of" replaces the word "comprise" or "include," unless explicitly stated otherwise. Where an embodiment using a particular structure and/or configuration is illustrated in the present disclosure, it is understood that the present disclosure may be practiced with any other compatible structures and/or configurations that are functionally equivalent provided that such substitutions are not explicitly forbidden or otherwise known to be impossible to one of ordinary skill in the art. All of the publications, patent applications and patents cited herein are incorporated herein by reference in their entirety.

What is claimed is:

1. A three-dimensional memory device comprising:

a first-tier alternating stack of first insulating layers and first electrically conductive layers located over a semiconductor material layer;

a second-tier alternating stack of second insulating layers and second electrically conductive layers located over the first alternating stack;

memory stack structures vertically extending through the second-tier alternating stack and the first-tier alternating stack;

a first dielectric moat structure vertically extending through the first-tier alternating stack and laterally surrounding a first vertically alternating sequence of first insulating plates and first dielectric material plates;

a plurality of dielectric pillar structures vertically extending through the second-tier alternating stack and contacting a top surface of the first dielectric moat structure; and at least one through-memory-level interconnection via structure vertically extending at least from a horizontal plane including a top surface of the second-tier alternating stack, through the first vertically alternating sequence of first insulating plates and first dielectric material plates, and down to a respective metal interconnect structure underlying a horizontal plane including a bottom surface of the semiconductor material layer.

2. The three-dimensional memory device of claim 1, wherein a combination of the first dielectric moat structure and the plurality of dielectric pillar structures consists of a single continuously-extending dielectric material portion having a uniform material composition throughout.

3. The three-dimensional memory device of claim 1, further comprising a second dielectric moat structure vertically extending through the second-tier alternating stack and laterally surrounding a second vertically alternating sequence of second insulating plates and second dielectric material plates and overlying the first vertically alternating sequence of first insulating plates and first dielectric material plates.

4. The three-dimensional memory device of claim 3, wherein a bottom periphery of outer sidewalls of the second dielectric moat structure is laterally recessed inward relative to a top periphery of inner sidewalls of the first dielectric moat structure.

5. The three-dimensional memory device of claim 3, wherein the at least one through-memory-level interconnection via structure vertically extends through the second vertically alternating sequence of second insulating plates and second dielectric material plates.

6. The three-dimensional memory device of claim 3, wherein:

outer sidewalls of the first dielectric moat structure contact the first insulating layers of the first-tier alternating stack; and outer sidewalls of the second dielectric moat structure contact the second insulating layers of the second-tier alternating stack.

7. The three-dimensional memory device of claim 3, wherein:

each of the first insulating plates is vertically spaced from a top surface of the semiconductor material layer by a same vertical distance as a respective first insulating layer in the first-tier alternating stack is from the top surface of the semiconductor material layer; and each of the second insulating plates is vertically spaced from the top surface of the semiconductor material layer by a same vertical distance as a respective second insulating layer in the second-tier alternating stack is from the top surface of the semiconductor material layer.

8. The three-dimensional memory device of claim 3, wherein a bottom surface of the second dielectric moat structure is located above, or at, a horizontal plane including a topmost surface of the first-tier alternating stack, or extends into the first-tier alternating stack and is located above at least one layer within the first-tier alternating stack.

9. The three-dimensional memory device of claim 1, further comprising:

a semiconductor substrate underlying the semiconductor material layer;

semiconductor devices having sources, drains, and channel regions formed in the semiconductor substrate and gates formed on the semiconductor substrate;

lower-level dielectric material layers overlying the semiconductor devices and underlying the semiconductor material layer; and lower-level metal interconnect structures embedded in the lower-level dielectric material layers, wherein each of the at least one through-memory-level interconnection via structure contacts a respective one of the lower-level metal interconnect structures.

10. The three-dimensional memory device of claim 9, wherein:

the semiconductor material layer contains an opening in an area that underlies the first vertically alternating sequence of first insulating plates and first dielectric material plates; and the at least one through-memory-level interconnection via structure extends through the opening in the semiconductor material layer.

11. The three-dimensional memory device of claim 1, wherein:

the first-tier alternating stack and the second-tier alternating stack laterally extend along a first horizontal direction and have a uniform width along a second horizontal direction that is perpendicular to the first horizontal direction; and the three-dimensional memory device comprises a pair of backside trench fill structures laterally extending along the first horizontal direction, laterally spaced from each other along the second horizontal direction, and contacting respective sidewalls of the first-tier alternating stack and the second-tier alternating stack.

12. The three-dimensional memory device of claim 1, wherein:

each of the memory stack structures comprises a respective memory film and a respective vertical semiconductor channel; and each of the vertical semiconductor channels contacts the semiconductor material layer.

13. The three-dimensional memory device of claim 1, further comprising support pillar structures comprising a same dielectric material as the first dielectric moat structure and as the plurality of dielectric pillar structures, and vertically extending through the first-tier alternating stack and the second-tier alternating stack.

14. The three-dimensional memory device of claim 13, wherein:

a first subset of the memory stack structures is located in a first portion of a memory array region in which each layer of the first-tier alternating stack and each layer of the second-tier alternating stack are present;

a second subset of the memory stack structures is located in a second portion of the memory array region in which each layer of the first-tier alternating stack and each layer of the second-tier alternating stack is present;

the second portion of the memory array region is laterally spaced from the first portion of the memory array region along a first horizontal direction; and the first dielectric moat structure, the plurality of dielectric pillar structures, the at least one through-memory-level interconnection via structure, and the support pillar structures are located in an intermediate portion of the memory array region located between the first portion of the memory array region and the second portion of the memory array region.

* * * * *